US008101261B2

(12) United States Patent
Millward et al.

(10) Patent No.: US 8,101,261 B2
(45) Date of Patent: Jan. 24, 2012

(54) ONE-DIMENSIONAL ARRAYS OF BLOCK COPOLYMER CYLINDERS AND APPLICATIONS THEREOF

(75) Inventors: Dan B. Millward, Boise, ID (US); Karl Stuen, Madison, WI (US)

(73) Assignee: Micron Technology, Inc., Boise, ID (US)

( * ) Notice: Subject to any disclaimer, the term of this patent is extended or adjusted under 35 U.S.C. 154(b) by 470 days.

(21) Appl. No.: 12/030,562

(22) Filed: Feb. 13, 2008

(65) Prior Publication Data

US 2009/0200646 A1 Aug. 13, 2009

(51) Int. Cl.
*B32B 5/12* (2006.01)

(52) U.S. Cl. ........ 428/105; 428/113; 977/778; 977/784; 977/789; 977/790

(58) Field of Classification Search .................. 428/105, 428/113; 977/778, 784, 789, 790
See application file for complete search history.

(56) References Cited

U.S. PATENT DOCUMENTS

| | | | |
|---|---|---|---|
| 4,623,674 A | 11/1986 | Bailey, Jr. | |
| 4,877,647 A | 10/1989 | Klabunde | |
| 5,482,656 A | 1/1996 | Hiraoka et al. | |
| 5,538,655 A | 7/1996 | Fauteux et al. | |
| 5,622,668 A | 4/1997 | Thomas | |
| 5,904,824 A | 5/1999 | Oh | |
| 5,948,470 A | 9/1999 | Harrison et al. | |
| 6,111,323 A | 8/2000 | Carter et al. | |
| 6,143,647 A | 11/2000 | Pan et al. | |
| 6,368,871 B1 | 4/2002 | Christel et al. | |
| 6,403,382 B1 | 6/2002 | Zhu et al. | |
| 6,423,465 B1 | 7/2002 | Hawker et al. | |
| 6,503,841 B1 | 1/2003 | Criscuolo | |
| 6,506,660 B2 | 1/2003 | Holmes et al. | |
| 6,548,830 B1 | 4/2003 | Noguchi et al. | |
| 6,565,763 B1 | 5/2003 | Asakawa | |
| 6,566,248 B1 | 5/2003 | Wang et al. | |
| 6,569,528 B2 | 5/2003 | Nam et al. | |
| 6,689,473 B2 | 2/2004 | Guire et al. | |
| 6,699,797 B1 | 3/2004 | Morris et al. | |
| 6,713,238 B1 | 3/2004 | Chou et al. | |
| 6,746,825 B2 | 6/2004 | Nealey et al. | |
| 6,781,166 B2 | 8/2004 | Lieber et al. | |
| 6,890,624 B1 | 5/2005 | Kambe et al. | |
| 6,890,703 B2 | 5/2005 | Hawker et al. | |
| 6,913,697 B2 * | 7/2005 | Lopez et al. ............... 210/644 | |
| 6,924,341 B2 | 8/2005 | Mays | |
| 6,926,953 B2 | 8/2005 | Nealey et al. | |
| 6,949,456 B2 | 9/2005 | Kumar | |
| 6,962,823 B2 * | 11/2005 | Empedocles et al. ............ 438/3 | |
| 6,989,426 B2 | 1/2006 | Hu et al. | |
| 6,992,115 B2 | 1/2006 | Hawker et al. | |
| 7,030,495 B2 | 4/2006 | Colburn et al. | |
| 7,037,744 B2 | 5/2006 | Colburn et al. | |
| 7,045,851 B2 | 5/2006 | Black et al. | |
| 7,056,455 B2 | 6/2006 | Matyjaszewski et al. | |
| 7,056,849 B2 | 6/2006 | Wan et al. | |
| 7,115,995 B2 | 10/2006 | Wong | |
| 7,118,784 B1 | 10/2006 | Xie | |
| 7,132,370 B2 | 11/2006 | Paraschiv | |
| 7,135,144 B2 | 11/2006 | Christel et al. | |
| 7,135,388 B2 | 11/2006 | Ryu et al. | |
| 7,135,523 B2 | 11/2006 | Ho et al. | |
| 7,163,712 B2 | 1/2007 | Chilkoti et al. | |
| 7,172,953 B2 | 2/2007 | Lieber et al. | |
| 7,186,613 B2 | 3/2007 | Kirner | |
| 7,189,430 B2 | 3/2007 | Ajayan et al. | |
| 7,189,435 B2 | 3/2007 | Tuominen et al. | |
| 7,190,049 B2 | 3/2007 | Tuominen et al. | |
| 7,202,308 B2 | 4/2007 | Boussand et al. | |
| 7,291,284 B2 | 11/2007 | Mirkin et al. | |
| 7,347,953 B2 | 3/2008 | Black et al. | |
| 7,407,887 B2 * | 8/2008 | Guo ........................ 438/682 |
| 7,408,186 B2 * | 8/2008 | Merkulov et al. ............ 257/40 |
| 7,514,339 B2 | 4/2009 | Yang et al. | |
| 7,521,090 B1 | 4/2009 | Cheng et al. | |
| 7,553,760 B2 | 6/2009 | Yang et al. | |
| 7,592,247 B2 | 9/2009 | Yang et al. | |
| 7,605,081 B2 | 10/2009 | Yang et al. | |
| 7,767,099 B2 | 8/2010 | Li et al. | |
| 2003/0077452 A1 | 4/2003 | Guire et al. | |
| 2003/0091752 A1 | 5/2003 | Nealey et al. | |
| 2003/0100822 A1 | 5/2003 | Lew et al. | |
| 2003/0180966 A1 | 9/2003 | Abbott et al. | |
| 2003/0185741 A1 | 10/2003 | Matyjaszewski | |
| 2004/0084298 A1 | 5/2004 | Yao et al. | |
| 2004/0124092 A1 | 7/2004 | Black et al. | |
| 2004/0125266 A1 | 7/2004 | Miyauchi et al. | |
| 2004/0127001 A1 | 7/2004 | Colburn | |
| 2004/0142578 A1 | 7/2004 | Wiesner et al. | |
| 2004/0192013 A1 | 9/2004 | Ryu et al. | |

(Continued)

FOREIGN PATENT DOCUMENTS

CN 1562730 1/2005

(Continued)

OTHER PUBLICATIONS

Wang, C., et al., Electrochimica Acta 52 (2006), pp. 704-709.

(Continued)

*Primary Examiner* — Bernard Lipman
(74) *Attorney, Agent, or Firm* — Whyte Hirschboeck Dudek SC

(57) ABSTRACT

Methods for fabricating sublithographic, nanoscale microstructures in one-dimensional arrays utilizing self-assembling block copolymers, and films and devices formed from these methods are provided.

48 Claims, 31 Drawing Sheets

U.S. PATENT DOCUMENTS

| | | |
|---|---|---|
| 2004/0222415 A1 | 11/2004 | Chou |
| 2004/0254317 A1 | 12/2004 | Hu |
| 2004/0256615 A1 | 12/2004 | Sirringhaus et al. |
| 2004/0256662 A1 | 12/2004 | Black et al. |
| 2004/0265548 A1 | 12/2004 | Ho et al. |
| 2005/0062165 A1 | 3/2005 | Saenger et al. |
| 2005/0074706 A1 | 4/2005 | Bristol |
| 2005/0100830 A1 | 5/2005 | Xu et al. |
| 2005/0124135 A1 | 6/2005 | Ayazi et al. |
| 2005/0147841 A1* | 7/2005 | Tavkhelidze et al. ......... 428/687 |
| 2005/0167651 A1 | 8/2005 | Merkulov et al. |
| 2005/0208752 A1 | 9/2005 | Colburn et al. |
| 2005/0238889 A1 | 10/2005 | Iwamoto |
| 2005/0250053 A1 | 11/2005 | Marsh et al. |
| 2005/0271805 A1 | 12/2005 | Kambe et al. |
| 2005/0272341 A1 | 12/2005 | Colburn et al. |
| 2006/0013956 A1 | 1/2006 | Angelescu et al. |
| 2006/0014001 A1 | 1/2006 | Zhang et al. |
| 2006/0038182 A1 | 2/2006 | Rogers et al. |
| 2006/0046079 A1 | 3/2006 | Lee |
| 2006/0046480 A1* | 3/2006 | Guo .............................. 438/685 |
| 2006/0060863 A1* | 3/2006 | Lu et al. ........................... 257/77 |
| 2006/0062867 A1 | 3/2006 | Choi |
| 2006/0078681 A1 | 4/2006 | Hieda et al. |
| 2006/7030495 | 4/2006 | Colburn |
| 2006/0105562 A1 | 5/2006 | Yi |
| 2006/0124467 A1 | 6/2006 | Ho et al. |
| 2006/0134556 A1 | 6/2006 | Nealey et al. |
| 2006/0163646 A1 | 7/2006 | Black |
| 2006/0192283 A1 | 8/2006 | Benson |
| 2006/0205875 A1 | 9/2006 | Cha et al. |
| 2006/0217285 A1 | 9/2006 | Destarac |
| 2006/0231525 A1 | 10/2006 | Asakawa et al. |
| 2006/0249784 A1 | 11/2006 | Black et al. |
| 2006/0249796 A1* | 11/2006 | Tavkhelidze et al. ......... 257/371 |
| 2006/0258159 A1 | 11/2006 | Colburn et al. |
| 2006/0278158 A1 | 12/2006 | Tolbert et al. |
| 2006/0281266 A1 | 12/2006 | Wells |
| 2007/0020749 A1 | 1/2007 | Nealey et al. |
| 2007/0023805 A1 | 2/2007 | Wells |
| 2007/7172953 | 2/2007 | Lieber |
| 2007/0045562 A1 | 3/2007 | Parekh |
| 2007/0071881 A1 | 3/2007 | Chua et al. |
| 2007/0072403 A1 | 3/2007 | Sakata |
| 2007/0122932 A1 | 5/2007 | Kodas et al. |
| 2007/0161237 A1 | 7/2007 | Lieber et al. |
| 2007/0175859 A1 | 8/2007 | Black et al. |
| 2007/0181870 A1 | 8/2007 | Libertino et al. |
| 2007/0200477 A1 | 8/2007 | Tuominen et al. |
| 2007/0208159 A1 | 9/2007 | McCloskey et al. |
| 2007/0218202 A1 | 9/2007 | Ajayan et al. |
| 2007/0222995 A1 | 9/2007 | Lu |
| 2007/0224819 A1 | 9/2007 | Sandhu |
| 2007/0227383 A1 | 10/2007 | Decre et al. |
| 2007/0249117 A1 | 10/2007 | Kang et al. |
| 2007/0281220 A1 | 12/2007 | Sandhu et al. |
| 2007/0293041 A1 | 12/2007 | Yang et al. |
| 2008/0032238 A1 | 2/2008 | Lu et al. |
| 2008/0083991 A1 | 4/2008 | Yang et al. |
| 2008/0093743 A1 | 4/2008 | Yang et al. |
| 2008/0103256 A1 | 5/2008 | Kim et al. |
| 2008/0164558 A1 | 7/2008 | Yang et al. |
| 2008/0176767 A1 | 7/2008 | Millward |
| 2008/0193658 A1 | 8/2008 | Millward |
| 2008/0217292 A1 | 9/2008 | Millward et al. |
| 2008/0233323 A1 | 9/2008 | Cheng et al. |
| 2008/0257187 A1 | 10/2008 | Millward |
| 2008/0260941 A1 | 10/2008 | Jin |
| 2008/0274413 A1 | 11/2008 | Millward |
| 2008/0286659 A1 | 11/2008 | Millward |
| 2008/0311347 A1 | 12/2008 | Millward et al. |
| 2008/0315270 A1 | 12/2008 | Marsh et al. |
| 2008/0318005 A1 | 12/2008 | Millward |
| 2009/0062470 A1 | 3/2009 | Millward et al. |
| 2009/0200646 A1 | 8/2009 | Millward et al. |
| 2009/0206489 A1 | 8/2009 | Li et al. |
| 2009/0236309 A1 | 9/2009 | Millward et al. |
| 2009/0240001 A1 | 9/2009 | Regner |
| 2009/0263628 A1 | 10/2009 | Millward |
| 2009/0274887 A1 | 11/2009 | Millward et al. |
| 2010/0092873 A1 | 4/2010 | Sills et al. |
| 2010/0102415 A1 | 4/2010 | Millward |
| 2010/0124826 A1 | 5/2010 | Millward et al. |
| 2010/0137496 A1 | 6/2010 | Millward et al. |
| 2010/0163180 A1 | 7/2010 | Millward |
| 2010/0204402 A1 | 8/2010 | Millward et al. |
| 2010/0279062 A1 | 11/2010 | Millward |
| 2010/0316849 A1 | 12/2010 | Millward et al. |
| 2010/0323096 A1 | 12/2010 | Sills et al. |

FOREIGN PATENT DOCUMENTS

| | | |
|---|---|---|
| EP | 0784543 | 4/2000 |
| EP | 1416303 A2 | 5/2004 |
| EP | 1593164 B1 | 6/2010 |
| JP | 11080414 | 3/1999 |
| JP | 2005008882 | 1/2005 |
| JP | 2006036923 | 2/2005 |
| JP | 2006055982 | 3/2006 |
| TW | 200511364 | 3/2005 |
| TW | 256110 | 6/2006 |
| WO | 90/07575 | 7/1990 |
| WO | 97/06013 | 2/1997 |
| WO | 99/47570 | 9/1999 |
| WO | 02081372 | 10/2002 |
| WO | 2005/122285 A2 | 12/2005 |
| WO | 2006/076016 | 7/2006 |
| WO | 2006/078952 | 7/2006 |
| WO | 2007/019439 A3 | 2/2007 |
| WO | 2007013889 A2 | 2/2007 |
| WO | 2007/024241 | 3/2007 |
| WO | 2007/024323 A2 | 3/2007 |
| WO | 2007/055041 | 5/2007 |
| WO | 2008/091741 A2 | 7/2008 |
| WO | 2008/097736 A2 | 8/2008 |
| WO | 2008096335 A2 | 8/2008 |
| WO | 2008/124219 A2 | 10/2008 |
| WO | 2008118635 A2 | 10/2008 |
| WO | 2008130847 A1 | 10/2008 |
| WO | 2008145268 A1 | 12/2008 |
| WO | 2008156977 A2 | 12/2008 |
| WO | 2009099924 A2 | 8/2009 |
| WO | 2009117238 A2 | 9/2009 |
| WO | 2009117243 A1 | 9/2009 |
| WO | 2009134635 A2 | 11/2009 |

OTHER PUBLICATIONS

Arshady et al., Makromol. Chem., 1976, vol. 177, p. 2911-2918.

Bang, J. Abstract submitted for the Mar. '06 meeting of the American Physical Society, submitted Nov. 2005 [online], accessed via the Internet [retrieved on Apr. 5, 2010], URL: <http://absimage.aps.org/image/MWS_MAR06-2005-003641.pdf>.

Candau et al., Polymer, 1977, vol. 18, p. 1253-1257.

Hawker et al., Facile Synthesis of Block Copolymers for Nanolithographic Applications; Polymer Reprints, 2005.

Nishikubo, T., American Chemical Society Symposium Series, 1997, p. 214-230.

Berry, B.C., et al., "Effects of Zone Annealing on Thin Films of Block Copolymers", National Institute of Standard and Technology, Polymers Division, Gaithersburg, MD., 2007.

Black, C.T., Applied Physics Letters 87, 163116-1 to 1163116-3, 2005.

Black, Charles T., IEEE Transactions on Nanotechnology, vol. 3, No. 3, Sep. 2004, pp. 412-415.

Cavicchi, Kevin A., et al., Macromolecules 2007, vol. 40, 2007, pp. 1181-1186.

Gudipati, Chakravarthy S., et al., Journal of Polymer Science Part A: Polymer Chemistry, vol. 42, pp. 6193-6208.

Guo, Kai, et al., Abstract of "Synthesis and Characterization of Novel Biodegradable Unsaturated Poly(ester amide)/ Poly(ethylene glycol) Diacrylate Hydrogels", Journal of Polymer Science Part A: Polymer Chemistry, vol. 43, Issue 17, pp. 3932-3944, 2005 Wiley Periodicals, Inc.

Karim, Alamgir et al., "Control of Ordering Kinetics and Morphology Using Zone Annealing of Thin Block Copolymer Filmes", Abstract submitted for the Mar. 2007 Meeting of the American Physical Society, Nov. 20, 2006.
Kim, Seung Hyun, et al., Adv. Mater. 2004, 16, No. 3, Feb. 3, pp. 226-231.
Park, Dae-Ho, Nanotechnology 18, 2007, 355304, pp. 1-7.
Peng, Juan et al., Macromol. Rapid Commun. 2007, 28, 1422-1428.
Rogers, John A., ACS Nano, vol. 1, No. 3, pp. 151-153, 2007.
Rozkiewicz, Dorota I., et al., Angew. Chem. Int. Ed., 2006, 45, pp. 5292-5296.
Ruiz, Ricardo et al., Science, vol. 321, Aug. 15, 2008, pp. 936-939.
Segalman, Rachel A., Materials Science and Engineering R 48 (2005), pp. 191-226.
Srinvivasan, Charan, et al., ACS Nano, vol. 1, No. 3, pp. 191-201, 2007.
Xiao, Shuaigang et al., Nanotechnology 16 (2005) S324-S329.
Jun, et al., Langmuir, 2002, 18(9), pp. 3415-3417, Abstract only.
Balsara et al, CPIMA, IRG Technical Programs, Synthesis and application of Nanostructured Materials, Leland Stanford Junior Univ., 2006, http://www.stanford.edu/group/cpima/irg/irg_1.htm, printed Jul. 1, 2009.
Bulpitt, Paul et al, Journal of Biomedical Materials Research, vol. 47, Issue 2, pp. 152-169, Abstract only.
Elisseeff J., et al., Journal of Biomedical Materials Research, 51(2): 164-171, Aug. 2000, Abstract only.
Gelest Inc., Silane Coupling Agents: Connecting Across Boundaries, pp. 1-56, 2006.
Ji, Shengxiang, et al., Preparation of Neutral Wetting Brushes for Block Copolymer Films from Homopolymer Blends, submitted to Advanced Materials, 20(16): 3054-3060; published online Jul. 7, 2008.
Ji, Shengxiang, et al., Macromolecules, 2008, 41(23): 9098-9103.
Kim, SH, J Biomater Appl., Jul. 2000; 15(1): 23-46 Abstract only.
Kim, SH, J Biomater Res., Mar. 15, 2000; 49(4): 517-27 Abstract only.
Kim, IS, et al., Int J Pharm., Sep. 15, 2000; 205(1-2): 109-16, Abstract only.
Li, Wai-kin, et al, J. Vac. Sci. Technol. B 25(6), Nov./Dec. 2007, pp. 1982-1984.
Lutolf, M.P., et al, Nature Biotechnology, 23, 47-55 (2005), Abstract only.
Martens, P., et al., Polymer, vol. 41, Issue 21, Oct. 2000, pp. 7715-7722, Abstract only.
Matsuda, T., et al., ASAIO J, Jul.-Sep. 1992; 38(3): M154-7, Abstract only.
Sawhney, Amarpreet S., et al., Macromolecules 1993, 26, 581-587, Abstract only.
Wathier, Michel, et al., J. Am. Chem. Soc., 2004, 126 (40), pp. 12744-12745, Abstract only.
Bae, Joonwon, "Surface Modification Using Photo-Crosslinkable Random Copolymers", Abstract submitted for the Mar. 2006 meeting of the American Physical Society, submitted Nov. 30, 2005.
Bang, Joona, "The Effect of Humidity on the Ordering of Tri-block Copolymer Thin Films," Abstract submitted for the Mar. 2007 meeting of the American Physical Society, submitted Nov. 20, 2006.
Bass, Robert B., et al., "Microcontact Printing with Octadecanethiol", Applied Surface Science, 226(4), pp. 335-340, Apr. 2004, http://www.ece.virginia.edu/UVML/sis/Papers/rbbpapers/assoct.pdf.
Bearinger, J.P., et al., Nature Materials 2, 259-264, 2003.
Black, C.T., IEEE 2005 Custom Integrated Circuits Conference, pp. 87-91.
Black, C.T., et al., IBM J. Res. & Dev., vol. 51, No. 5, Sep. 2007, pp. 605-633.
Black, Charles T., ACSNano, vol. 1, No. 3, 2007, American Chemical Society, pp. 147-150.
Black, Charles T., et al., IEEE Electronon Device Letters, vol. 25, No. 9, Sep. 2004, pp. 622-624.
Botelho do Rego, A.M., et al., Surface Science, 482-485 (2001), pp. 1228-1234.
Brydson, Rik M., et al. (chapter authors), "Generic Methodologies for Nanotechnology: Classification and Fabrication", Nanoscale Science and Technology, edited by R.W. Kelsall, et al., 2005 John Wiley & Sons, Ltd., (published online: Dec. 20, 2005) (http://www3.interscience.wiley.com/cgi-bin/summary/112217550/SUMMARY).
Canaria, Christi A., et al., "Formation and Removal of Alkylthiolate Self-Assembled Monolayers on Gold in Aqueous Solutions", Lab Chip 6, 289-295 (2006), http://www.rsc.org/publishing/journals/LC/article.asp?doi=b51066c) (Abstract).
Chandekar, Amol, et al., "Template-Directed Adsorption of block Copolymers on Alkanethiol-Patterned Gold Surfaces," (circa 2006), http://www.nano.neu.edu/industry/industry_showcase/industry_day/documents/Chandekar.pdf) (Powerpoint template for scientific posters (Swarthmore College)).
Cheng, Joy T., et al., Nano Letters, vol. 0, No. 0, A-E, published on Web Aug. 16, 2006.
Daoulas Kostas Ch., et al., Physical Review Letters 96, week ending Jan. 27, 2006, pp. 036104-1-3.
Desai, Dr. Trejal A., et al., Business Briefing: Medical Device Manufacturing & Technology, 2002.
Edwards, Erik W., et al., Journal of Polymer Science: Part B Polymer Physics, vol. 43, 3444-3459, 2005.
Edwards, Erik W., et al., Advanced Mater, 16, No. 15, Aug. 4, 2004, pp. 1315-1319.
Fasolka, Michael J. et al., Macromolecules 2000, vol. 33, No. 15, pp. 5702-5712.
Gates, Byron D., et al., Annu. Rev. Mater. Res. 2004, 34:339-72.
Ge, Zhenbin, et al., PRL 96, 186101-1-186101-4, The American Physical Society, week ending May 12, 2006.
Genua, A., et al., Nanotechnology, 18 (2007), pp. 1-7.
Gillmor, S.D., et al., Langmuir 2000, vol. 16, No. 18, 2000, pp. 7223-7228.
Hamley, I. W., "Introduction to Block Copolymers", Developments in Block Copolymers Science and Technology, 2004, John Wiley & Sons, Ltd., pp. 1-29.
Hermans, Thomas M., et al., "Application of Solvent-Directed Assembly of Block Copolymers to the Synthesis of Nanostructured Materials with Low Dielectric Constants", Angewandte Chem. Int. Ed. 2006, 45, pp. 6648-6652.
Hutchison, J. Brian, et al., Chem. Mater., vol. 17, No. 19, 2005, pp. 4789-4797.
In, Insik, et al., Langmuir, vol. 22, No. 18, 2006, pp. 7855-7860.
Kim, Sang Ouk, et al., Nature, vol. 424, Jul. 24, 2003, pp. 411-414.
Kim, Sang Ouk, et al., Adv. Mater., 2007, 19, pp. 3271-3275.
Kim, Seung Hyun, et al., Macromolecules 2006, vol. 39, No. 24, 2006, pp. 8473-8479.
Kim, Seung Hyun, et al., Advanced Mater., vol. 16, No. 23-24, pp. 2119-2123, Dec. 17, 2004.
Krishnamoorthy, Sivashankar, et al., MaterialsToday, vol. 9, No. 9, Sep. 2006, pp. 40-47.
La, Young-Hye, et al., Chem. Mater, 2007, vol. 19, No. 18, pp. 4538-4544.
Laracuente, A.R., et al., Surface Science 545, 2003, pp. 70-84.
Lentz, David, et al., "Whole Wafer Imprint Patterning Using Step and Flash Imprint Lithography: A Manufacturing Solution for Sub 100 nm Patterning", SPIE Advanced Lithography Paper, http://molecularimprints.com/NewsEvents/tech_articles/new_articles/SPIE_07_MII_WW_Paper.pdf), Feb. 2007, pp. 1-10.
Li, Mingqi, et al., MaterialsToday, vol. 9, No. 9, Sep. 2006, pp. 30-39.
Li, Xue, et al., ScienceDirect, Polymer 48 (2007), pp. 2434-2443.
Lin, Zhiqun, et al., Adv. Mater. 2002, 14 No. 19, Oct. 2, pp. 1373-1376.
Lin-Gibson, Sheng, et al., Macromolecules 2005, 38, pp. 2897-2902.
Malkoch, Michael, et al., Chem. Commun., 2006, pp. 2774-2776.
Mansky, P., et al., Science, vol. 275, Mar. 7, 1997, pp. 1458-1460.
Maye, Mathew A., et al., Journal of Chemical Education, vol. 79, No. 2, Feb. 2002, pp. 207-210.
Metters, Andrew, et al., Biomacromolecules 2005, 6, pp. 290-301, 2005.
Meyer, Evelyn, et al., Macromollecular Mater. Eng., 276/277, 2000, pp. 44-50.
Mezzenga, Raffaele et al., Langmuir 2003, vol. 19, No. 20, 2003, pp. 8144-8147.
Mindel, Joseph., et.al., "A Study of Bredig Platinum Sols", The Chemical Laboratories of New York University, vol. 65 pp. 2112.

Naito, et al., IEEE Transactions on Magnetics, vol. 38, No. 5, Sep. 2002, pp. 1949-1951.
Nealey, Paul F., et al., "Self-Assembling Resists for Nanolithography", IEEE 2005.
Nguyen, Kytai, et al., Biomaterials 23, 2002, pp. 4307-4314.
Cheng, Joy Y., et al., Nano Letters, vol. 6, No. 9, 2006, pp. 2009-2103.
Cheng, Joy Y., et al., Adv. Mater. 2003, vol. 15, No. 19, pp. 1599-1602.
Cheng, Joy Y., et al., Applied Physics Letters, 91, 143106-143106-3 (2007).
Niu, Sanjun, et al., Macromolecules, 36(7), 2428-2440, 2003 (web release date: Mar. 13, 2003) http://digitalcommons.uni.edu/cgi/viewcontent.cgi?article+1005&contect=chemeng_nanotechnology).
Parejo, Pilar Garcia, et al., J. Mater. Chem., 2006, 16, pp. 2165-2169.
Park, Cheolmin, et al., Polymer 44, 2003, 6725-6760.
Park, Miri, et al., Science, v. 276, No. 5317, p. 1401-1404, May 30, 1997.
Park, Sang-Min, et al., Adv. Mater., 2007, 19, pp. 607-611.
Park, Sung Chan, et al., Macromolecules 2007, vol. 40, No. 22, pp. 8119-8124.
Peters, Richard D., et al., J. Vac. Sci. Technol. B, vol. 18, No. 6, Nov./Dec. 2000, pp. 3530-3532.
Peters, Richard D., et al., Macromolecules, vol. 35, No. 5, 2002, pp. 1822-1834.
Potemkin, Igor I., et al., Macromol. Rapid Commun., 2007, 28, pp. 579-584.
Resnick, Douglas, J., et al., J. Microlith., Microfab., Microsyst., vol. 3, No. 2, Apr. 2004, pp. 316-321.
Ruiz, Ricardo, et al., Adv. Mater, 2007, 19, pp. 587-591.
Ryu, Du Yeol, et al., Macromolecules, vol. 40, No. 12, 2007, pp. 4296-4300.
Saraf, Ravi R., et al., Applied Physics Letters, vol. 80, No. 23, Jun. 10, 2002, pp. 4425-4427.
Shahrjerdi, Davood, et al., IEEE Electron Device Letters, vol. 28, No. 9, Sep. 2007, pp. 793-796.
Sharma, Sadhana, et al., Applied Surface Science, 206 (2003), pp. 218-229.
Sivaniah, E., et al., Macromolecules 2003, 36, pp. 5894-5896.
Sivaniah, et al., Macromolecules 2005, 38, 1837-1849.
Solak, Harun H., Journal of Physics D: Applied Physics, 2006, pp. R171-188.
Stoykovich, Mark P., et al., Science, vol. 308, Jun. 3, 2005, pp. 1442-1446.
Stoykovich, Mark P., et al., ACS Nano, vol. 1, No. 3, 2007, pp. 168-175.
Sundrani, Deepak, et al., Nano Lett., vol. 4, No. 2, 2004, pp. 273-276.
Sundrani, Deepak, et al., Langmuir 2004, vol. 20, No. 12, 2004, pp. 5091-5099.
Sigma-Aldrich, Tutorial regarding Materials for Lithography/Nanopatterning, http://www.sigmaaldrich.com/Area_of_Interest/Chemistry/Materials_Science/Micro_and_Nanoelectronic website, retrieved Aug. 27, 2007.
Van Poll, Maaike L., et al., Angew. Chem. Int. Ed. 2007, 46, pp. 6634-6637.
Winesett, D.A., et al., Langmuir 2003, 19, pp. 8526-8535.
Xu, Ting et al., Polymer 42, (2001) 9091-9095.
Wu, C.Y., et al., IEEE, 2007, pp. 153-154.
Yamaguchi, Toru, et al., Journal of Photopolymer Science and Technology, vol. 19, No. 3, 2006, pp. 385-388.
Yan, Xiaohu, et al., J. Am. Chem. Soc., vol. 126, No. 32, 2004, pp. 10059-10066.
Yang, Xiao M., et al., Macromolecules 2000, vol. 33, No. 26, 2000, pp. 9575-9582.
Yurt, Serkan, et al., Macromolecules 2006, vol. 39, No. 5, 2006.
Zhang, Mingfu, et al., Adv. Mater. 2007, 19, pp. 1571-1576.
Black, C.T., Proc. of SPIE, vol. 6153, 615302 (2006).
Darling, S.B., Progress in Polymer Science, vol. 32, No. 10, Sep. 28, 2007, pp. 1152-1204.
Harrison, Christopher et al., Polymer, vol. 39, No. 13, pp. 2733-2744, 1998.
Kim, Su-Jin, et al., J. Vac. Sci. Technol. B26(1), Jan./Feb. 2008, 189-194.
La, Young-Hye, et al., J. Vac. Sci. Technol. B 25(6), Nov./Dec. 2007, pp. 2508-2513.
Olayo-Valles, Roberto et al., J. Mater. Chem, 2004, 14, 2729-2731.
Yang, XiaoMin, et al., J. Vac. Sci. Technol. B 22(6), Nov./Dec. 2004, 3331-3334.
He, Yiyong et al., J. Am. Chem. Soc. 2006, 128, pp. 2745-2750.
Ali, H.A., et al., Solid-State Electronics, 46 (2002) 1639-1642.
Berry et al., Orientational Order in Block Copolymer Films Zone Annealed below the Order-Disorder Transition Temperature, Nano Letters vol. 7, No. 9 Aug. 2007, p. 2789-2794.
Fukunaga et al., Self-Assembly of Block Copolymer Thin Films Having a Half-Domain-Spacing Thickness: Nonequilibrium Pathways to Achieve Equilibrium Brush Layers Parallel to Substrate, Macromolecules vol. 39, Aug. 2006, p. 6171-6179.
Hammond et al., Temperature Dependence of Order, Disorder, and Defects in Laterally Confined Diblock Copolymer Cylinder Monolayers, Macromoleculars vol. 38, Jul. 2005; p. 6575-6585.
Knoll et al., Phase Behavior in Thin Films of Cylinder-Forming Block Copolymers, Physical Review Letters vol. 89, No. 3 Jul. 2002.
Gudipati, Chakravarthy S., et al., Journal of Polymer Science Part A: Polymer Chemistry, vol. 42, pp. 6193-6208 2004.
Bulpitt, Paul et al, Journal of Biomedical Materials Research, vol. 47, Issue 2, pp. 152-169, Abstract only 1999.
Kim, SH, J Biomater Res., Mar 15, 2000; 49(4): 517-27 Abstract only.
Kim, IS, et al., Int J Pharm., Sep 15, 2000; 205(1-2): 109-16, Abstract only.
Matsuda, T., et al., ASAIO J, 1992 Jul-Sep; 38(3): M154-7, Abstract only.
Zehner, Robert W. et al., Langmuir, vol. 14, No. 2, pp. 241-244, Jan. 20, 1998.

* cited by examiner

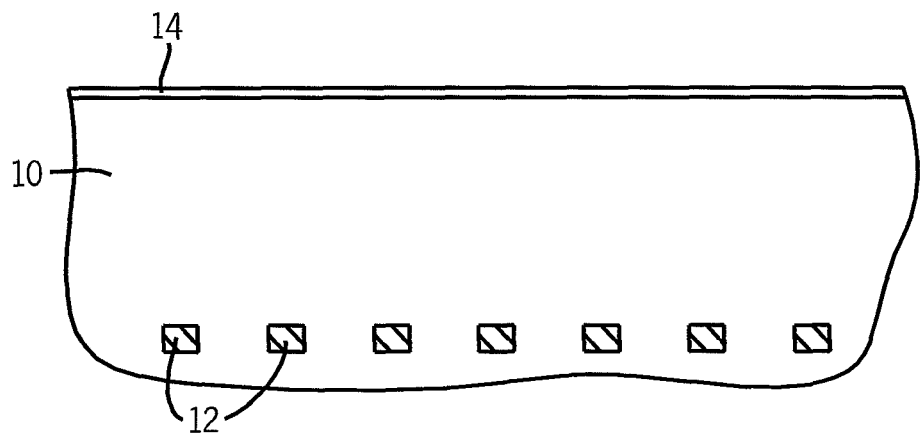
FIG. 1B
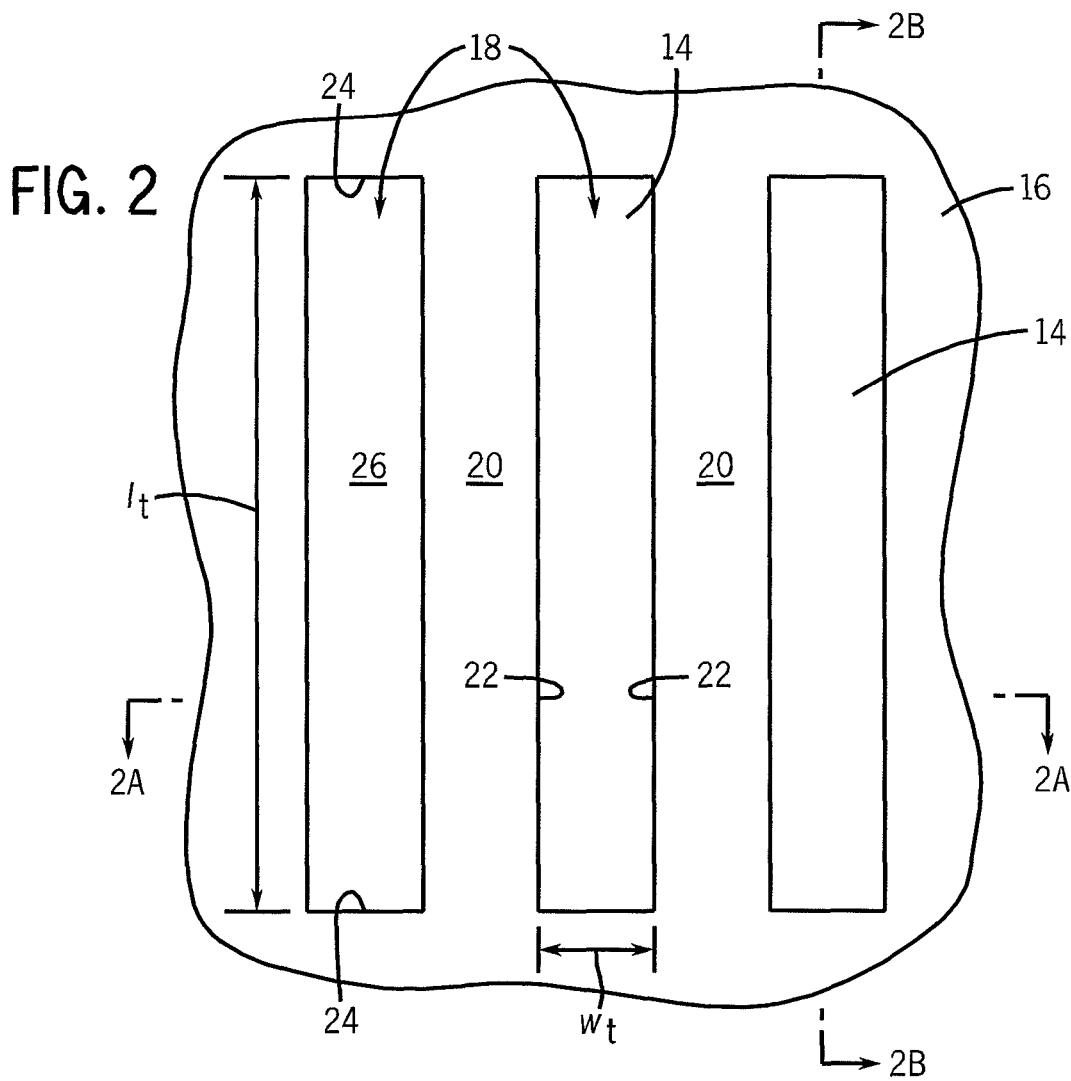

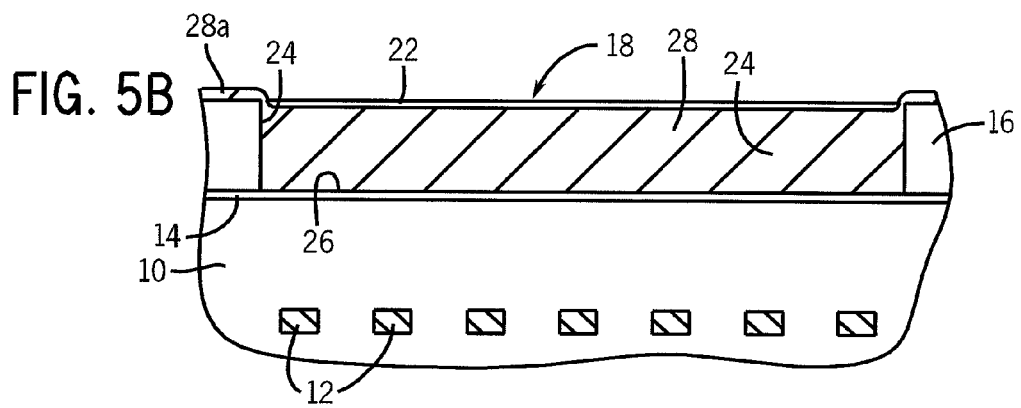
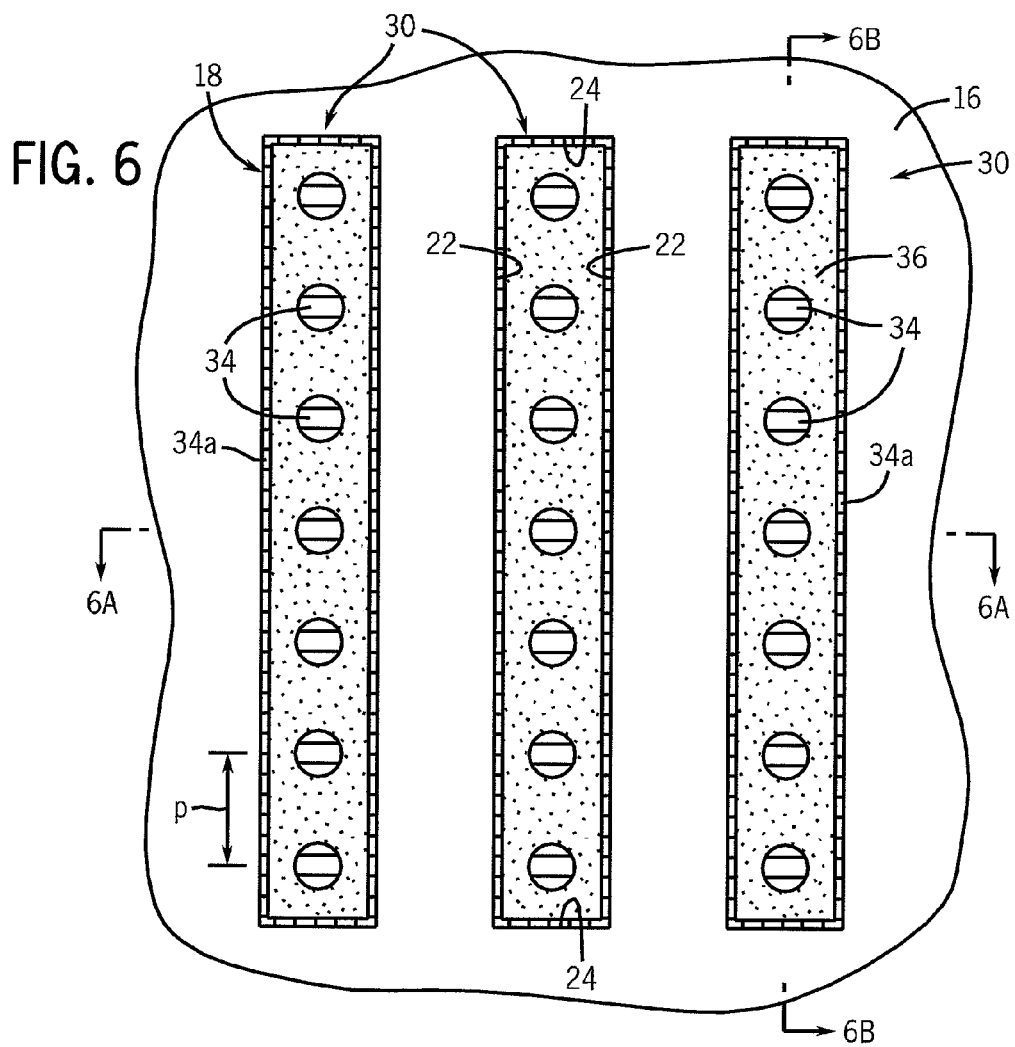

ONE-DIMENSIONAL ARRAYS OF BLOCK COPOLYMER CYLINDERS AND APPLICATIONS THEREOF

TECHNICAL FIELD

Embodiments of the invention relate to methods of fabricating thin films of self-assembling block copolymers, and devices resulting from those methods.

BACKGROUND OF THE INVENTION

As the development of nanoscale mechanical, electrical, chemical and biological devices and systems increases, new processes and materials are needed to fabricate nanoscale devices and components. Making electrical contacts to conductive lines has become a significant challenge as the dimensions of semiconductor features shrink to sizes that are not easily accessible by conventional lithography. Optical lithographic processing methods have difficulty fabricating structures and features at the sub-30 nanometer level. The use of self assembling diblock copolymers presents another route to patterning at nanoscale dimensions. Diblock copolymer films spontaneously assembly into periodic structures by microphase separation of the constituent polymer blocks after annealing, for example by thermal annealing above the glass transition temperature of the polymer or by solvent annealing, forming ordered domains at nanometer-scale dimensions.

The film morphology, including the size and shape of the microphase-separated domains, can be controlled by the molecular weight and volume fraction of the AB blocks of a diblock copolymer to produce lamellar, cylindrical, or spherical morphologies, among others. For example, for volume fractions at ratios greater than about 80:20 of the two blocks (AB) of a diblock polymer, a block copolymer film will microphase separate and self-assemble into a periodic spherical domains with spheres of polymer B surrounded by a matrix of polymer A. For ratios of the two blocks between about 60:40 and 80:20, the diblock copolymer assembles into a periodic hexagonal close-packed or honeycomb array of cylinders of polymer B within a matrix of polymer A. For ratios between about 50:50 and 60:40, lamellar domains or alternating stripes of the blocks are formed. Domain size typically ranges from 5-50 nm.

Researchers have reported producing a 1-D array of spheres of the minority block of a block copolymer in a matrix of the majority block by templating a spherical-morphology block copolymer within a narrow groove. However, a 1-D array of spheres provides a poor etch mask structure where, even if the sphere material can be removed, there is little aspect ratio to the remaining porous film. In addition, the spheres in adjacent grooves were offset along the y-axis and not aligned. Moreover, applications for forming structures in an underlying substrate for semiconductor systems require a complex layout of elements for forming contacts, conductive lines and/or other elements such as DRAM capacitors.

It would be useful to provide methods of fabricating films of one-dimensional arrays of ordered nanostructures that overcome these problems.

BRIEF DESCRIPTION OF THE DRAWINGS

Embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

FIGS. 1A-1B are elevational, cross-sectional views of the substrate depicted in FIG. 1 taken along lines 1A-1A and 1B-1B, respectively.

FIG. 2 illustrates a diagrammatic top plan view of the substrate of FIG. 1 at a subsequent stage showing the formation of trenches in a material layer formed on the neutral wetting material.

FIGS. 5-6 are diagrammatic top plan views of the substrate of FIG. 2 at subsequent stages in the fabrication of a self-assembled block copolymer film composed of a single row of perpendicular oriented cylinders in a polymer matrix within the trenches according to an embodiment of the disclosure. FIGS. 5A-6A illustrate elevational, cross-sectional views of a portion of the substrate depicted in FIGS. 5-6 taken along lines 5A-5A and 6A-6A, respectively. FIGS. 5B-6B are cross-sectional views of the substrate depicted in FIGS. 5-6 taken along lines 5B-5B and 6B-6B, respectively.

FIGS. 7A-9A illustrate elevational, cross-sectional views of a portion of the substrate depicted in FIGS. 7-9 taken along lines 7A-7A to 9A-9A, respectively. FIGS. 7B-9B are cross-sectional views of the substrate depicted in FIGS. 7-9 taken along lines 7B-7B to 9B-9B, respectively.

FIGS. 11A-12A illustrate elevational, cross-sectional views of a portion of the substrate depicted in FIGS. 11-12 taken along lines 11A-11A and 12A-12A, respectively. FIGS. 11B-12B are cross-sectional views of the substrate depicted in FIGS. 11-12 taken along lines 11B-11B and 12B-12B, respectively.

FIGS. 13A-15A illustrate elevational, cross-sectional views of a portion of the substrate depicted in FIGS. 13-15 taken along lines 13A-13A to 15A-15A, respectively.

Figure 13:
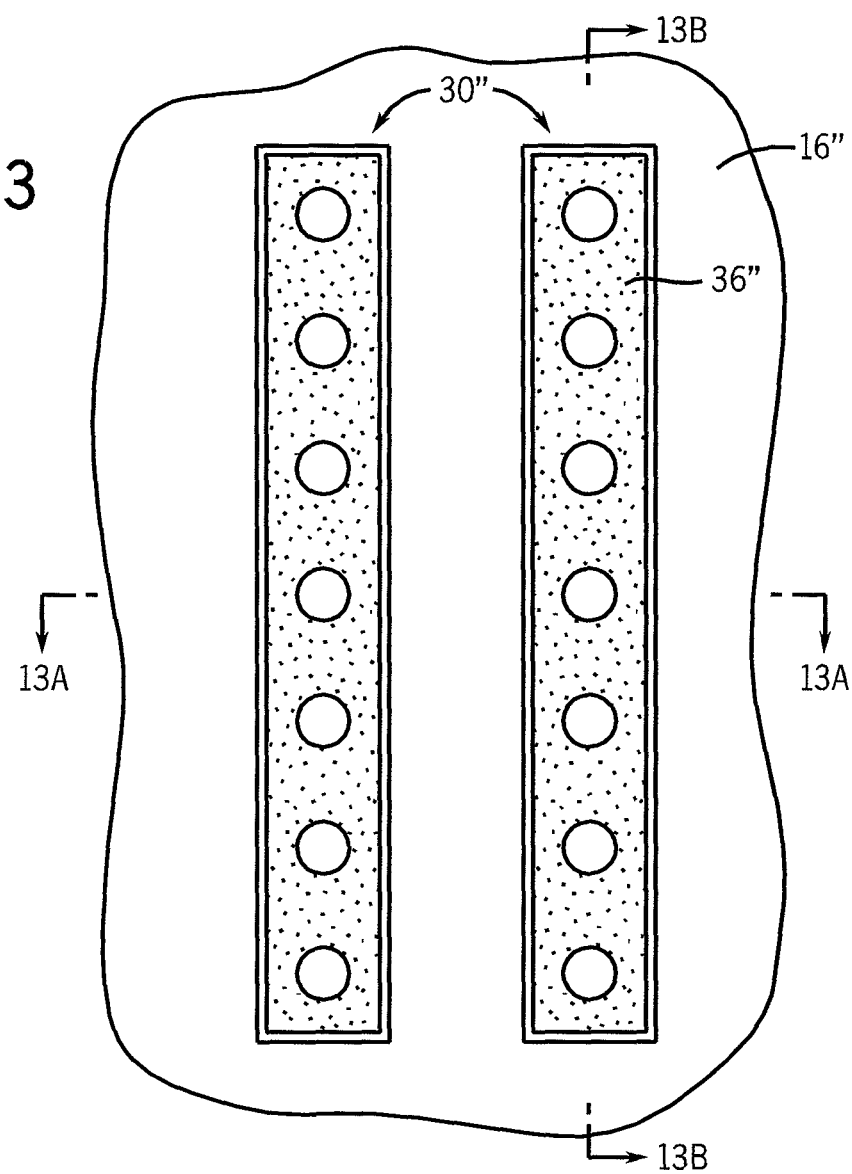
FIGS. 13-15 are top plan views of the substrate of FIG. 12 at subsequent stages, illustrating the use of the self-assembled block copolymer film after removal of one of the polymer blocks, as a mask to etch the substrate and filling of the etched openings according to an embodiment of the disclosure.
Figure 13A:
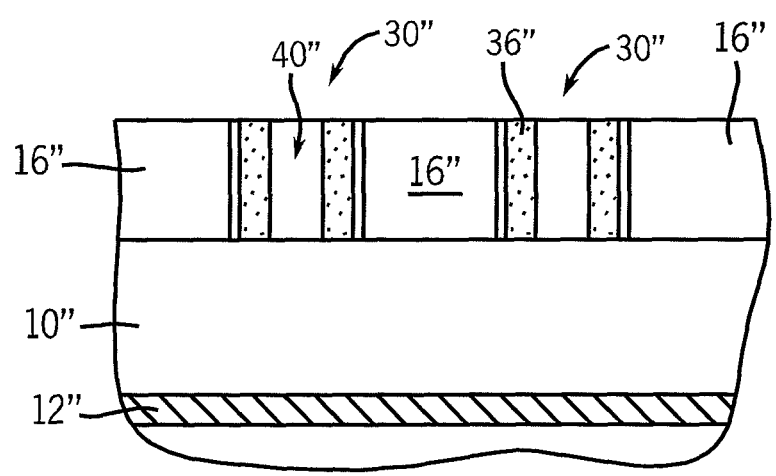
Figure 14:
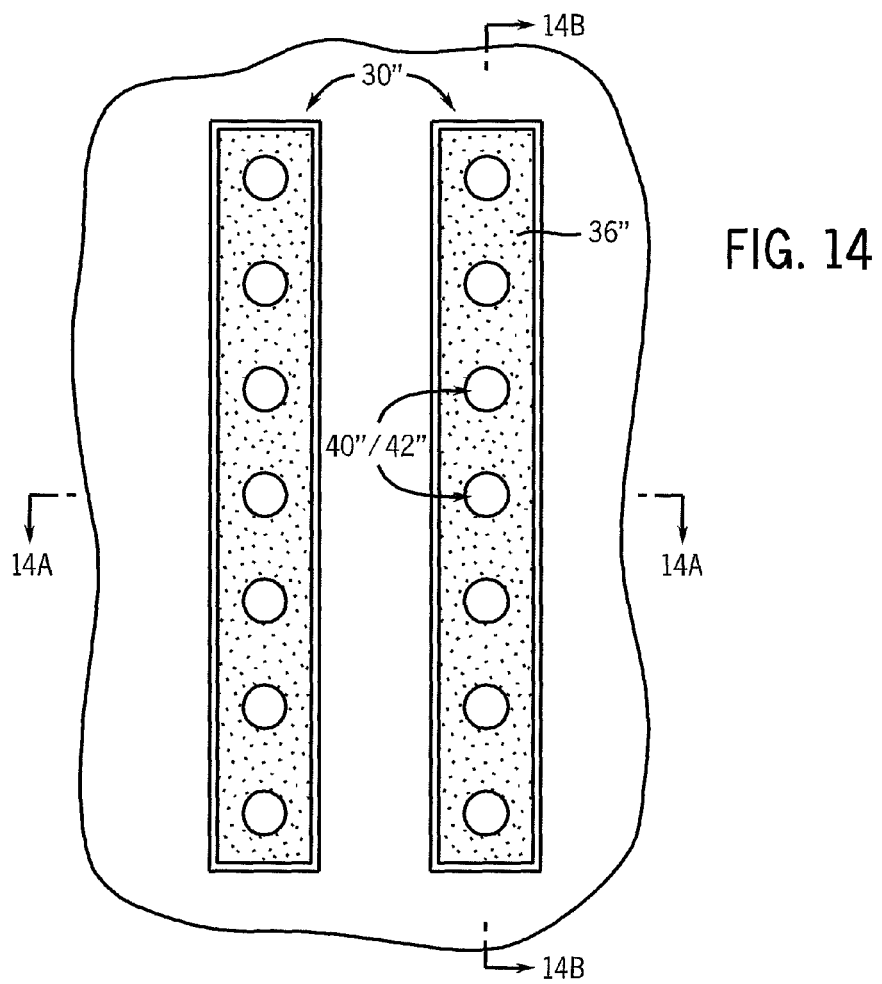
Figure 14A:
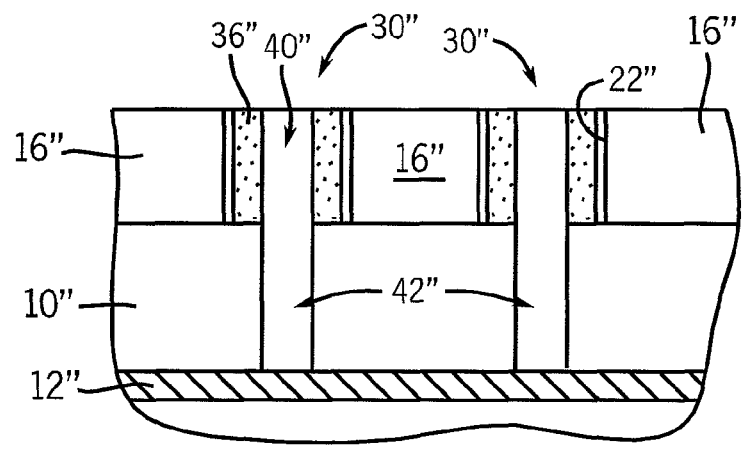
Figure 15:
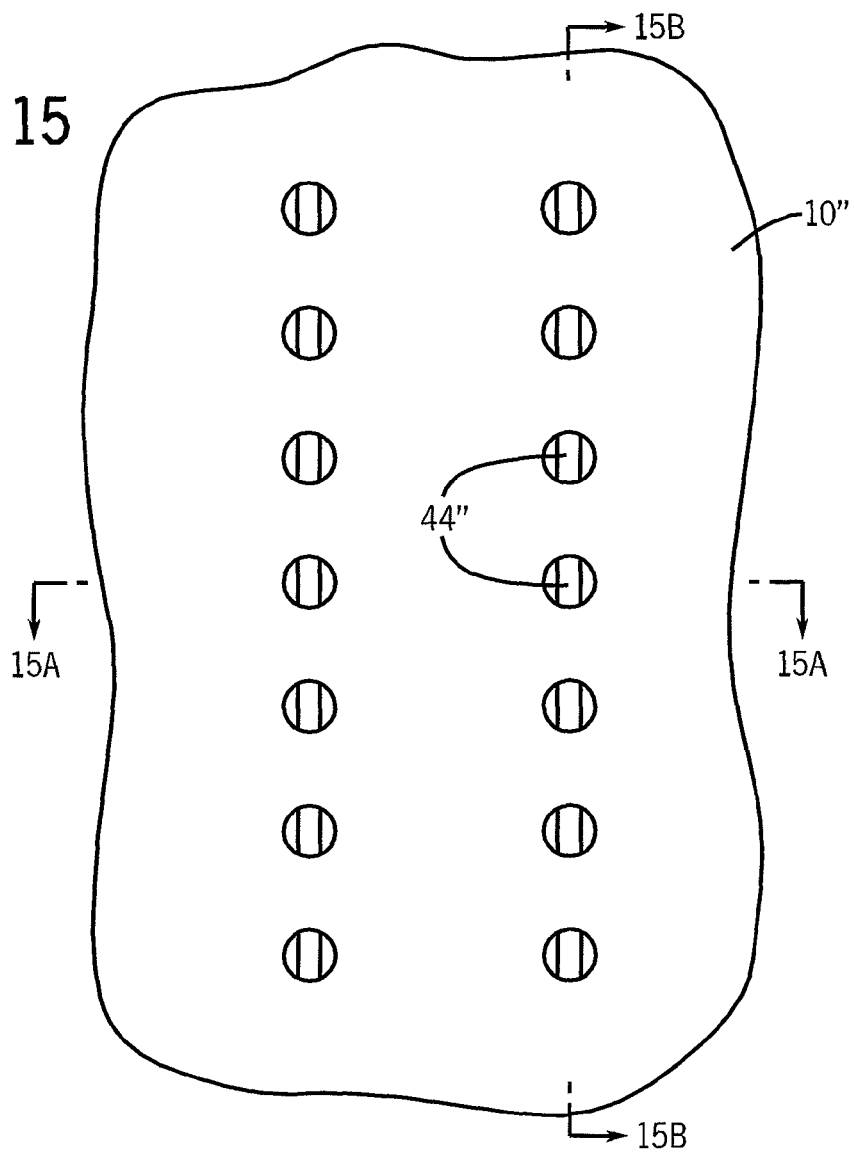
Figure 15A:
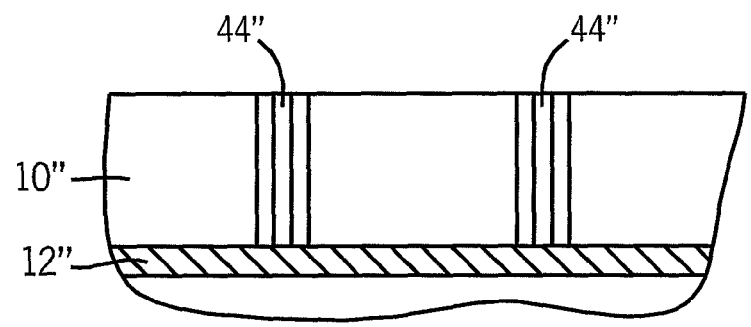

15B are cross-sectional views of the substrate depicted in FIGS. 13-15 taken along lines 13B-13B to 15B-15B, respectively.

Figure 12:
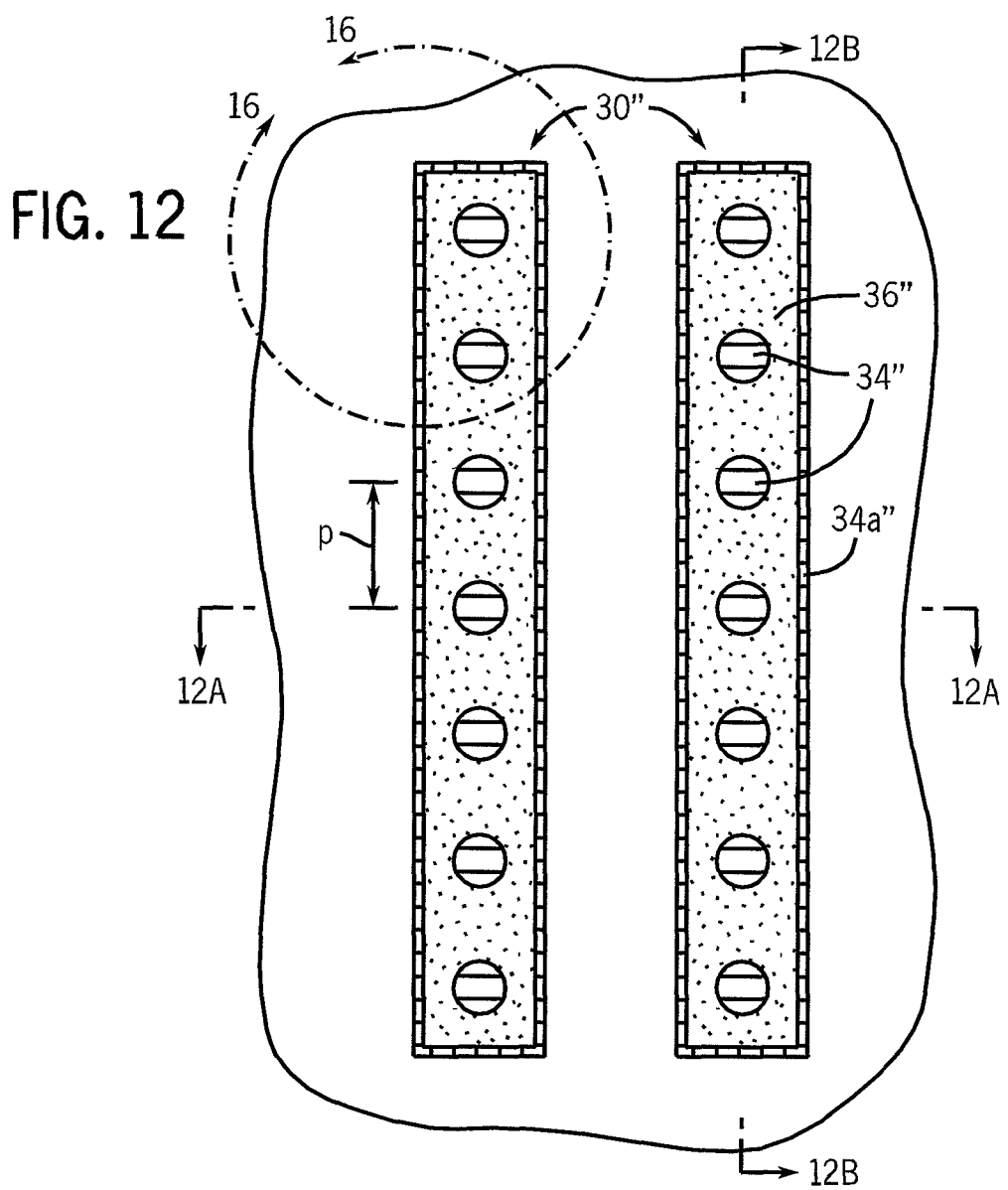
Figure 12A:
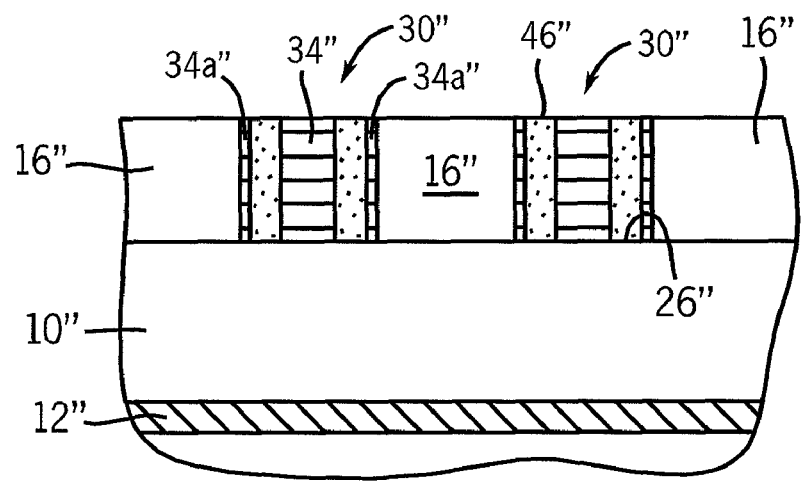
Figure 16:
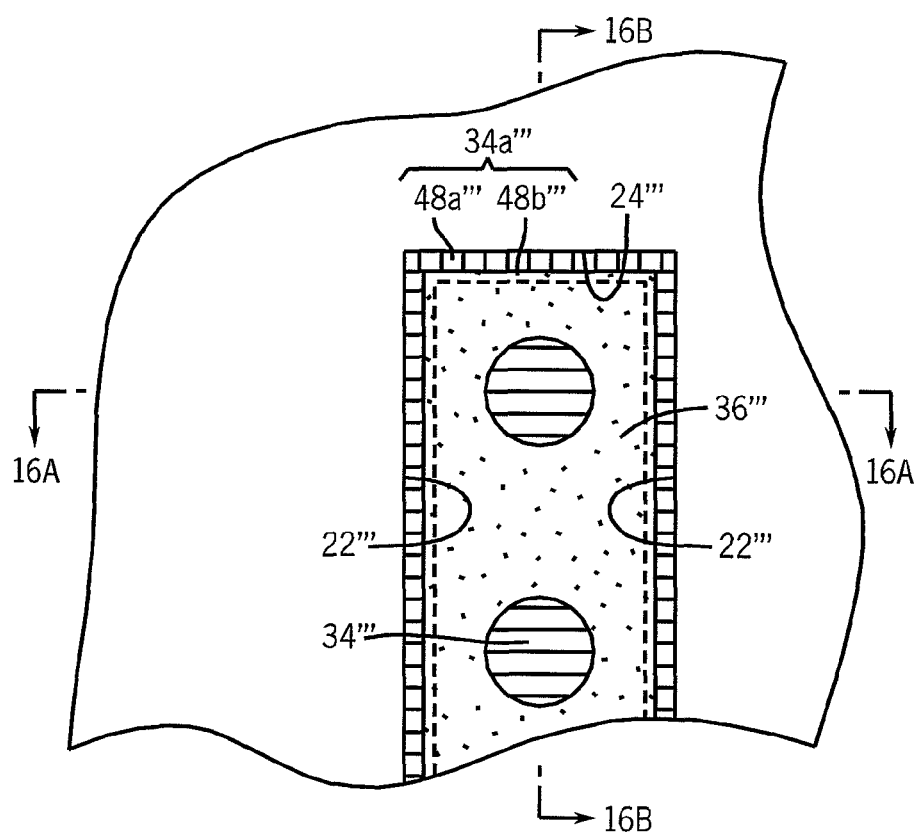
Figure 16A:
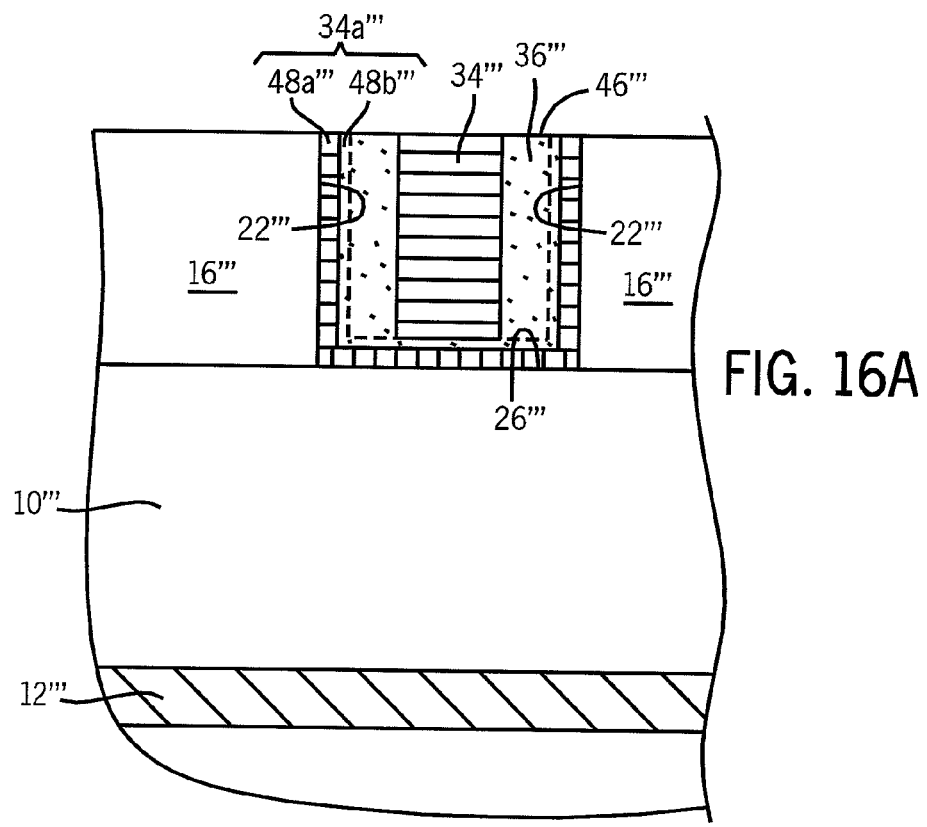
Figure 16B:
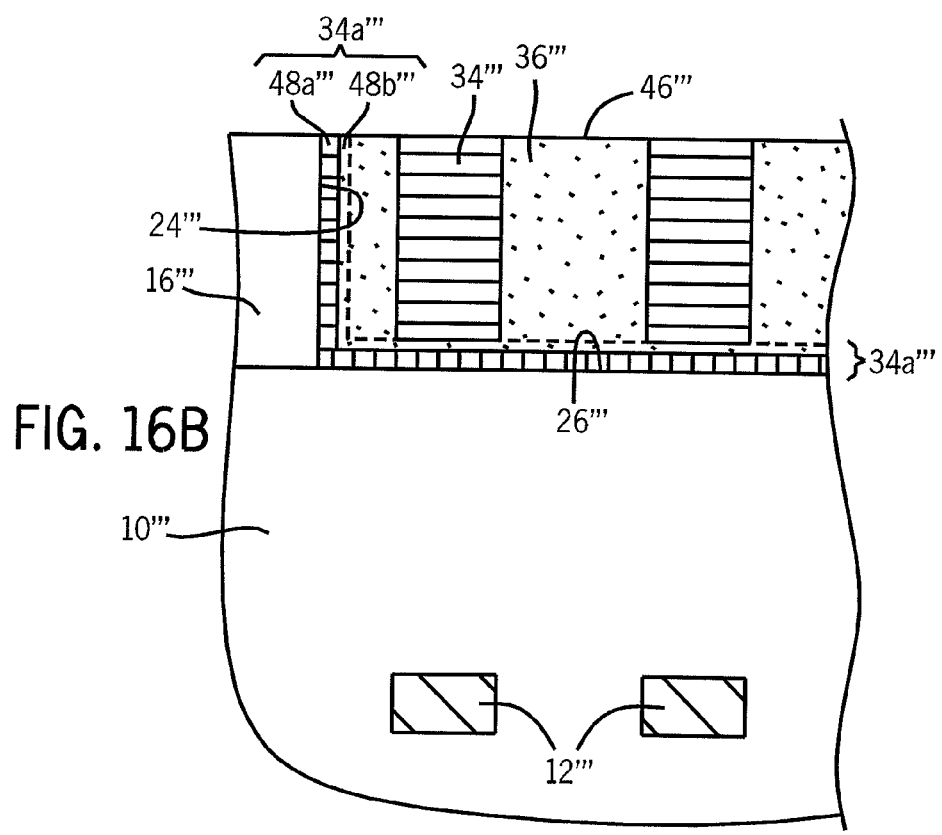

FIG. 16 is a top plan view of a portion of the substrate of FIG. 12 according to another embodiment of the invention, showing a bilayer wetting layer along the trench surfaces. FIGS. 16A-16B are elevational, cross-sectional views of the substrate depicted in FIG. 16 taken along lines 16A-16A and 16B-16B, respectively.

Figure 17:
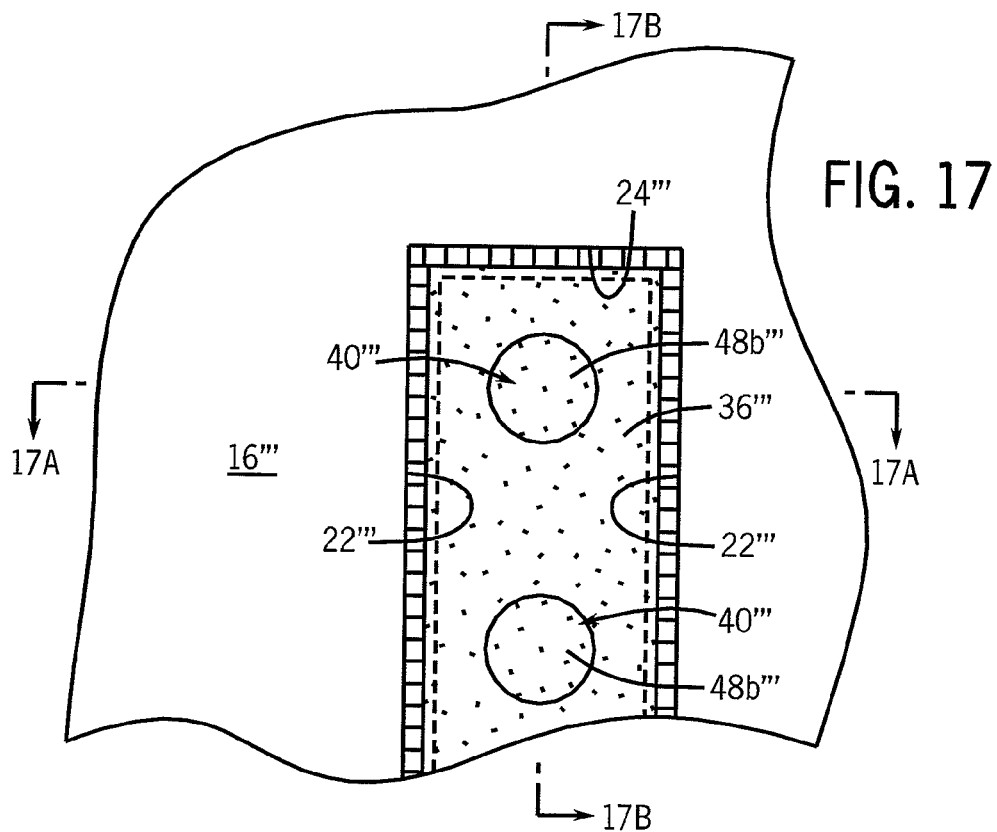
Figure 17A:
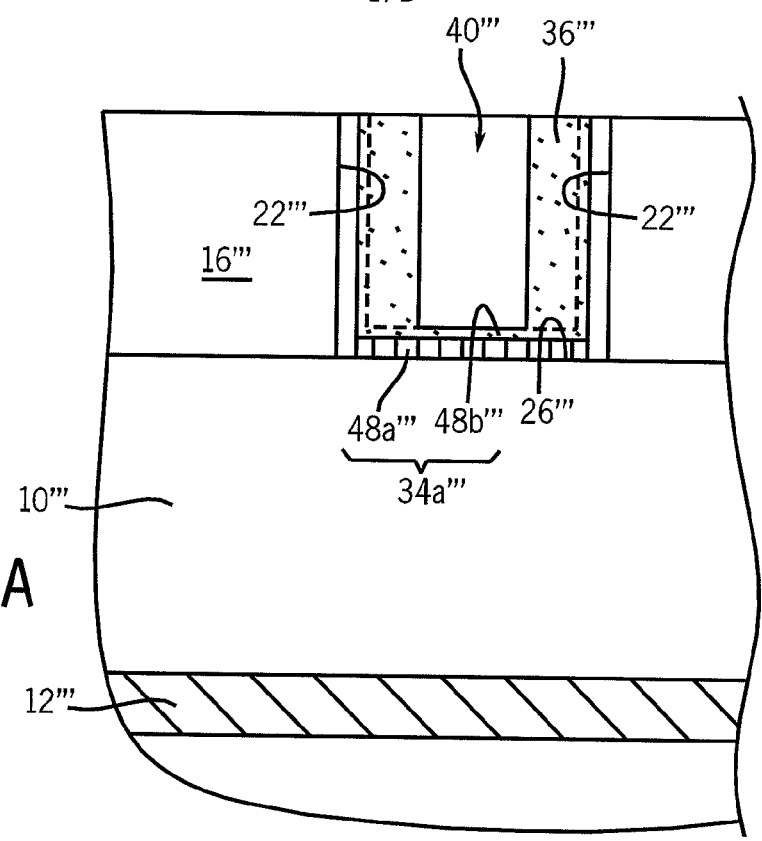
Figure 17B:
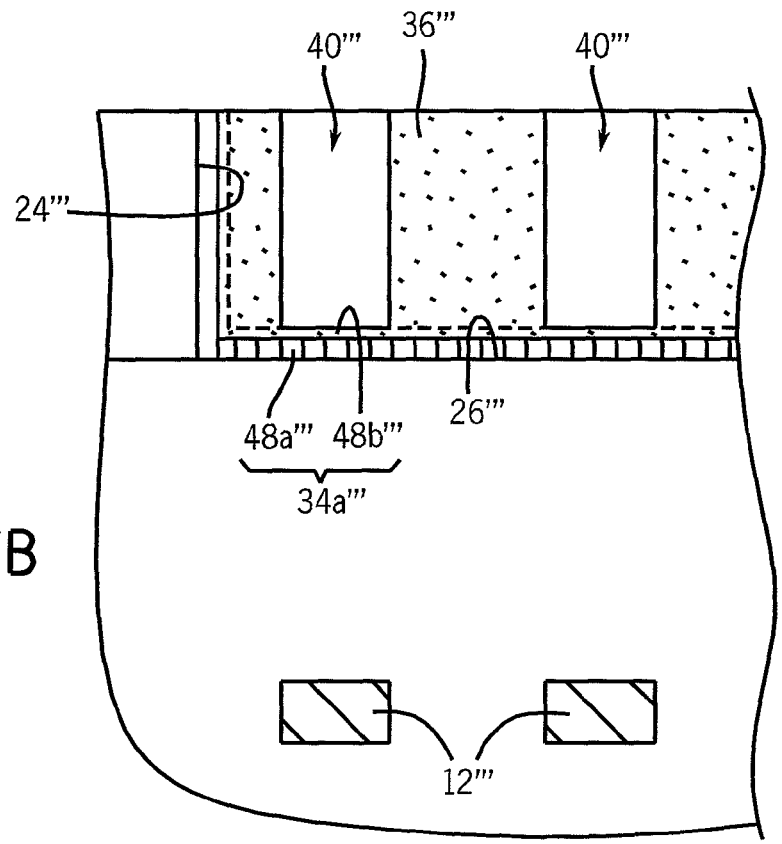
Figure 18:
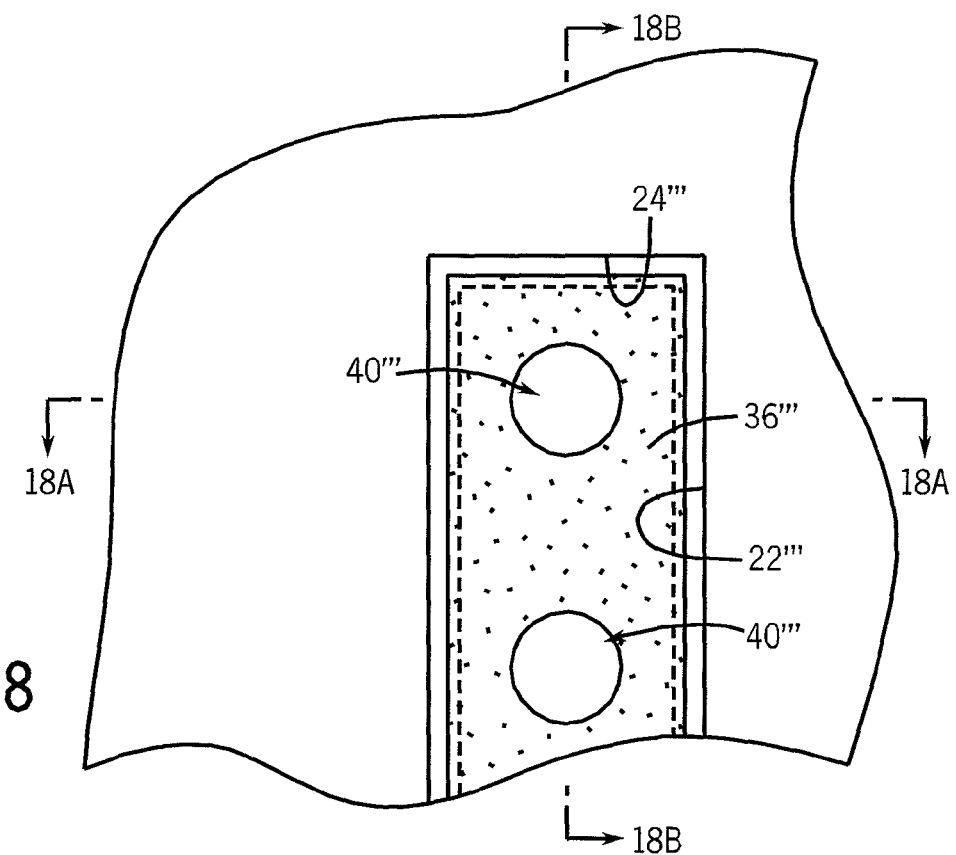
Figure 18A:
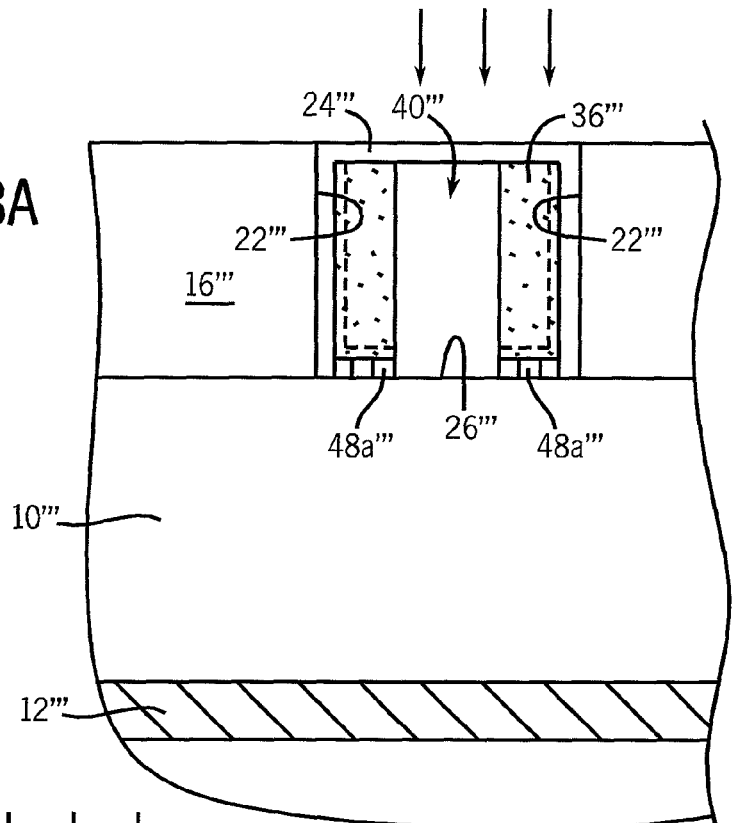

FIGS. 17-18 are top plan views of the substrate of FIG. 16 at subsequent stages, showing the removal of one of the polymer domains to form openings to the substrate according to another embodiment of the invention. FIGS. 17A-18A illustrate elevational, cross-sectional views of a portion of the substrate depicted in FIGS. 17-18 taken along lines 17A-17A to 18A-18A, respectively. FIGS. 17B-18B are cross-sectional views of the substrate depicted in FIGS. 17-18 taken along lines 17B-17B to 18B-18B, respectively.

FIGS. 19-22 illustrate another embodiment of the invention for forming two rows of cylinders in a single trench.

Figure 19:
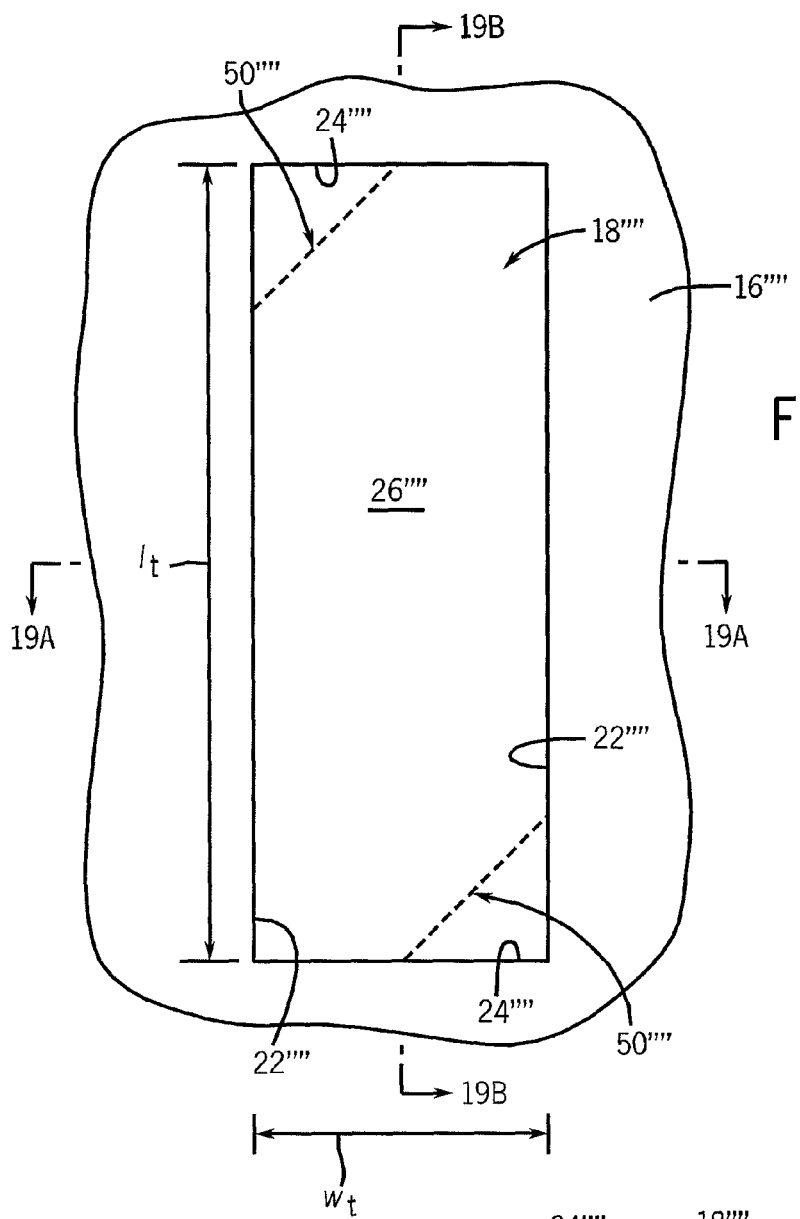
Figure 19A:
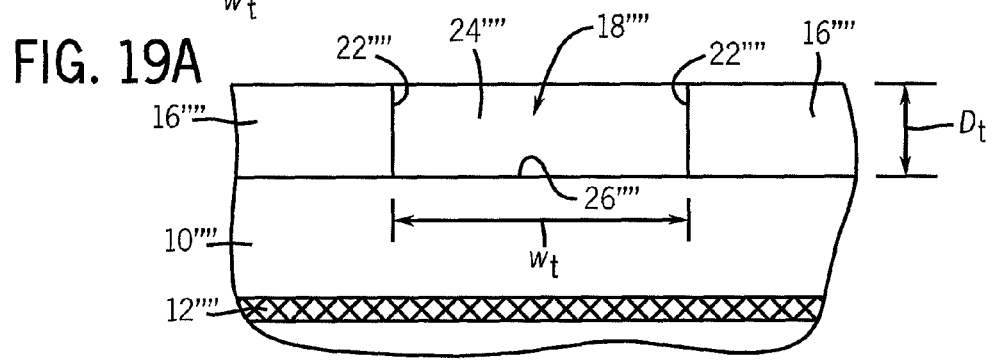
Figure 19B:
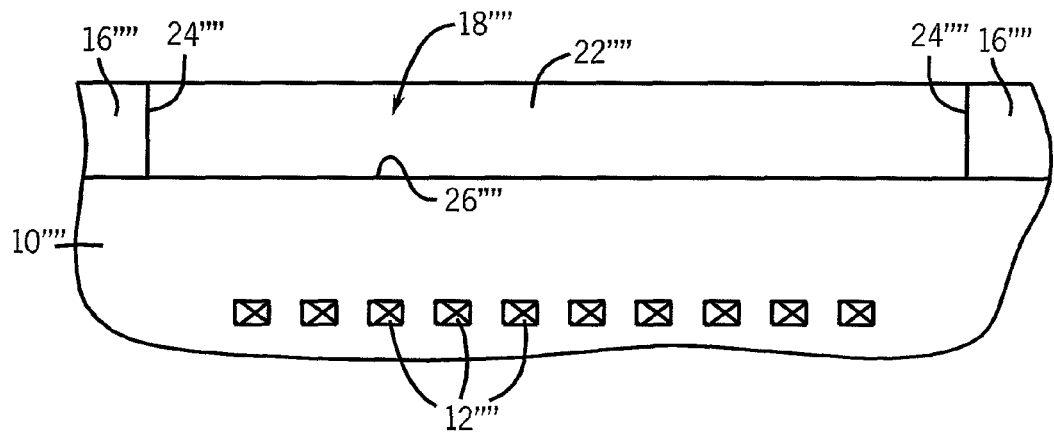

FIG. 19 illustrates a top plan view of a portion of a substrate at a preliminary processing stage showing a trench in a material layer. FIGS. 19A-19B are elevational, cross-sectional views of a portion of the substrate depicted in FIG. 19 taken, respectively, along lines 19A-19A and 19B-19B.

Figure 20:
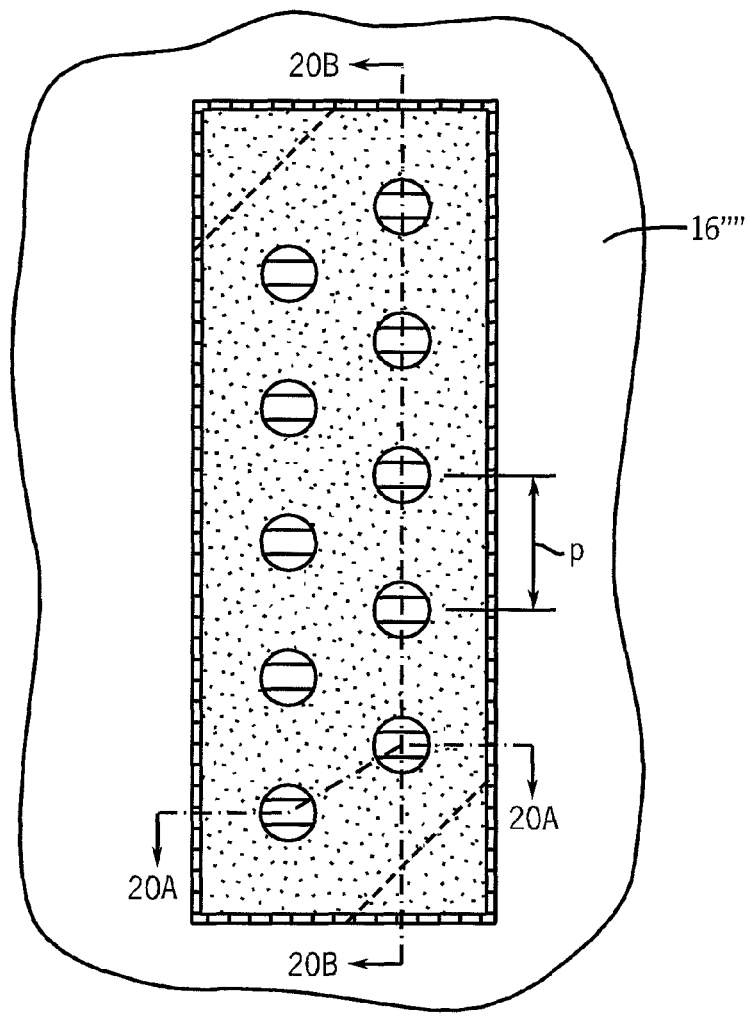
Figure 20A:
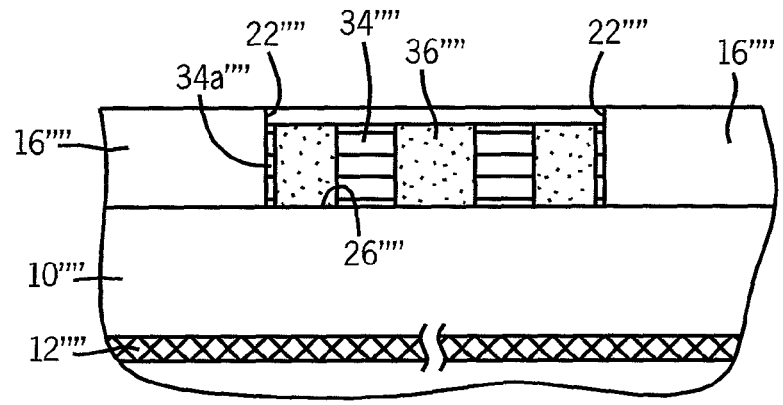

FIG. 20 is a top plan view of the substrate of FIG. 19 at a subsequent stage in the fabrication of a self-assembled cylindrical-phase block copolymer material within the trench according to an embodiment of the invention.

Figure 21:
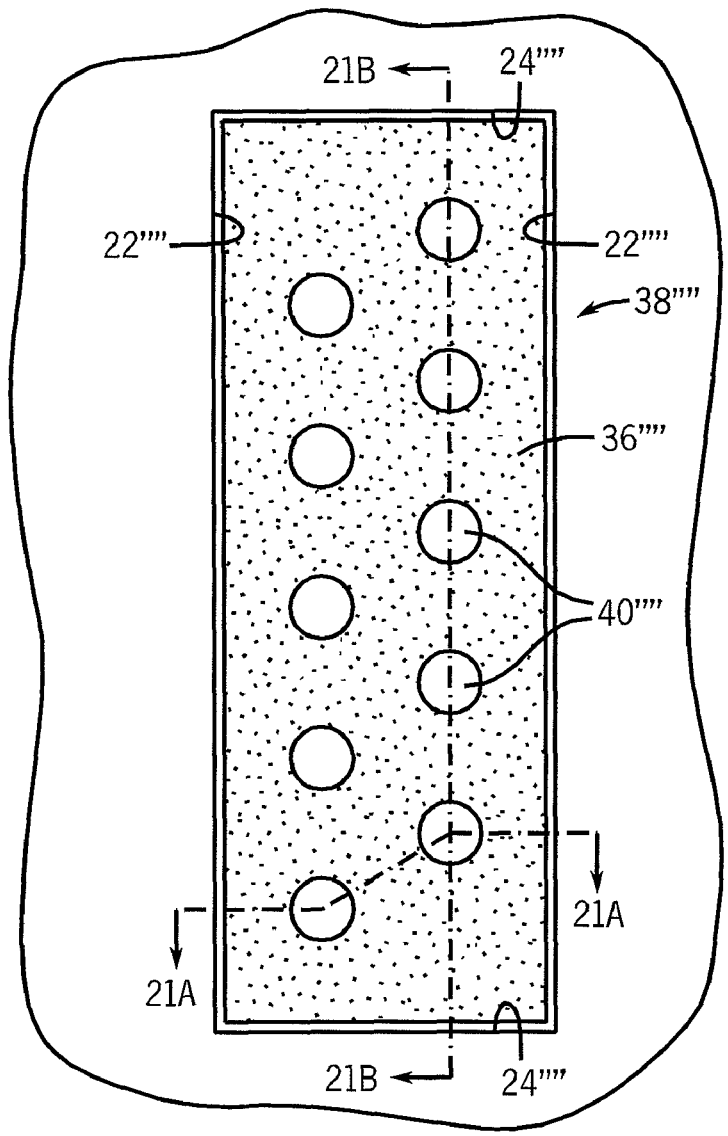
Figure 21A:
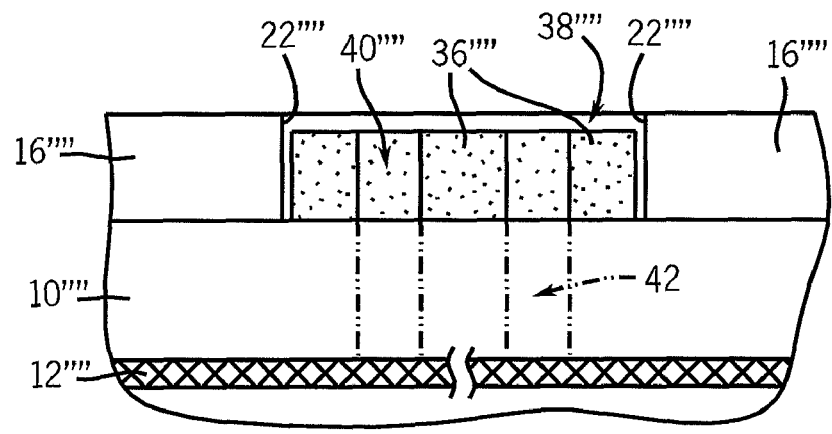

FIG. 21 is a top plan view of the substrate of FIG. 20 at a subsequent stage after removal of the cydrical domains of the block copolymer material.

Figure 22:
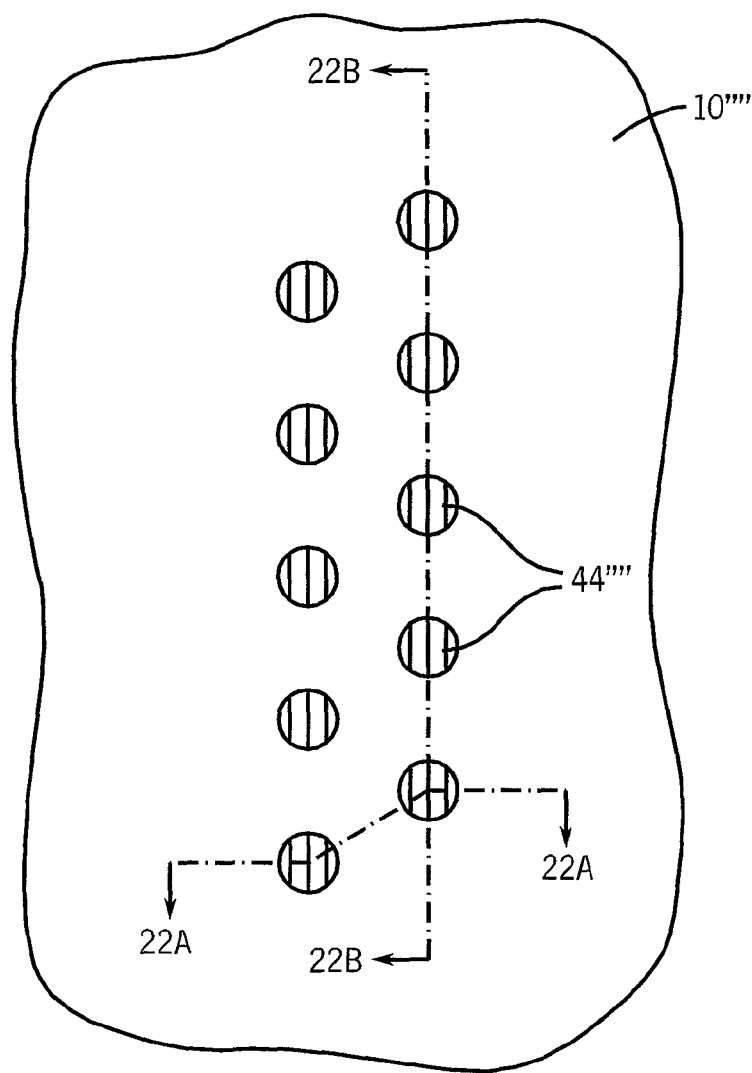
Figure 22A:
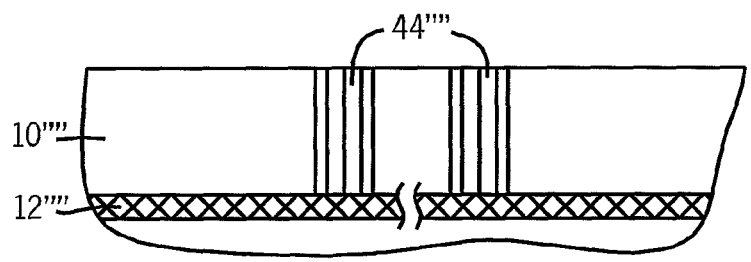
Figure 22B:
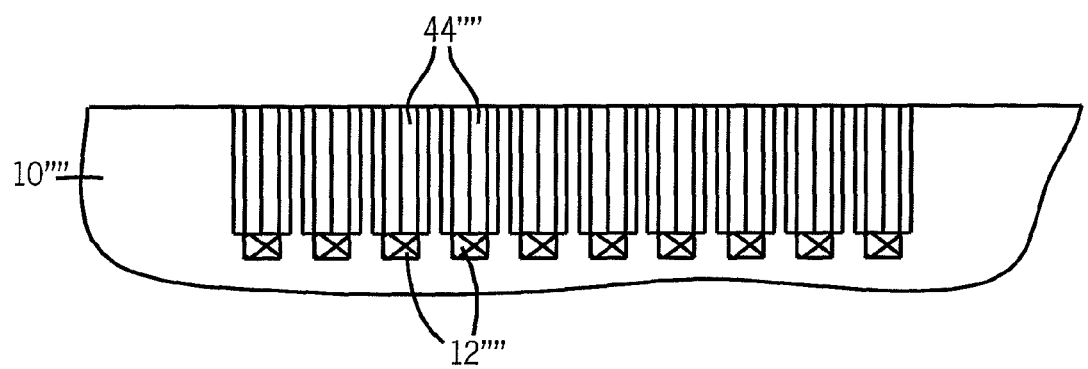

FIG. 22 is a top plan view of FIG. 21 after etching of the substrate and filling of the etched openings. FIGS. 20A-22A are elevational, cross-sectional views of the substrates of FIGS. 20-22 taken, respectively, along lines 20A-20A, 21A-21A and 22A-22A. FIGS. 20B-22B are elevational, cross-sectional views of the substrates of FIGS. 20-22, taken along lines 20B-20B, 21B-21B and 22B-22B, respectively, showing both lines of cylinders.

DETAILED DESCRIPTION OF THE INVENTION

The following description with reference to the drawings provides illustrative examples of devices and methods according to embodiments of the invention. Such description is for illustrative purposes only and not for purposes of limiting the same.

In the context of the current application, the term "semiconductor substrate" or "semiconductive substrate" or "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive substrates, wafer fragments or wafers described above.

"$L_o$" as used herein is the inherent periodicity or pitch value (bulk period or repeat unit) of structures that self assemble upon annealing from a self-assembling (SA) block copolymer. "$L_B$" as used herein is the periodicity or pitch value of a block copolymer with one or more of its constituent homopolymers. "L" is used herein to indicate the center-to-center cylinder pitch or spacing of cylinders of the block copolymer or blend, and is equivalent to "$L_o$" for a pure block copolymer and "$L_B$" for a copolymer blend.

In embodiments of the invention, a polymer material (e.g., film, layer) is prepared by guided self-assembly of block copolymers, with both polymer domains at the air interface. Block copolymer materials spontaneously assemble into periodic structures by microphase separation of the constituent polymer blocks after annealing, forming ordered domains at nanometer-scale dimensions. In embodiments of the invention, a one-dimensional (1-D) array of perpendicular-oriented cylinders is formed within a trench. In other embodiments, two rows of cylinders can be formed in each trench. Following self assembly, the pattern of perpendicular-oriented cylinders that is formed on the substrate can then be used, for example, as an etch mask for patterning nanosized features into the underlying substrate through selective removal of one block of the self-assembled block copolymer. Since the domain sizes and periods (L) involved in this method are determined by the chain length of a block copolymer (MW), resolution can exceed other techniques such as conventional photolithography. Processing costs using the technique is significantly less than extreme ultraviolet (EUV) photolithography, which has comparable resolution.

A method for fabricating a self-assembled block copolymer material that defines a one-dimensional (1-D) array of nanometer-scale, perpendicular-oriented cylinders according to an embodiment of the invention is illustrated in FIGS. 1-6.

The described embodiment involves a thermal anneal of a cylindrical-phase block copolymer in combination with a graphoepitaxy technique that utilizes a lithographically defined trench as a guide with a floor composed of a material that is neutral wetting to both polymer blocks, and sidewalls and ends that are preferential wetting to one polymer block and function as constraints to induce the block copolymer to self-assemble into an ordered 1-D array of a single row of cylinders in a polymer matrix oriented perpendicular to the trench floor and registered to the trench sidewalls. In some embodiments, two rows of cylinders can be formed in each trench.

The block copolymer or blend is constructed such that all of the polymer blocks will have equal preference for the air interface during the anneal. For a thermal anneal, such diblock copolymers include, for example, poly(styrene)-b-poly(methylmethacrylate) (PS-b-PMMA) or other PS-b-poly (acrylate) or PS-b-poly(methacrylate), poly(styrene)-b-poly (lactide) (PS-b-PLA), and poly(styrene)-b-poly(tert-butyl acrylate) (PS-b-PtBA), among others. Although PS-b-PMMA diblock copolymers are used in the illustrated embodiment, other types of block copolymers (i.e., triblock or multiblock copolymers) can be used. Examples of triblock copolymers include ABC copolymers, and ABA copolymers (e.g., PS-PMMA-PS and PMMA-PS-PMMA).

The L value of the block copolymer can be modified, for example, by adjusting the molecular weight of the block copolymer. The block copolymer material can also be formulated as a binary or ternary blend comprising a block copolymer and one or more homopolymers (HPs) of the same type of polymers as the polymer blocks in the block copolymer, to produce a blend that will swell the size of the polymer domains and increase the L value. The volume fraction of the homopolymers can range from 0 to about 60%. An example of a ternary diblock copolymer blend is a PS-b-PMMA/PS/PMMA blend, for example, 60% of 46K/21K PS-b-PMMA, 20% of 20K polystyrene and 20% of 20K poly(methyl methacrylate). A blend of PS-PEO and about 0-40% PEO homopolymer (HP) can also be used to produce perpendicular cylinders during a thermal anneal; it is believed that the added PEO homopolymer may function, at least in part, to lower the surface energy of the PEO domains to that of PS.

The film morphology, including the domain sizes and periods ($L_o$) of the microphase-separated domains, can be controlled by chain length of a block copolymer (molecular weight, MW) and volume fraction of the AB blocks of a diblock copolymer to produce cylindrical morphologies (among others). For example, for volume fractions at ratios of the two blocks generally between about 60:40 and 80:20, the diblock copolymer will microphase separate and self-assemble into periodic cylindrical domains of polymer B within a matrix of polymer A. An example of a cylinder-forming PS-b-PMMA copolymer material ($L_o$~35 nm) to form about 20 nm diameter cylindrical PMMA domains in a matrix of PS is composed of about 70% PS and 30% PMMA with a total molecular weight ($M_n$) of 67 kg/mol.

Figure 1:
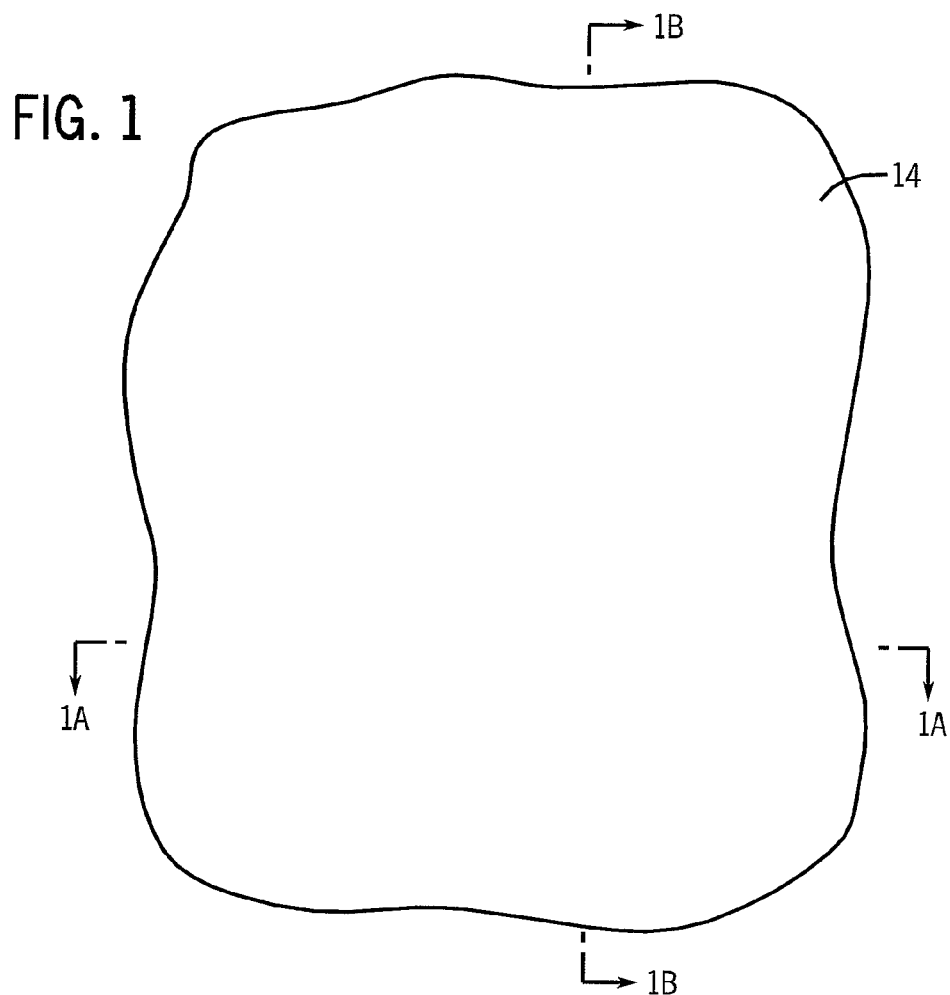
FIG. 1 illustrates a diagrammatic top plan view of a portion of a substrate at a preliminary processing stage according to an embodiment of the present disclosure, showing the substrate with a neutral wetting material thereon.
Figure 1A:
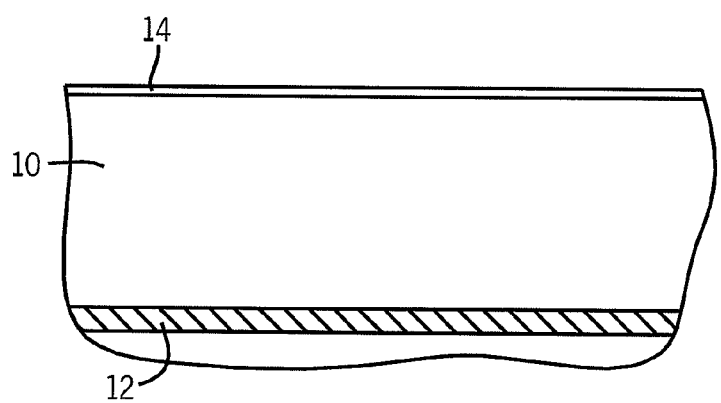

As depicted in FIGS. 1-1B, a substrate 10 is provided, which can be silicon, silicon oxide, silicon nitride, silicon oxynitride, silicon oxycarbide, among other materials. As further depicted, conductive lines 12 (or other active area, e.g., semiconducting regions) are situated within the substrate 10.

In any of the described embodiments, a single trench or multiple trenches can be formed in the substrate, and can span the entire width of an array of lines (or other active area). In embodiments of the invention, the substrate 10 is provided with an array of conductive lines 12 (or other active areas) at a pitch of L. The trench or trenches are formed over the active areas 12 (e.g., lines) such that when the block copolymer material is annealed, each cylinder will be situated above a single active area 12 (e.g., conductive line). In some embodiments, multiple trenches are formed with the ends 24 of each adjacent trench 18 aligned or slightly offset from each other at less than 5% of L such that cylinders in adjacent trenches are aligned and situated above the same line 12.

Figure 2A:
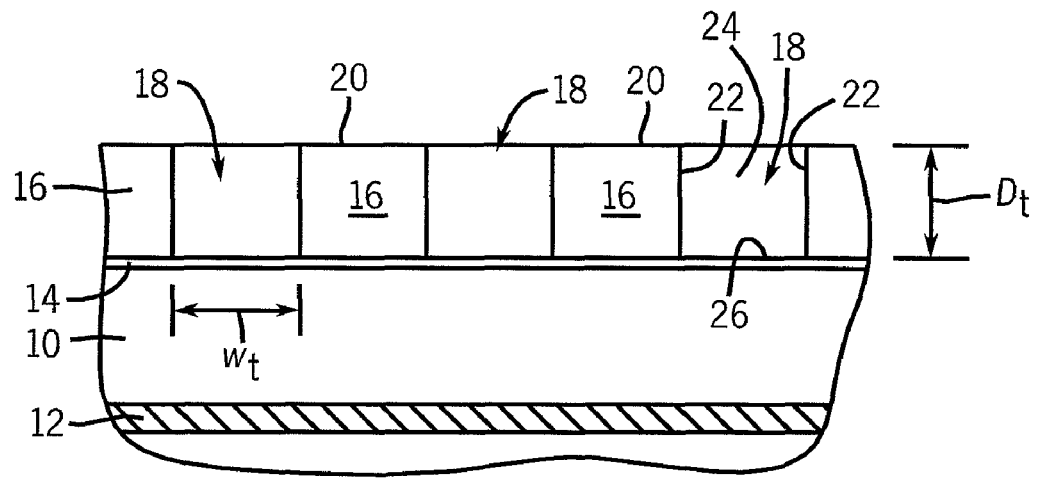
FIGS. 2A-2B illustrate elevational, cross-sectional views of a portion of the substrate depicted in FIG. 2 taken, respectively, along lines 2A-2A and 2B-2B.
Figure 2B:
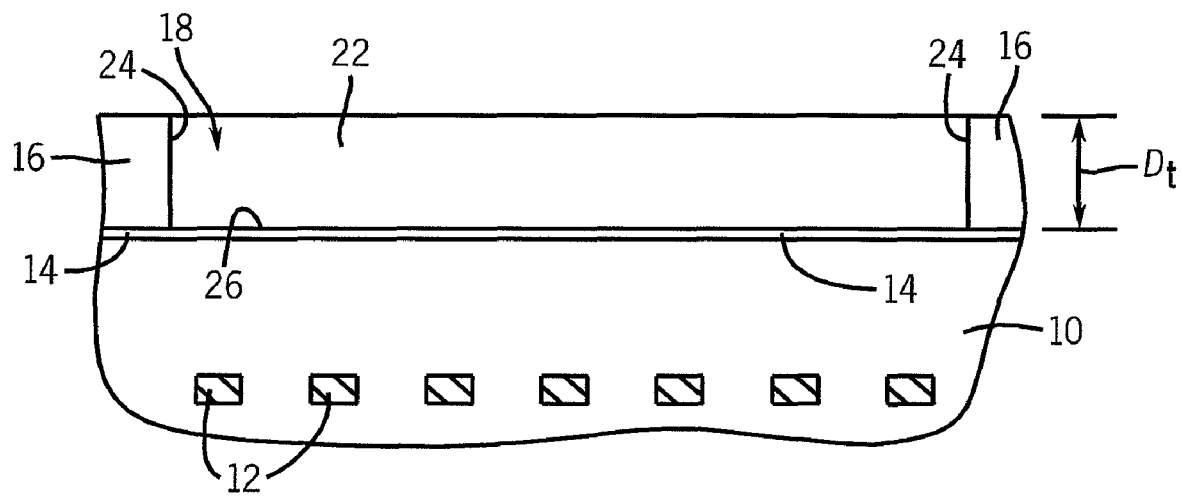

In the illustrated embodiment, a neutral wetting material 14 (e.g., random copolymer) has been formed over the substrate 10. A material layer 16 (or one or more material layers) can then be formed over the neutral wetting material and etched to form trenches 18 that are oriented perpendicular to the array of conductive lines 12, as shown in FIGS. 2-2B. Portions of the material layer 16 form a spacer 20 outside and between the trenches. The trenches 18 are structured with opposing sidewalls 22, opposing ends 24, a floor 26, a width ($w_t$), a length ($l_t$) and a depth ($D_t$).

Figure 3:
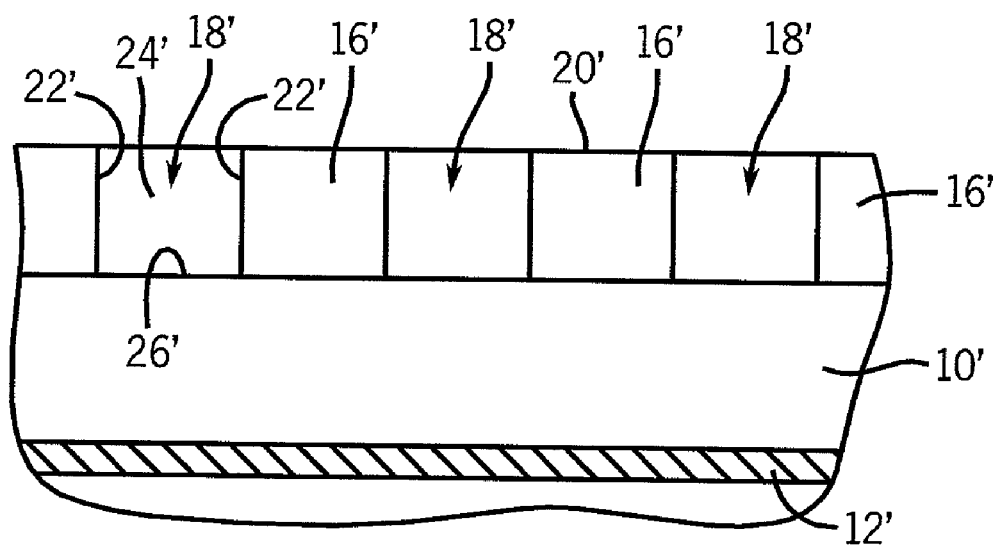
FIG. 3 illustrates a side elevational view of a portion of a substrate at a preliminary processing stage according to another embodiment of the disclosure, showing the substrate with trenches in a material layer formed on the substrate.
Figure 4:
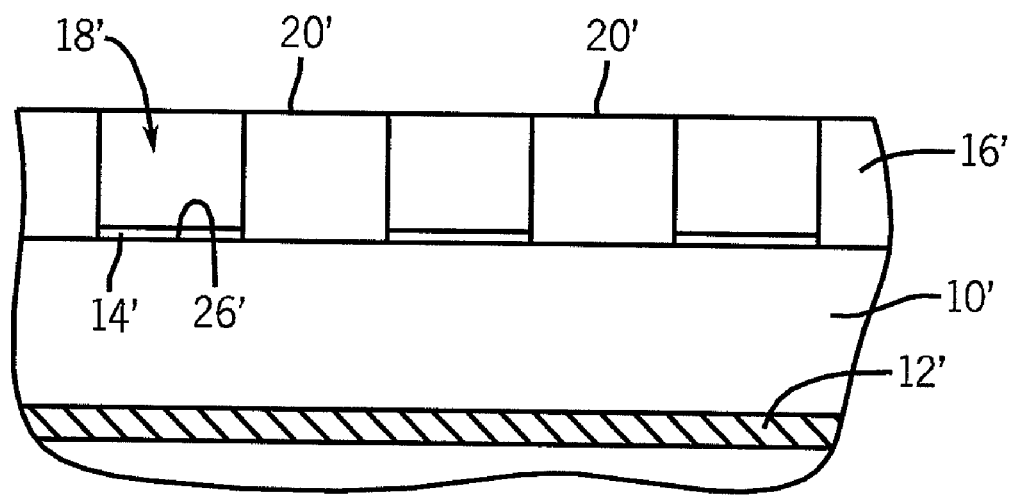
FIG. 4 illustrates a side elevational view of the substrate of FIG. 3 at a subsequent stage showing the formation of a neutral wetting material within the trenches.

In another embodiment illustrated in FIGS. 3-4, the material layer 16' can be formed on the substrate 10', etched to form the trenches 18', and a neutral wetting material 14' can then be formed on the trench floors 26'. For example, a random copolymer material can be deposited into the trenches 18' and crosslinked to form a neutral wetting material layer. Material on surfaces outside the trenches such as on the spacers 20' (e.g., non-crosslinked random copolymer) can be subsequently removed.

Single or multiple trenches 18 (as shown) can be formed using a lithographic tool having an exposure system capable of patterning at the scale of L (10-100 nm). Such exposure systems include, for example, extreme ultraviolet (EUV) lithography, proximity X-rays and electron beam (e-beam) lithography, as known and used in the art. Conventional photolithography can attain (at smallest) about 58 nm features.

A method called "pitch doubling" or "pitch multiplication" can also be used for extending the capabilities of photolithographic techniques beyond their minimum pitch, as described, for example, in U.S. Pat. No. 5,328,810 (Lowrey et al.), U.S. Pat. No. 7,115,525 (Abatchev, et al.), US 2006/0281266 (Wells) and US 2007/0023805 (Wells). Briefly, a pattern of lines is photolithographically formed in a photoresist material overlying a layer of an expendable material, which in turn overlies a substrate, the expendable material layer is etched to form placeholders or mandrels, the photoresist is stripped, spacers are formed on the sides of the mandrels, and the mandrels are then removed leaving behind the spacers as a mask for patterning the substrate. Thus, where the initial photolithography formed a pattern defining one feature and one space, the same width now defines two features and two spaces, with the spaces defined by the spacers. As a result, the smallest feature size possible with a photolithographic technique is effectively decreased down to about 30 nm or less.

Factors in forming a single (1-D) array or layer of perpendicular-oriented nano-cylinders within the trenches include the width ($w_t$) and depth ($D_t$) of the trench, the formulation of the block copolymer or blend to achieve the desired pitch (L), and the thickness (t) of the block copolymer material.

For example, a block copolymer or blend having a pitch or L value of 35-nm deposited into a 75-nm wide trench having a neutral wetting floor will, upon annealing, result in a zigzag pattern of 35-nm diameter perpendicular cylinders that are offset by about one-half the pitch distance, or about 0.5*L) for the length ($l_t$) of the trench, rather than a single line row of perpendicular cylinders aligned with the sidewalls down the center of the trench. There is a shift from two rows to one row of the perpendicular cylinders within the center of the trench as the width ($w_t$) of the trench is decreased and/or the periodicity (L value) of the block copolymer is increased, for example, by forming a ternary blend by the addition of both constituent homopolymers. The boundary conditions of the trench sidewalls 22 in both the x- and y-axis impose a structure wherein each trench contains "n" number of features (e.g., cylinders).

In some embodiments, the trenches 18 are constructed with a width ($w_t$) of about L to about 1.5*L (or 1.5× the pitch value) of the block copolymer such that a cast block copolymer material (or blend) of about L will self assemble upon annealing into a single row of perpendicular cylinders with a center-to-center pitch distance of adjacent cylinders at or about L. For example, in using a cylindrical phase block copolymer with an about 50 nm pitch value or L, the width ($w_t$) of the trenches 18 can be about 1-1.5*50 nm or about 50-80 nm. The length ($l_t$) of the trenches is at or about nL or an integer multiple of L, typically within a range of about n*10 to about n*100 nm (with n being the number of features or structures, e.g., cylinders). The depth ($D_t$) of the trenches 18 is greater than L ($D_t$>L). The width of the spacers 20 between adjacent trenches can vary and is generally about L to about nL. In some embodiments, the trench dimension is about 20-100 nm wide ($w_t$) and about 100-25,000 nm in length ($l_t$), with a depth ($D_t$) of about 10-100 nm.

Figure 5:
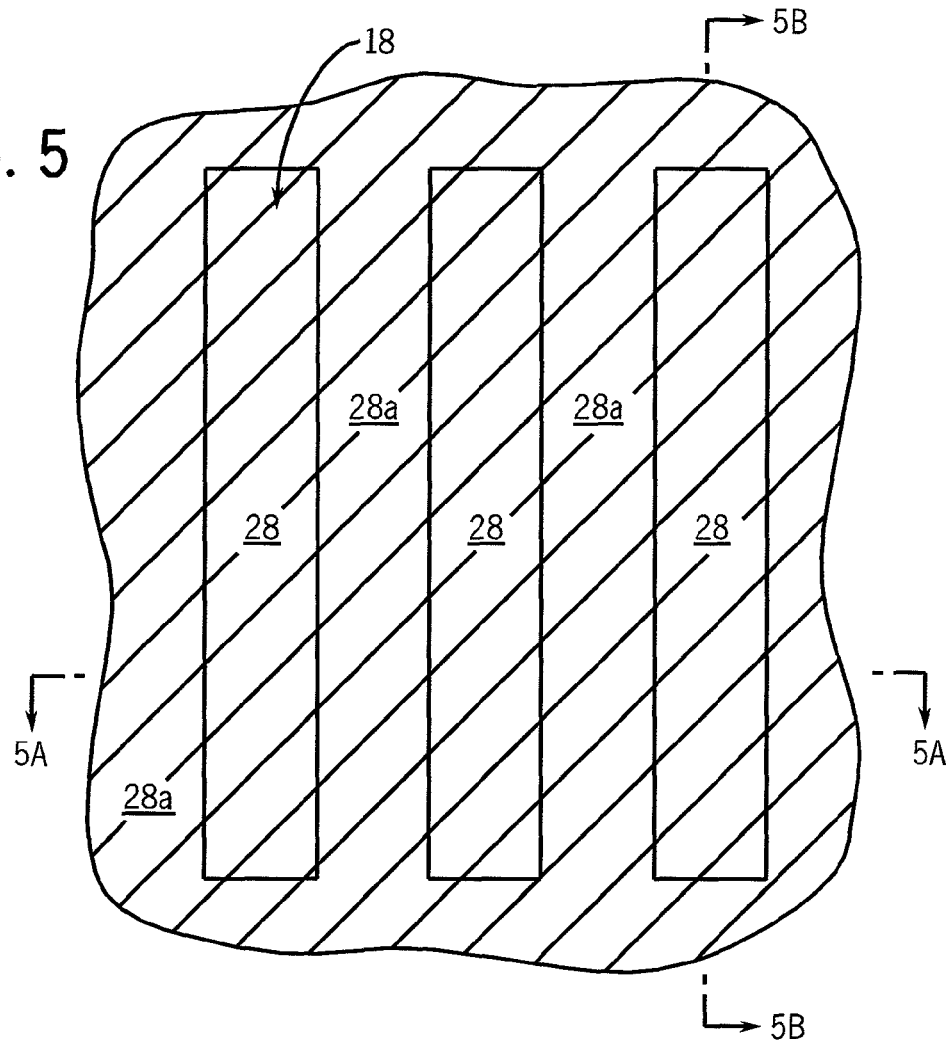
Figure 5A:
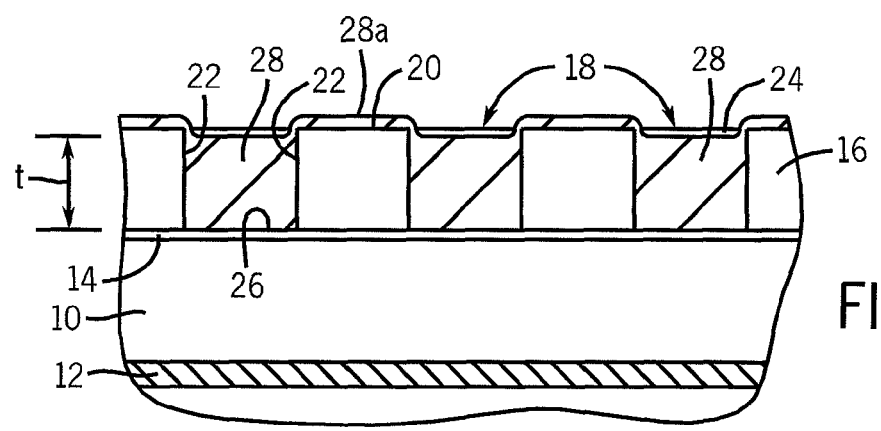

Referring now to FIGS. 5-5B, a self-assembling, cylindrical-phase block copolymer material 28 having an inherent pitch at or about $L_o$ (or a ternary blend of block copolymer and homopolymers blended to have a pitch at or about $L_B$) is deposited into the trenches 18 such that the thickness ($t_1$) on the trench of the deposited block copolymer is generally at or about L after annealing and the block copolymer material will self assemble to form a single layer of cylinders across the width ($w_t$) of the trench. For example, a typical thickness ($t_1$) of a cylindrical-phase PS-b-PMMA block copolymer material 28 within the trench is about ±20% of the L value of the block copolymer material (e.g., about 10-100 nm) to form cylinders having a diameter of about 0.5*L (e.g., 5-50 nm, or about 20 nm, for example) within a polymer matrix in a single row within each trench. The thickness of the block copolymer material 28 can be measured, for example, by ellipsometry techniques.

The block copolymer material can be deposited by spin casting (spin-coating) from a dilute solution (e.g., about 0.25-2 wt % solution) of the copolymer in an organic solvent such as dichloroethane ($CH_2Cl_2$) or toluene, for example. Capillary forces pull excess block copolymer material 28 (e.g., greater than a monolayer) into the trenches 18. As shown, a thin layer or film 28a of the block copolymer material can be deposited onto the material layer 16 outside the trenches, e.g., on the spacers 20. Upon annealing, the thin film 28a will flow into the trenches leaving a structureless brush layer on the material layer 16 from a top-down perspective.

Figure 6A:
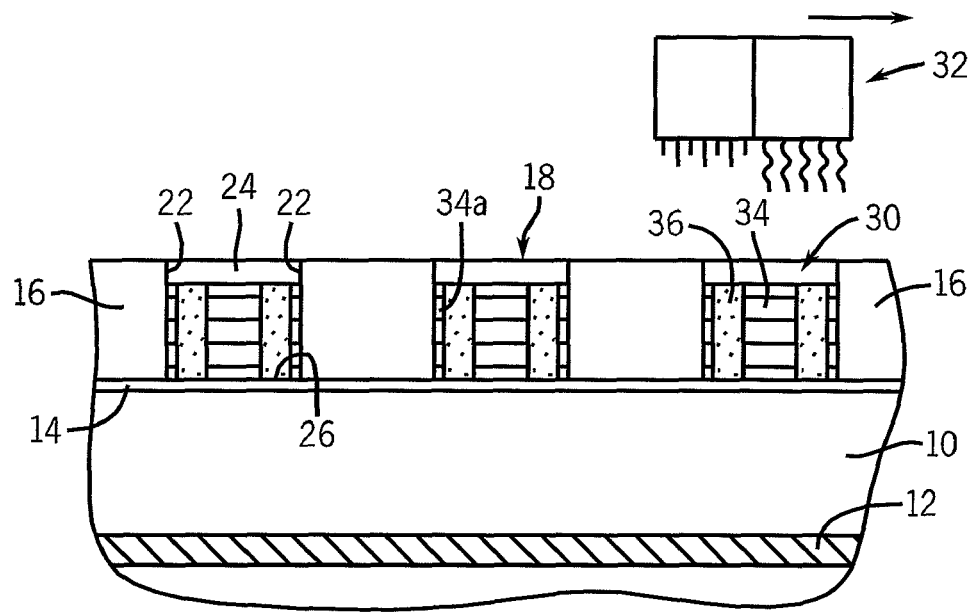
Figure 6B:
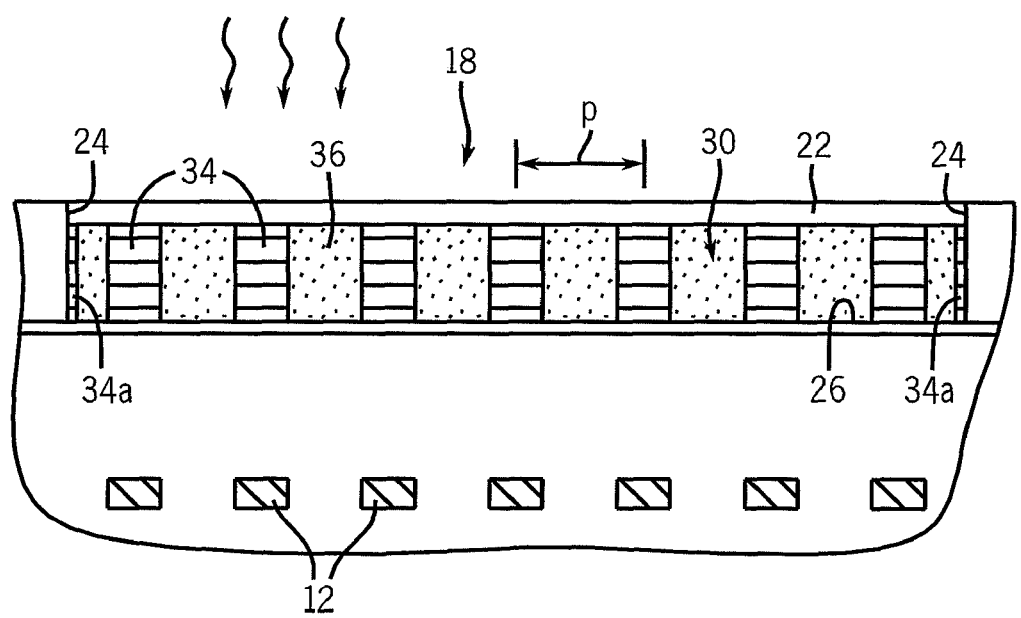

In the present embodiment, the trench floors 26 are structured to be neutral wetting (equal affinity for both blocks of the copolymer) to induce formation of cylindrical polymer domains that are oriented perpendicular to the trench floors, and the trench sidewalls 22 and ends 24 are structured to be preferential wetting by one block of the block copolymer to induce registration of the cylinders to the sidewalls as the polymer blocks self-assemble. In response to the wetting properties of the trench surfaces, upon annealing, the preferred or minority block of the cylindrical-phase block copolymer will self-assemble to form a single row of cylindrical domains in the center of a polymer matrix for the length of the trench and segregate to the sidewalls and edges of the trench to form a thin interface or wetting layer, as depicted in FIGS. 6-6B. Entropic forces drive the wetting of a neutral wetting surface by both blocks, and enthalpic forces drive the wetting of a preferential-wetting surface by the preferred block (e.g., the minority block).

To provide preferential wetting surfaces, for example, in the use of a PS-b-PMMA block copolymer, the material layer 16 can be composed of silicon (with native oxide), oxide (e.g., silicon oxide, $SiO_x$), silicon nitride, silicon oxycarbide, indium tin oxide (ITO), silicon oxynitride, and resist materials such as methacrylate-based resists and polydimethyl glutarimide resists, among other materials, which exhibit preferential wetting toward the PMMA block. In the use of a PS-PMMA cylinder-phase block copolymer material, the copolymer material will self assemble to form a thin interface layer and cylinders of PMMA in a PS matrix.

In other embodiments, a preferential wetting material such as a polymethylmethacrylate (PMMA) polymer modified with an —OH containing moiety (e.g., hydroxyethylmethacrylate) can be applied onto the surfaces of the trenches, for example, by spin coating and then heating (e.g., to about 170° C.) to allow the terminal OH groups to end-graft to oxide sidewalls 22 and ends 24 of the trenches. Non-grafted material can be removed by rinsing with an appropriate solvent (e.g., toluene). See, for example, Mansky et al., *Science*, 1997, 275, 1458-1460, and In et al., *Langmuir*, 2006, 22, 7855-7860.

A neutral wetting trench floor 26 allows both blocks of the copolymer material to wet the floor of the trench. A neutral wetting material 14 can be provided by applying a neutral wetting polymer (e.g., a neutral wetting random copolymer) onto the substrate 10, forming the material layer 16 and then etching the trenches to expose the underlying neutral wetting material, as illustrated in FIGS. 2-2B.

In another embodiment illustrated in FIGS. 3-4, a neutral wetting random copolymer material can be applied after forming the trenches 18', for example, as a blanket coat by casting or spin-coating into the trenches, as depicted in FIG. 4. The random copolymer material can then be thermally processed to flow the material into the bottom of the trenches by capillary action, which results in a layer (mat) 14' composed of the crosslinked, neutral wetting random copolymer. In another embodiment, the random copolymer material within the trenches can be photo-exposed (e.g., through a mask or reticle) to crosslink the random copolymer within the trenches to form the neutral wetting material 14'. Non-crosslinked random copolymer material outside the trenches (e.g., on the spacers 20') can be subsequently removed.

Neutral wetting surfaces can be specifically prepared by the application of random copolymers composed of monomers identical to those in the block copolymer and tailored such that the mole fraction of each monomer is appropriate to form a neutral wetting surface. For example, in the use of a poly(styrene-block-methyl methacrylate) block copolymer (PS-b-PMMA), a neutral wetting material 14 can be formed from a thin film of a photo-crosslinkable random PS:PMMA copolymer (PS-r-PMMA) which exhibits non-preferential or neutral wetting toward PS and PMMA (e.g., a random copolymer of PS-PMMA containing an about 0.6 mole fraction of styrene) which can be cast onto the substrate 10 (e.g., by spin coating). The random copolymer material can be fixed in place by chemical grafting (on an oxide substrate) or by thermally or photolytically crosslinking (any surface) to form a mat that is neutral wetting to PS and PMMA and insoluble when the block copolymer material is cast onto it, due to the crosslinking.

In another embodiment, a neutral wetting random copolymer of polystyrene (PS), polymethacrylate (PMMA) with hydroxyl group(s) (e.g., 2-hydroxyethyl methacrylate (P(S-r-MMA-r-HEMA)) (e.g., about 58% PS) can be can be selectively grafted to a substrate 10 (e.g., an oxide) as a neutral wetting layer 14 about 5-10 nm thick by heating at about 160° C. for about 48 hours. See, for example, In et al., *Langmuir*, 2006, 22, 7855-7860.

A surface that is neutral wetting to PS-b-PMMA can also be prepared by spin coating a blanket layer of a photo- or thermally cross-linkable random copolymer such as a benzocyclobutene- or azidomethylstyrene-functionalized random copolymer of styrene and methyl methacrylate (e.g., poly (styrene-r-benzocyclobutene-r-methyl methacrylate (PS-r-PMMA-r-BCB)). For example, such a random copolymer can comprise about 42% PMMA, about (58-x) % PS and x % (e.g., about 2-3%) of either polybenzocyclobutene or poly (para-azidomethylstyrene)). An azidomethylstyrene-functionalized random copolymer can be UV photo-crosslinked (e.g., 1-5 MW/cm^2 exposure for about 15 seconds to about 30 minutes) or thermally crosslinked (e.g., at about 170° C. for about 4 hours) to form a crosslinked polymer mat as a neutral wetting layer 14. A benzocyclobutene-functionalized random copolymer can be thermally cross-linked (e.g., at about 200° C. for about 4 hours or at about 250° C. for about 10 minutes).

In another embodiment in which the substrate 10 is silicon (with native oxide), another neutral wetting surface for PS-b-PMMA can be provided by hydrogen-terminated silicon. The floors 26 of the trenches 18 can be etched, for example, with a hydrogen plasma, to remove the oxide material and form hydrogen-terminated silicon, which is neutral wetting with equal affinity for both blocks of a block copolymer material. H-terminated silicon can be prepared by a conventional process, for example, by a fluoride ion etch of a silicon substrate (with native oxide present, about 12-15 Å) by exposure to an aqueous solution of hydrogen fluoride (HF) and buffered HF or ammonium fluoride ($NH_4F$), by HF vapor treatment, or by a hydrogen plasma treatment (e.g., atomic hydrogen). An H-terminated silicon substrate can be further processed by grafting a random copolymer such as PS-r-PMMA selectively onto the substrate resulting in a neutral wetting surface, for example, by an in situ free radical polymerization of styrene and methyl methacrylate using a di-olefinic linker such divinyl benzene which links the polymer to the surface to produce about a 10-15 nm thick film.

In yet another embodiment, a neutral wetting surface for PS-b-PMMA and PS-b-PEO can be provided by grafting a self-assembled monolayer (SAM) of a trichlorosilane-base SAM such as 3-(para-methoxyphenyl)propyltrichorosilane grafted to oxide (e.g., $SiO_2$) as described for example, by D. H. Park, *Nanotechnology* 18 (2007), p. 355304.

In the present embodiment, the block copolymer material 28 is then thermally annealed (arrows ↓) to cause the polymer blocks to phase separate and self assemble according to the preferential and neutral wetting of the trench surfaces to form a self-assembled polymer material 30, as illustrated in FIGS. 6-6B. Thermal annealing can be conducted at above the glass transition temperature of the component blocks of the copolymer material. For example, a PS-b-PMMA copolymer material can be globally annealed at a temperature of about 180-230° C. in a vacuum oven for about 1-24 hours to achieve the self-assembled morphology. The resulting morphology of the annealed copolymer material 30 (e.g., perpendicular orientation of cylinders) can be examined, for example, using atomic force microscopy (AFM), transmission electron microscopy (TEM), scanning electron microscopy (SEM).

Rather than performing a global heating of the block copolymer material, in other embodiments, a zone or localized thermal anneal can be applied to portions or sections of the copolymer material 28 on the substrate 10. For example, the substrate can be moved across a hot-to-cold temperature gradient 32 (FIG. 6A) positioned above or underneath the substrate (or the thermal source can be moved relative to the substrate, e.g., arrow →) such that the block copolymer material self-assembles upon cooling after passing through the heat source. Only those portions of the block copolymer material that are heated above the glass transition temperature of the component polymer blocks will self-assemble, and areas of the material that were not sufficiently heated remain disordered and unassembled. "Pulling" the heated zone across the substrate can result in faster processing and better ordered structures relative to a global thermal anneal.

Upon annealing, the cylindrical-phase block copolymer material 28 will self-assemble into a polymer material 30 (e.g. film) composed of perpendicular-oriented cylinders 34 of one of the polymer blocks (e.g., PMMA) within a polymer matrix 36 of the other polymer block (e.g., PS). The constraints provided by the width ($w_t$) of the trench 18 and the character of the block copolymer composition (e.g., PS-b-PMMA having an inherent pitch at or about L) combined with a trench floor 26 that exhibits neutral or non-preferential wetting toward both polymer blocks (e.g., a random graft copolymer) and sidewalls 22 that are preferential wetting by the minority or preferred block of the block copolymer (e.g., the PMMA block), results in perpendicularly-oriented cylindrical domains 34 of the minority polymer block (e.g., PMMA) within a matrix 36 of the majority polymer block (e.g., PS) in a single row (1-D array) registered and parallel to the sidewalls 22 of the trench. The diameter of the cylinders 34 will generally be about one-half of the center-to-center distance between cylinders. Upon annealing, a layer of the minority block segregates to and wets the sidewalls 22 and ends 24 of the trenches to form a thin wetting layer 34a with the thickness of the layer 34a being generally about one-fourth of the center-to-center distance between adjacent cylinders 34. For example, a layer of PMMA domains will wet oxide interfaces, with attached PS domains consequently directed away from the oxide material.

In some embodiments, the self-assembled block copolymer material 30 is defined by an array of cylindrical domains (cylinders) 34, each with a diameter at or about 0.5*L, with the number (n) of cylinders in the row according to the length of the trench, and the center-to-center distance (pitch distance, p) between each cylinder at or about L.

Optionally, after the block copolymer material is annealed and ordered, the copolymer material can be treated to crosslink the polymer segments (e.g., the PS segments) to fix and enhance the strength of the self-assembled polymer blocks. The polymers can be structured to inherently crosslink (e.g., upon exposure to ultraviolet (UV) radiation, including deep ultraviolet (DUV) radiation), or one of the polymer blocks of the copolymer material can be formulated to contain a crosslinking agent.

Generally, the film 28a outside the trenches will not be not thick enough to result in self-assembly. Optionally, the unstructured thin film 28a of the block copolymer material outside the trenches (e.g., on spacers 20) can be removed, as illustrated in FIGS. 6-6B. For example, the trench regions can be selectively exposed through a reticle (not shown) to crosslink only the annealed and self-assembled polymer material 30 within the trenches 18, and a wash can then be applied with an appropriate solvent (e.g., toluene) to remove the non-crosslinked portions of the block copolymer material 28a (e.g., on the spacers 20), leaving the registered self-assembled polymer material within the trench and exposing the surface of the material layer 16 above/outside the trenches. In another embodiment, the annealed polymer material 30 can be crosslinked globally, a photoresist material can be applied to pattern and expose the areas of the polymer material 28a outside the trench regions, and the exposed portions of the polymer material 28a can be removed, for example by an oxygen ($O_2$) plasma treatment.

Figure 7:
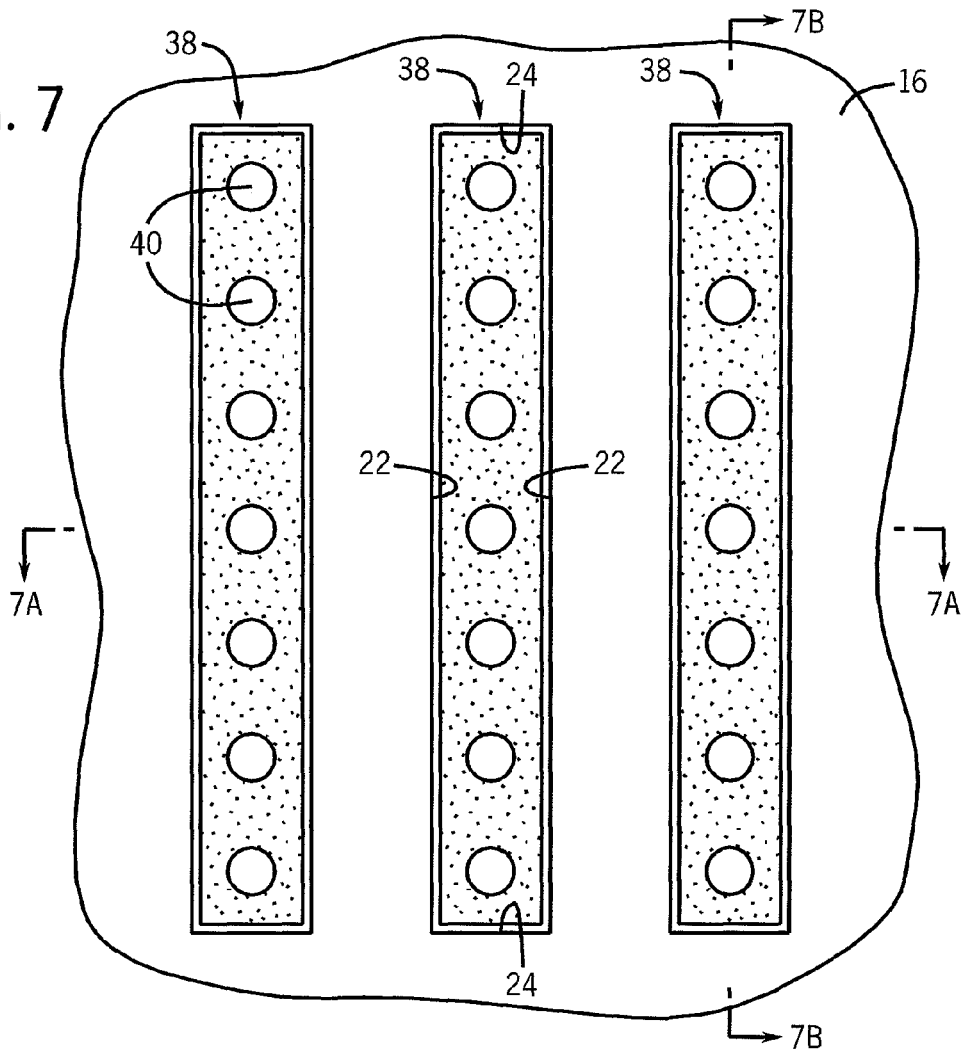
FIGS. 7-9 are top plan views of the substrate of FIG. 6 at subsequent stages, illustrating an embodiment of the use of the self-assembled block copolymer film after removal of one of the polymer blocks, as a mask to etch the substrate and filling of the etched openings.
Figure 7A:
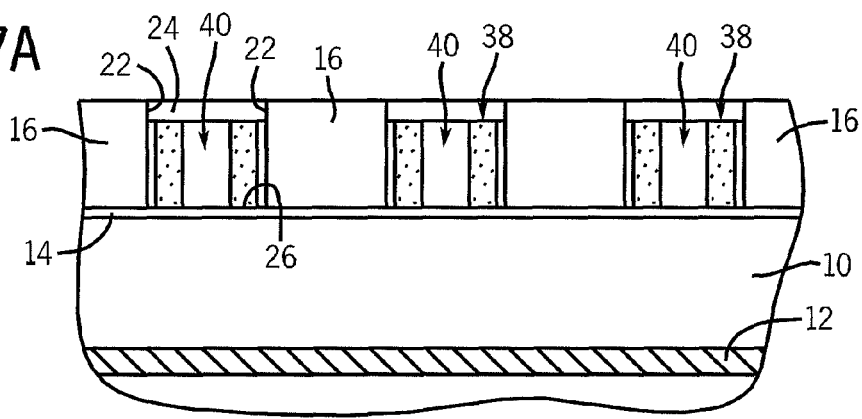
Figure 7B:
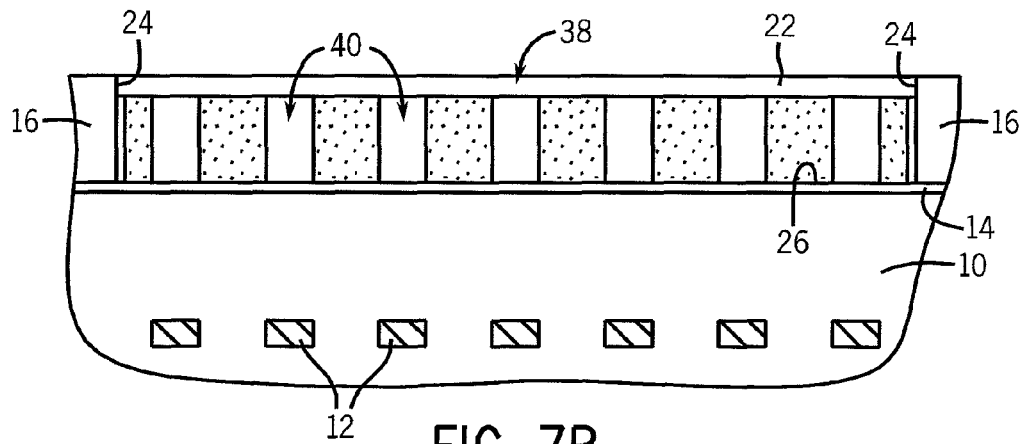
Figure 8:
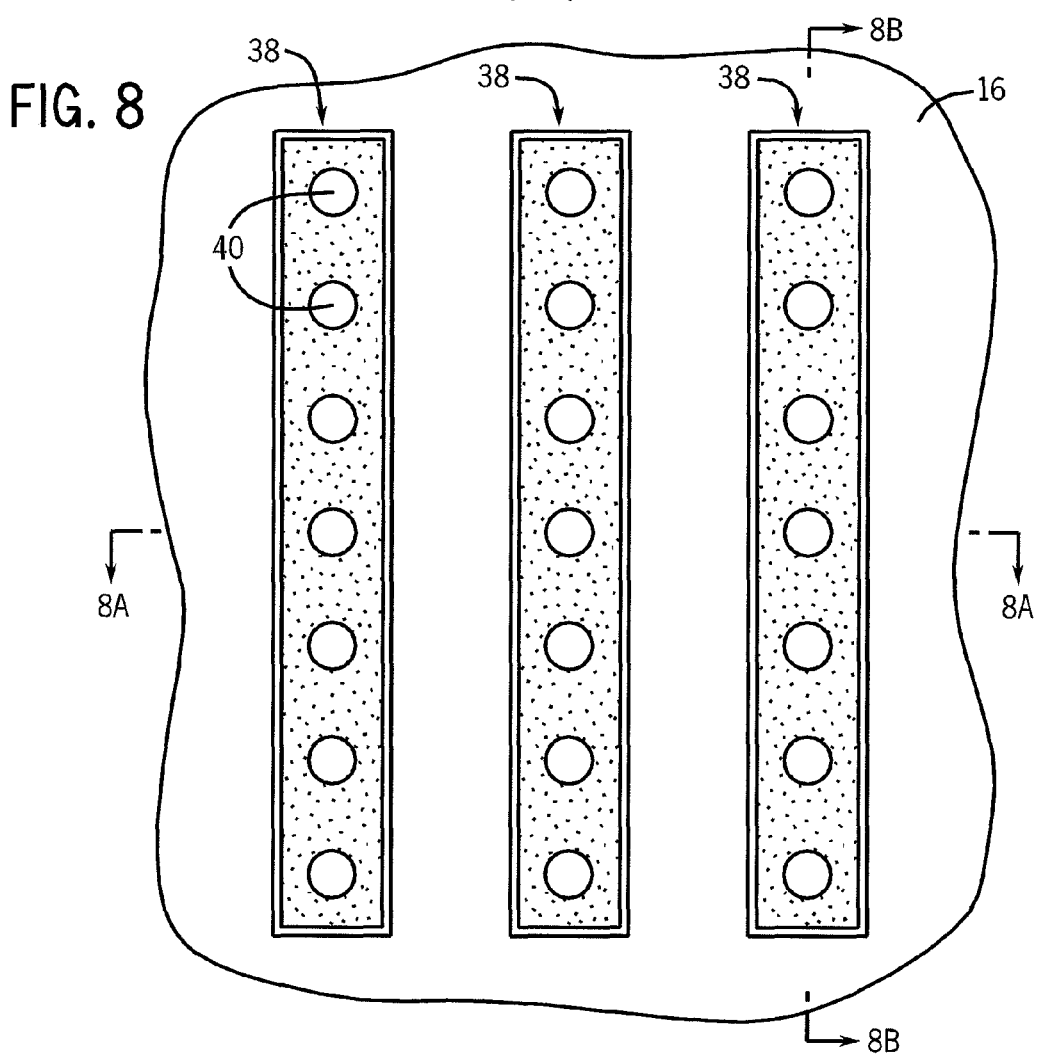
Figure 8A:
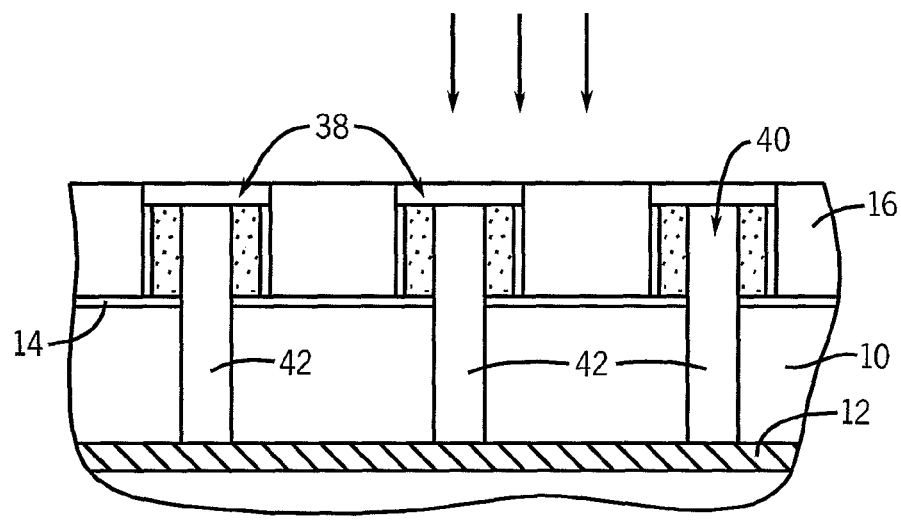
Figure 8B:
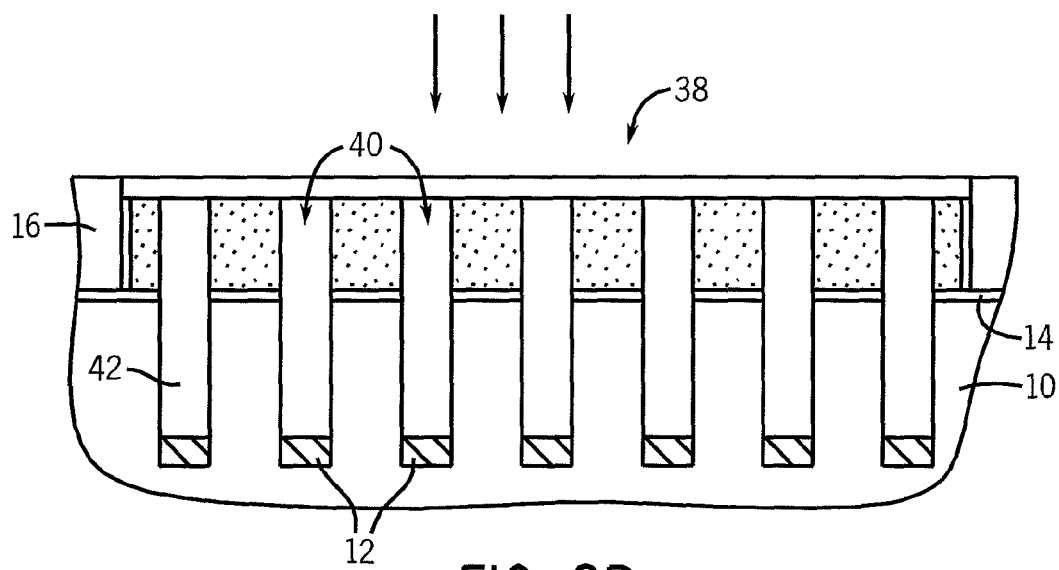

An application of the self-assembled polymer material 30 is as an etch mask to form openings in the substrate 10. For example, as illustrated in FIGS. 7-7B, in one embodiment, the cylindrical polymer domains 34 of the self-assembled polymer material 30 can be selectively removed resulting in a polymer matrix 36 with openings 40 exposing the trench floor. For example, PMMA domains can be selectively removed by UV exposure/acetic acid development or by selective reactive ion etching (RIE). The remaining porous polymer (e.g. PS) matrix 36 can then be used as a mask to etch (arrows ↓↓) a series of openings or contact holes 42 to the conductive lines 12, semiconducting regions, or other active area in the underlying substrate 10 (or an underlayer), as depicted in FIGS. 8-8B, for example, using a selective reactive ion etching (RIE) process.

Figure 9:
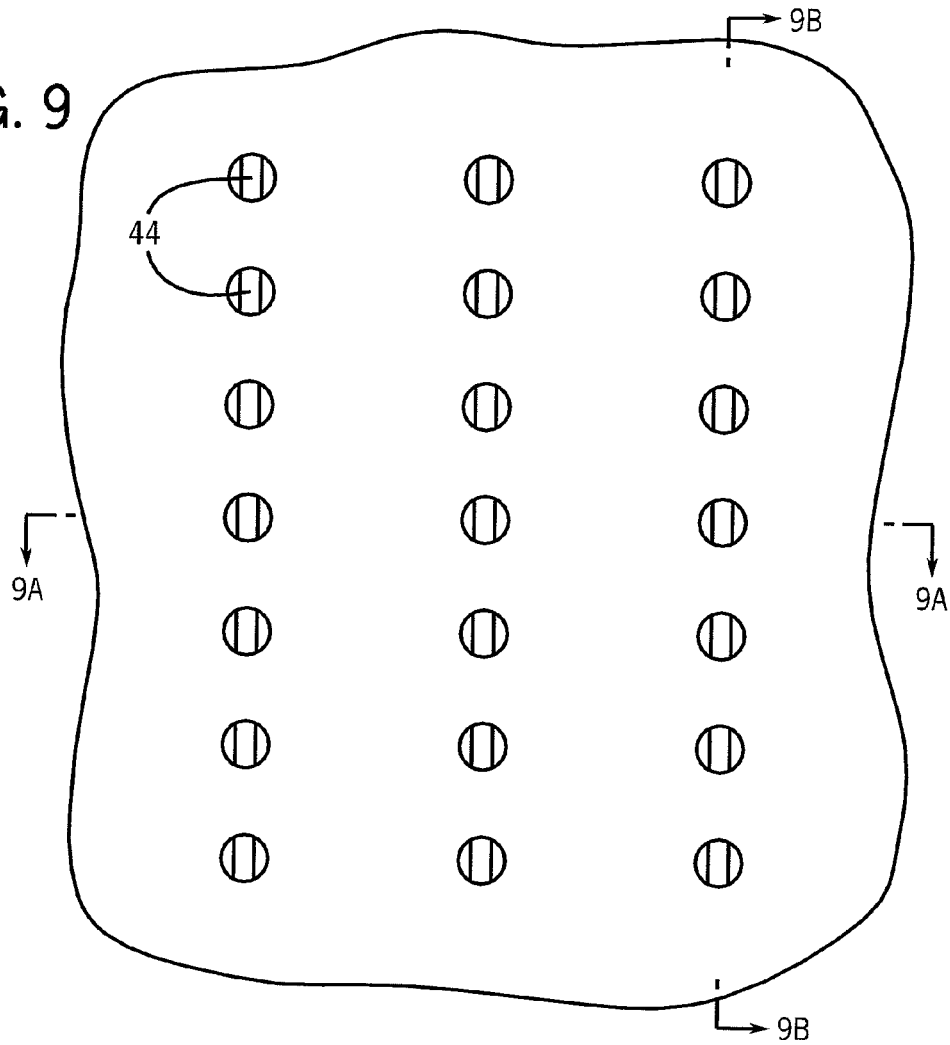
Figure 9A:
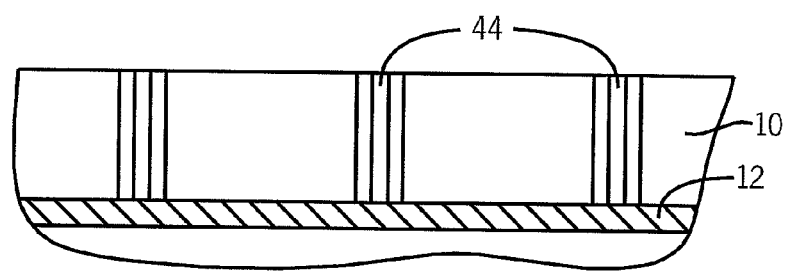
Figure 9B:
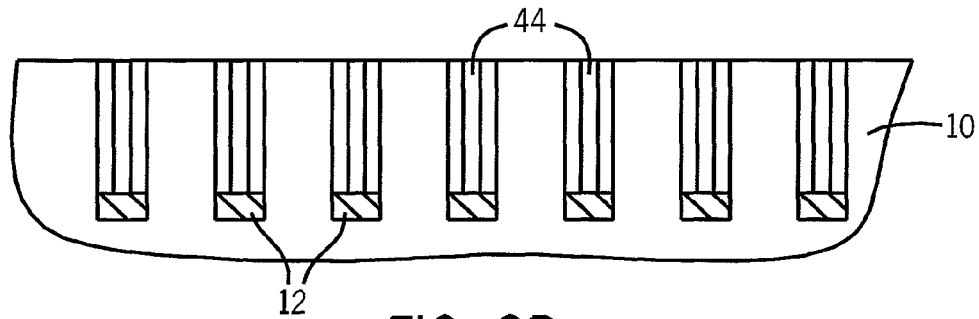

Further processing can then be performed as desired. For example, as depicted in FIGS. 9-9B, the residual matrix 36 can be removed and the substrate openings 42 can be filled with a material 44 such as a metal or metal alloy such as Cu, Al, W, Si, and $Ti_3N_4$, among others, to form arrays of cylindrical contacts to the conductive lines 12. The cylindrical openings 42 in the substrate can also be filled with a metal-insulator-metal stack to form capacitors with an insulating material such as $SiO_2$, $Al_2O_3$, $HfO_2$, $ZrO_2$, $SrTiO_3$, and the like.

Another embodiment of a method according to the invention utilizes a solvent anneal in combination with a graphoepitaxy technique to induce ordering and registration of a cylindrical-phase block copolymer material within a trench, as depicted in FIGS. 10-15, to form a 1-D array of a single row of perpendicular-oriented cylinders in a polymer matrix.

The diblock copolymer is constructed such that both polymer blocks will wet the air interface during the solvent anneal. Examples of diblock copolymers include poly(styrene)-b-poly(ethylene oxide) (PS-b-PEO); a PS-b-PEO block copolymer having a cleavable junction such as a triphenylmethyl (trityl) ether linkage between PS and PEO blocks (optionally complexed with a dilute concentration (e.g., about 1%) of a salt such as KCl, KI, LiCl, LiI, CsCl or CsI (Zhang et al., *Adv. Mater.* 2007, 19, 1571-1576); PS-b-PMMA block copolymer doped with PEO-coated gold nanoparticles of a size less than the diameter of the self-assembled cylinders (Park et al, *Macromolecules,* 2007, 40(11), 8119-8124); poly(styrene)-b-poly(methylmethacrylate) (PS-b-PMMA) or other PS-b-poly(acrylate) or PS-b-poly(methacrylate), poly(styrene)-b-poly(lactide) (PS-b-PLA), poly(styrene)-b-poly(vinylpyridine) (PS-b-PVP), poly(styrene)-b-poly(tert-butyl acrylate) (PS-b-PtBA), and poly(styrene)-b-poly(ethylene-co-butylene (PS-b-(PS-co-PB)). Examples of triblock copolymers include ABC polymers such as poly(styrene-b-methyl methacrylate-b-ethylene oxide) (PS-b-PMMA-b-PEO), and ABA copolymers such as PS-b-PI-b-PS.

The present embodiment utilizing a solvent anneal eliminates the formation of a neutral wetting material on the trench floor, which reduces the number of processing steps. In addition, each of the trench surfaces (e.g., sidewalls 22", ends 24", floor 26") is structured to be preferential wetting to the minority block of the PS-b-PEO block copolymer material (e.g., PEO).

The trenches 18" are also structured with a width ($w_t$) that is about 1-1.5*L or 1 to 1½ times the pitch value of the block copolymer material. For example, for a cylindrical-phase PS-b-PEO copolymer with a L value of about 50 nm, the trench is constructed to have a width ($w_t$) of about 50 nm. The depth ($D_t$) of the trenches can be at or about L.

Figure 10:
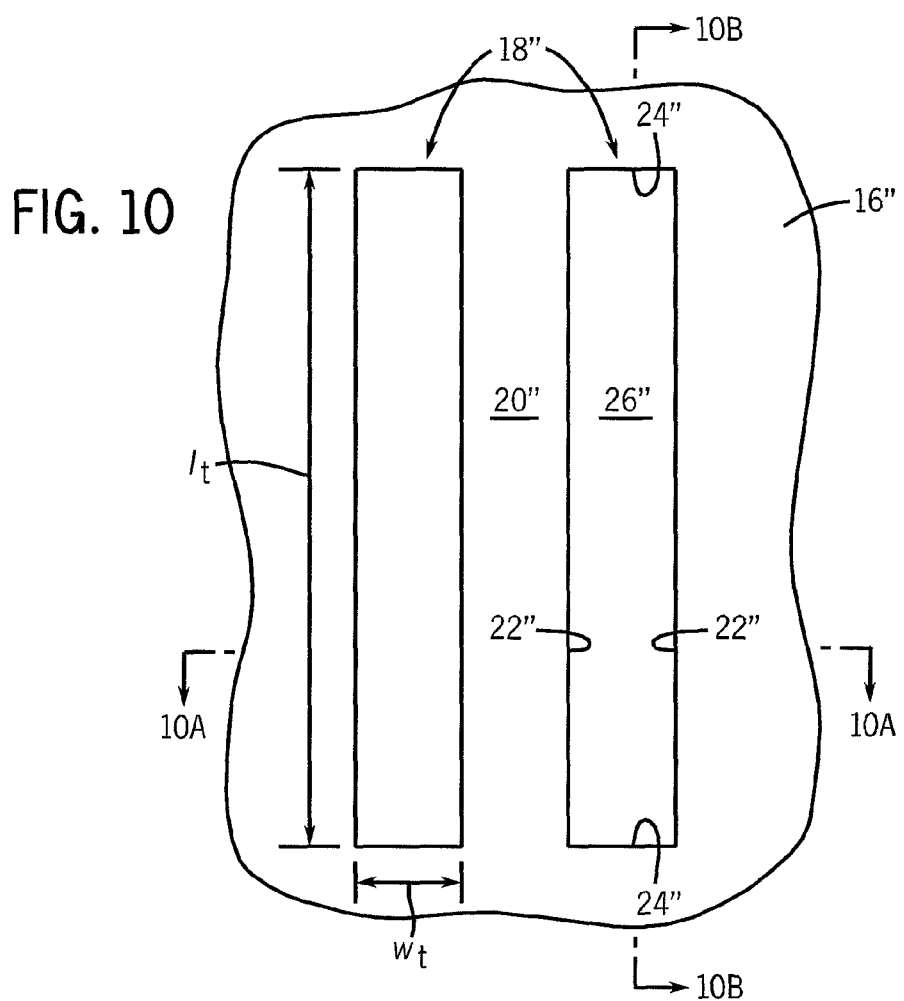
FIG. 10 is a diagrammatic top plan view of a portion of a substrate at a preliminary processing stage according to another embodiment of the disclosure, showing trenches in a material layer exposing the substrate.
Figure 10A:
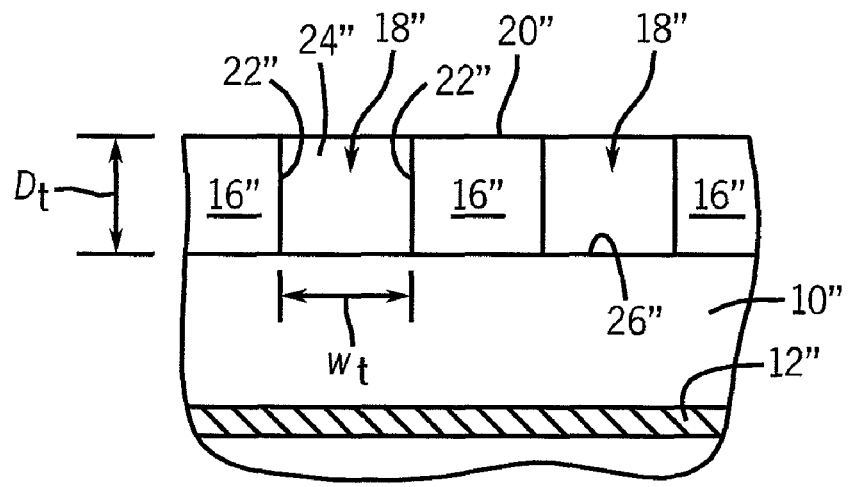
FIGS. 10A-10B are elevational, cross-sectional views of the substrate depicted in FIG. 10 taken along lines 10A-10A and 10B-10B, respectively.
Figure 10B:
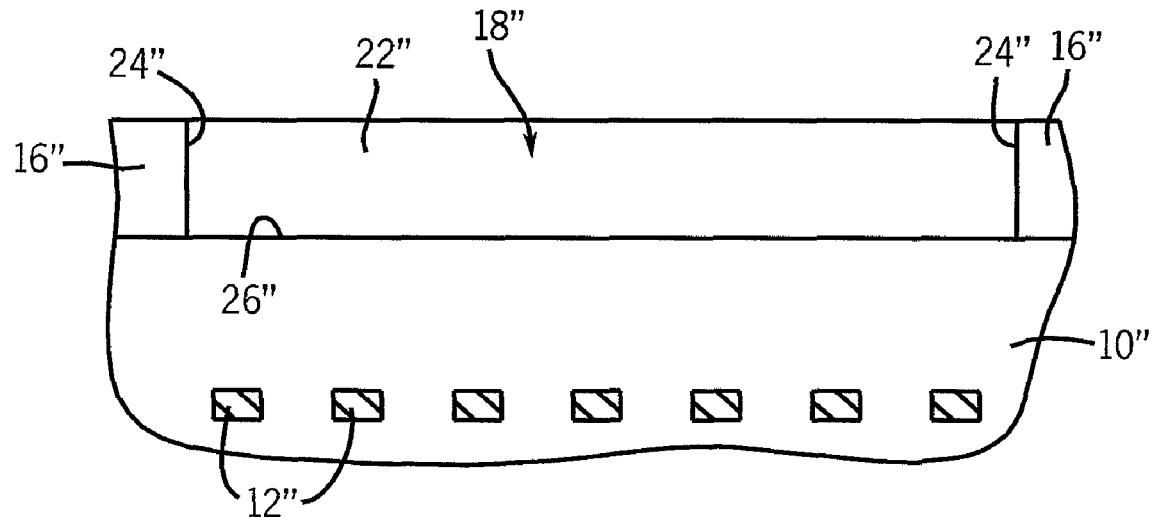

Referring to FIGS. 10-10B, a substrate 10" is shown with conductive lines 12" (or other active area) and an overlying material layer 16" in which trenches 18" have been etched. The substrate 10" and material layer 16" defining the trench surfaces can be a material that is inherently preferential wetting to one of the polymer blocks, or in other embodiments, a preferential wetting material can be applied onto the surfaces of the trenches. For example, in the use of a PS-b-PEO block copolymer, the substrate 10" and material layer 16" can be formed of silicon (with native oxide), oxide (e.g., silicon oxide, $SiO_x$), silicon nitride, silicon oxycarbide, indium tin oxide (ITO), silicon oxynitride, and resist materials such as such as methacrylate-based resists, among other materials, which exhibit preferential wetting toward the PEO block. In the use of a PS-PEO cylinder-phase block copolymer material, the copolymer material will self assemble to form cylinders of PEO in a PS matrix and a thin interface brush or wetting layer on the sidewalls 22" and ends 24" of the trench.

Figure 11:
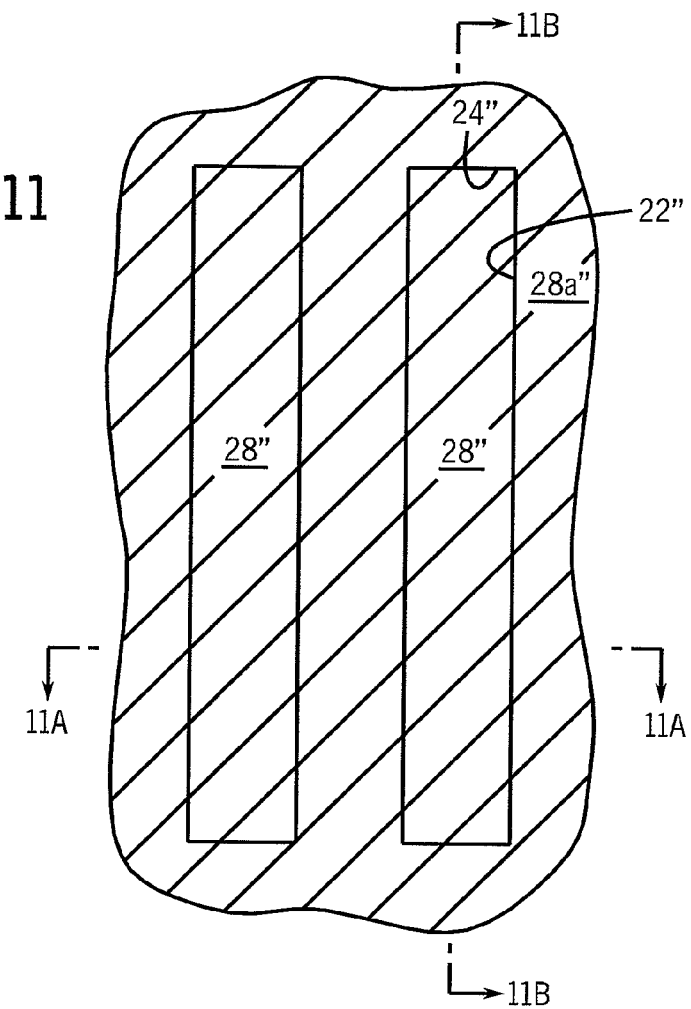
FIGS. 11-12 are diagrammatic top plan views of the substrate of FIG. 10 at subsequent stages in the fabrication of a self-assembled block copolymer film within the trenches in the material layer.
Figure 11A:
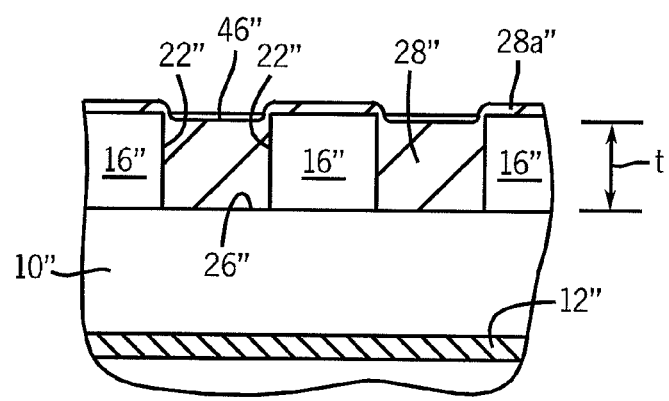
Figure 11B:
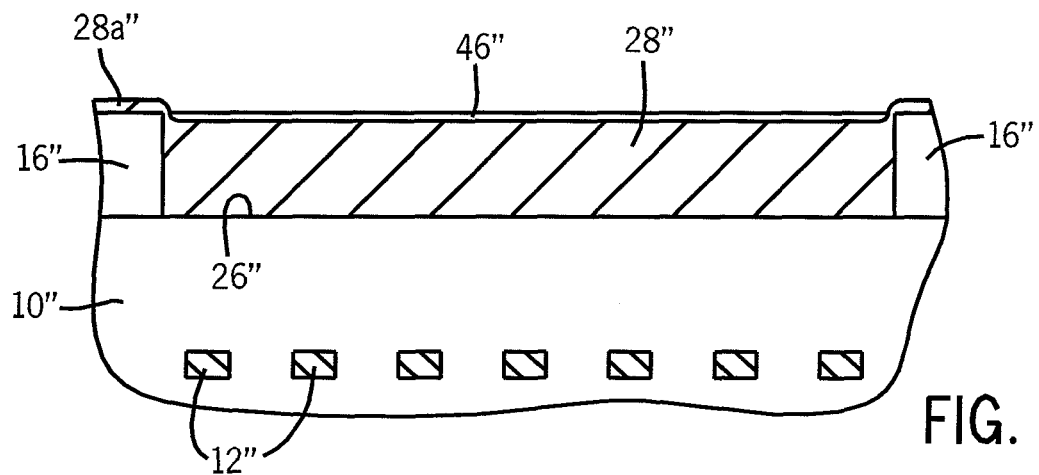

A cylindrical-phase PS-b-PEO block copolymer material 28" (or blend with homopolymers) having an inherent pitch at or about L can be deposited into the trenches 18", as shown in FIGS. 11-11B. With the use of a solvent anneal, the thickness ($t_1$) of the block copolymer material deposited into the trench can be about the L value of the material or greater, e.g., up to about 1000% of the L value.

The volume fractions of the two blocks (AB) of the PS-b-PEO diblock copolymer are generally at a ratio of about 60:40 and 80:20, such that the block copolymer will microphase separate and self-assemble into cylindrical domains of polymer B (i.e., PEO) within a matrix of polymer A (i.e., PS). An example of a cylinder-forming PS-b-PEO copolymer material (L=50 nm) to form about 25 nm diameter cylindrical PEO domains in a matrix of PS is composed of about 70% PS and 30% PEO with a total molecular weight ($M_n$) of about 75 kg/mol. Although diblock copolymers are used in the illustrative embodiment, triblock or multiblock copolymers can also be used.

The PS-b-PEO block copolymer material can also be formulated as a binary or ternary blend comprising a PS-b-PEO block copolymer and one or more homopolymers (i.e., polystyrene (PS) and polyethylene oxide (PEO) to produce blends that swell the size of the polymer domains and increase the L value of the polymer. The volume fraction of the homopolymers can range from 0 to about 40%. An example of a ternary diblock copolymer blend is a PS-b-PEO/PS/PEO blend. The L value of the polymer can also be modified by adjusting the molecular weight of the block copolymer.

Figure 12B:
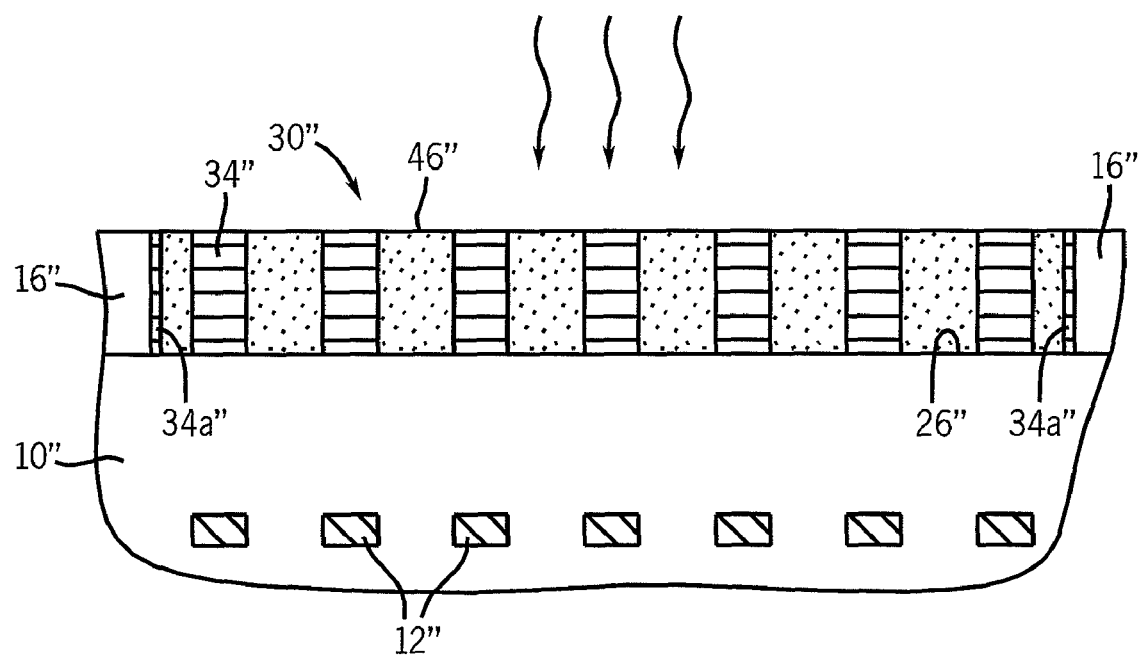

The PS-b-PEO block copolymer material 28" is then solvent annealed (arrows ↓), to form a self-assembled polymer material 30", as illustrated in FIGS. 12-12B.

In a solvent anneal, the block copolymer material is swollen by exposure to a vapor of a "good" solvent for both blocks, for example, benzene, chloroform or a chloroform/octane mixture. The block copolymer material 28" is exposed to the solvent vapors to slowly swell both polymer blocks (PS, PEO) of the material. The solvent and solvent vapors are then allowed to slowly diffuse out of the swollen polymer material and evaporate. The solvent-saturated vapor maintains a neutral air interface 46" with the copolymer material 28", which induces the formation of perpendicular features throughout the copolymer material. The evaporation of the solvent forms a gradient that causes self-assembly and formation of structures starting at the air-surface interface 46" and driven downward to the floor 26" of the trench 18", with formation of perpendicular-oriented cylindrical domains 34" guided by the trench sidewalls 22" and extending completely from the air interface 46" to the substrate surface (trench floor 26"). In some embodiments, a solvent anneal can be conducted in high humidity (e.g., about 70-85%) with water condensation on the film, which cools as the solvent (e.g., benzene) evaporates.

The constraints provided by the width ($w_t$) of trench 18" and the character of the block copolymer composition 28", preferential wetting sidewalls 22" and ends 24" combined with a solvent anneal results in a one-dimensional (1-D) array of a single row of perpendicularly-oriented cylindrical domains 34" of the minority polymer block (e.g., PEO) within a matrix 36" of the major polymer block (e.g., PS), with the minority block segregating to the sidewalls 22" of the trench to form a wetting layer 34a" with a thickness generally about one-fourth of the center-to-center distance of adjacent cylinders 34". In some embodiments, the cylinders have a diameter at or about 0.5*L (e.g., about one-half of the center-to-center distance between cylinders), the number (n) of cylinders in the row is according to the length ($l_t$) of the trench, and the center-to-center distance (pitch distance, p) between cylinder domains is at or about L.

Optionally, the annealed and ordered polymer material 30" can be treated to crosslink the polymer segments (e.g., the PS matrix 36"). The unstructured thin film 28a" of the block copolymer material outside the trenches can then be optionally removed, as shown in FIGS. 12-12B.

Figure 13B:
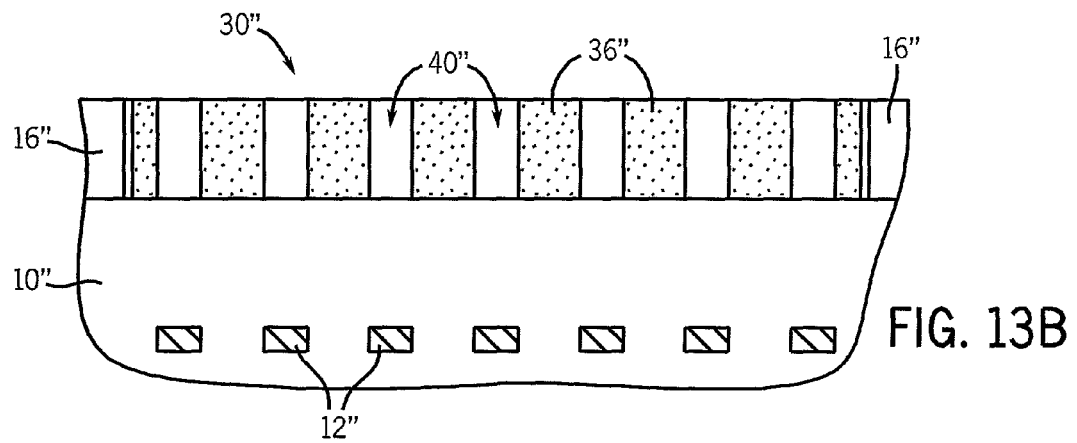
FIGS. 13B-

As depicted in FIGS. 13-13B, the self-assembled polymer material 30" (optionally cross-linked) can then be processed to form, for example, an etch mask for use in etching openings in the substrate or underling material layer, by the selective removal of one of the polymer domains (e.g., PS or PEO). For example, the water-soluble PEO cylindrical domains 34" can be selectively removed to produce openings 40" in the PS material layer 36" that can be used, for example, as a lithographic template or mask to etch openings 42" in the underlying substrate 10" (FIGS. 14-14B) for semiconductor processing in the nanometer size range (i.e., about 10-100 nm). Removal of the PEO phase domains 34" can be performed, for example, by exposure of the self-assembled block copolymer material 30" (optionally cross-linked) to aqueous hydroiodic acid or exposure to water alone, which will draw PEO to the surface without cleaving the bonds to the PS domains. In embodiments in which the PS-b-PEO block copolymer includes an acid-cleavable linker (e.g., trityl alcohol linker) positioned between the polymer blocks, exposure of the crosslinked polymer material 30" to an aqueous acid (e.g., trifluoroacetic acid) or to an acid vapor can be performed to cleave the polymer into PEO and PS fragments (S. Yurt et al., "Scission of Diblock Copolymers into Their Constituent Blocks," *Macromolecules* 2006, 39, 1670-1672). Rinsing with water can then be performed to remove the cleaved PEO domains 34". In other embodiments, exposure to water to draw the PEO domains to the surface followed by a brief oxygen ($O_2$) plasma etch can also be performed to remove the PEO domains.

Figure 15B:
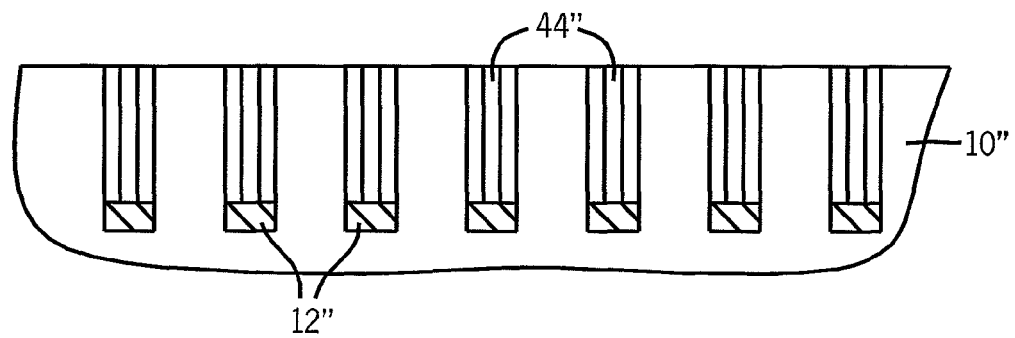

As shown in FIGS. 15-15B, the residual polymer matrix 36" can then be removed and the openings 42" that have been formed in the substrate can be filled with a desired material 44".

Another embodiment of a method according to the invention utilizes a thermal anneal in combination with a cylindrical-phase, block copolymer material comprising polylactide (or polylactic acid) and graphoepitaxy to form a single row, 1-D array of perpendicular-oriented cylinders in a polymer matrix. Examples of polylactide block copolymer materials include poly(styrene)-b-poly(lactide) (or poly(lactic acid)) (PS-b-PLA).

The described embodiment eliminates the formation of a neutral wetting material on the trench floor, thus reducing the number of processing steps. It also utilizes a thermal anneal process, which can provide faster processing than with a solvent anneal. In addition, the use of polylactic acid (PLA), a biodegradable, thermoplastic aliphatic polyester, allows relatively easy development and removal of the PLA domains to form cylindrical-shaped voids through the polymer matrix (e.g., PS, etc.). The trench surfaces (e.g., sidewalls, ends, floor) are structured using the same or highly similar material that is preferential wetting to the minority block, e.g., the PLA block of a PS-b-PLA copolymer material.

The present embodiments can also be described with reference to FIGS. 10-15. Referring to FIGS. 10-10B, the substrate 10" and material layer 16" can be formed from a material that is inherently preferential wetting to the PLA block, or in other embodiments, a preferential wetting material can be applied onto the surfaces of the trenches 18", with the same or closely similar material being used to define the sidewalls 22", ends 24" and floor 26" of the trenches. For example, materials that are preferential wetting to the PLA block of a PS-b-PLA block copolymer include oxide (e.g., silicon oxide, $SiO_x$), silicon (with native oxide), silicon nitride, silicon oxycarbide, indium tin oxide (ITO), silicon oxynitride, and resist materials such as such as methacrylate-based resists, among other materials.

In the present embodiment, the trenches 18" are structured with a width ($w_t$) that is at about 1.5*L value of the PS-b-PLA copolymer material, a length ($l_t$) at or about $nL_o$ (where n=number of cylinders), and a depth ($D_t$) at greater than L ($D_t > L$) such that a cylindrical-phase block copolymer (or blend) that is cast into the trench to a thickness of about the inherent L value of the copolymer material will self assemble upon annealing into a single layer of n cylinders according to the length ($l_t$) of the trench, the cylinders with a diameter at or about 0.5*L, and a center-to-center distance (p) of adjacent cylinders at or about L.

A cylindrical-phase PS-b-PLA block copolymer material 28" (or triblock or multiblock copolymers or blend with homopolymers) having an inherent pitch at or about L can be deposited into the trenches 18", as shown in FIGS. 11-11B. For example, a PS-b-PLA copolymer material (L=49 nm) can be composed of about 71% PS and 29% PLA with a total molecular weight ($M_n$) of about 60.5 kg/mol to form about 27 nm diameter cylindrical PLA domains in a matrix of PS.

Upon casting the copolymer material 28" into the trenches 18", both polymer blocks (e.g., PLA and PS) tend to wet the air interface 46" equally well, and the minority (e.g., PLA) block will preferentially wet the surfaces 22", 24" 26" of the trench to form a thin wetting layer 34a" on each of the trench surfaces as illustrated in FIGS. 12-12B. Turning now to FIGS. 16-16B, in the present embodiment, the wetting layer 34a''' is a bilayer of PLA 48a''' and PS 48b'''. The PS 48b''' portion of the wetting layer (depicted with broken lining - - - ) is continuous with the overall PS matrix 36''', as shown.

Thermal annealing of the block copolymer material 28''' in combination with the constraints provided by the width ($w_t$) of the trench 18''', the preferential wetting trench surfaces 22''', 24"' 26''' and the composition of the block copolymer, causes the minority polymer block (e.g., PLA block) to self assemble to form perpendicular-oriented cylindrical domains 34''' in a single row within a matrix 36''' of the majority polymer block (e.g., PS), with the PLA 48a'''/PS 48b''' bilayer along the trench surfaces 22''', 24''', 26'''. In some embodiments, the block copolymer material 28''' can be "zone annealed" as previously described. As shown in FIGS. 16A-16B, the PLA cylindrical domains 34''' extend from the air interface 46''' to the wetting layer 34a''' composed of the PLA/PS bilayer 48a'''/48b''' overlying the surface of the substrate 10''' at the trench floor 26'''. The PS layer 48b''', which is covalently bonded to the PLA layer 48a''', is in contact with the PS block (matrix 26'''), which in turn is covalently bonded to the PLA cylinder domains 34'''.

Polymer segments (e.g., the PS matrix 36''') of the annealed polymer material 30''' may optionally be crosslinked, and any unstructured polymer material 28a''' on surfaces outside the trenches can then be optionally removed, as depicted in FIGS. 16-16B.

Figure 18B:
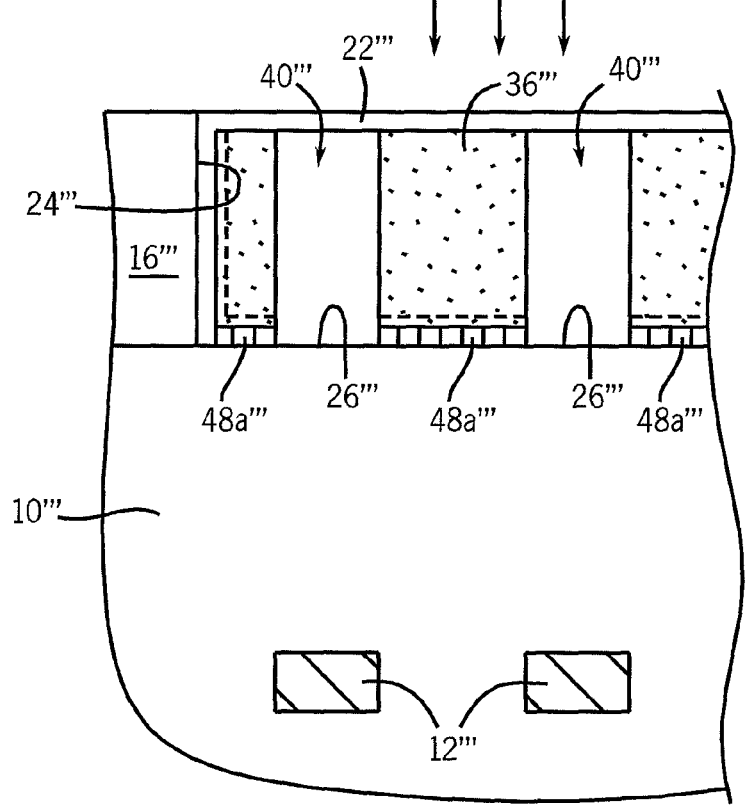

The polymer material 30''' can then be further processed as desired, for example, to form a mask to etch openings 42' in the substrate 10'''. For example, as illustrated in FIGS. 17-17B, the PLA cylinders 34''' can be selectively removed, for example, using UV exposure and an acetic acid wash, or an aqueous methanol mixture containing sodium hydroxide to form cylindrical-shaped openings 40''' extending through the PS matrix. Due to the PLA/PS bilayer 48a''', 48b''' that overlies the trench floor, the openings 40''' do not extend all the way to the surface of the substrate 10''' at the trench floor 26'''. As depicted in FIGS. 18-18B, an RIE etching process (arrows ↓), for example, can be conducted to remove the bilayer material and expose the trench floors 26''' and the substrate 10''' within the openings 40'''. The RIE etch may thin the matrix (mask) 36''', as shown, although not to a significant extent.

Figure 14B:
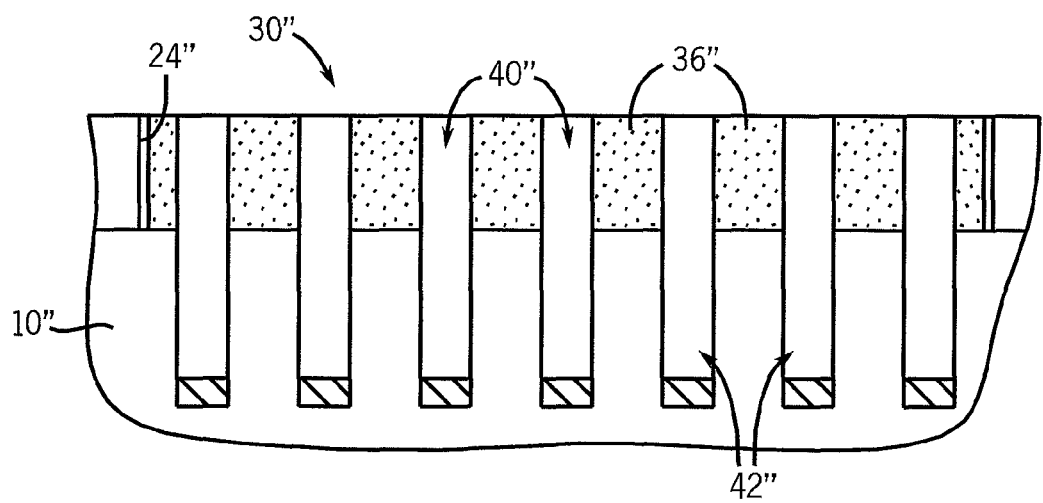

Referring now to FIGS. 14-14B, the matrix 30" can then be used as a mask to etch cylindrical-shaped openings 42" in the substrate down to an active area such as a conductive line 12" or to semi-conducting regions, etc. The remnants of the etch mask 36" can be subsequently removed and the openings 42" can be filled as desired, as described with respect to FIGS. 15-15B.

In another embodiment, the trenches are constructed with a width ($w_t$) of about 1.75-2.5*L of the block copolymer such that, upon annealing, a block copolymer material or blend of about L will self-assemble into two rows of perpendicular cylinders with each cylinder being offset to form a zigzag pattern, and the center-to-center pitch distance between adjacent cylinders at or about one-half L ($\simeq 0.5$*L). For example, referring to FIGS. 19-19B, in the use of a cylinder-forming block copolymer material or blend with an L (pitch) value of about 40 nm, a trench 18 can be constructed with a width ($w_t$) about 70-100 nm wide (or according to 1+((square root of 3)/2)*L). The length ($l_t$) of the trench can be at or about [1+0.5(n−1)]*L, where n equals the number of cylinders in the trench. The depth ($D_t$) of the trench 18″″ can be greater than L ($D_t$>L) for embodiments employing a thermal anneal of the block copolymer (e.g., FIGS. 2-8) or at or about L ($D_t \simeq L$) for embodiments utilizing a solvent anneal process (e.g., FIGS. 11-14).

Optionally, the ends 24″″ can be angled or beveled as depicted by the dashed line 50 in FIG. 20. The dimensions of the trench 18″″ can be, for example, about 70-100 nm wide ($w_t$), about 100-25,000 nm long ($l_t$), and about 40-200 nm deep ($D_t$).

Any of the above-described cylindrical-phase block copolymers (e.g., PS-b-PMMA, PS-b-PEO, PS-b-PLA, etc.) can be deposited within the trench 18″″, and thermal or solvent annealed as previously described.

Figure 20B:
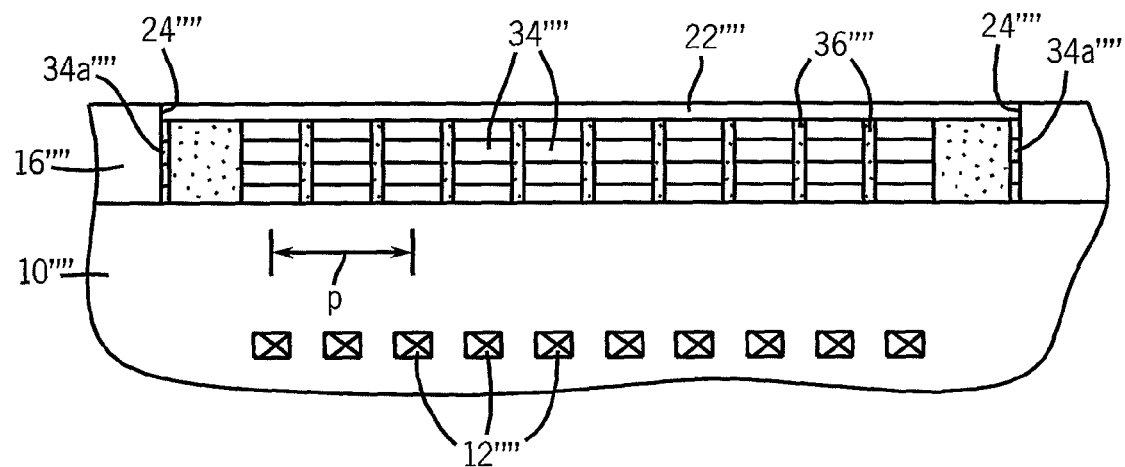
Figure 21B:
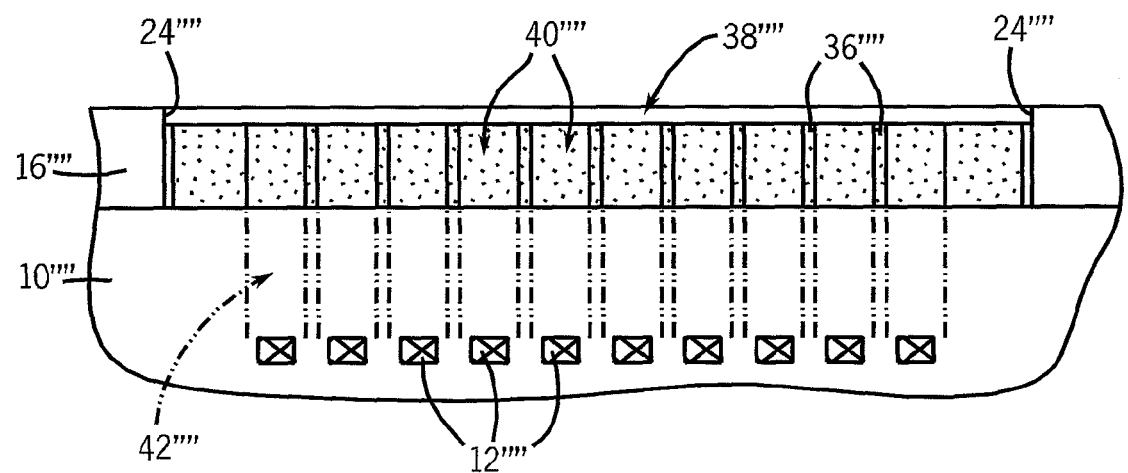

The trench 18″″ is fabricated with the appropriate neutral or preferential wetting surface on the sidewalls 22″″, ends 24″″, and trench floor 26″″, to drive the block copolymer to self-assemble into perpendicular-oriented cylinders 34″″ upon annealing, as depicted in FIGS. 20-20B. The resulting cylinders 34″″ are formed in a staggered two-row arrangement parallel to the sidewalls 22″″ in which the center-to-center pitch distance (p) of adjacent cylinders 34″″ within a row is at or about 0.5*L. FIG. 20B illustrates a schematic cross-sectional, elevational view of both rows of cylinders in relation to the underlying lines 12″″. The self-assembled polymer film can then be processed to form a mask (FIGS. 21-21B) by removing the cylinder domains 34″″ (e.g., PMMA) leaving a polymer matrix 36″″ (e.g., PS) with cylindrical openings 40″″ to the underlying substrate 10″″, which can then be etched to form openings 42″″ (shown in phantom) to "buried" active areas (e.g., lines 12″″) and the openings 42″″ can then be filled (FIGS. 22-22B) with a desired material 44″″, e.g., metal, to form, for example, a contact to underlying lines 12″″. In some embodiments, the feature size of the conductive lines 12″″ is less than the diameter of the cylinders 34″″ (e.g., by about 50%) such that a variance in the diameter of the cylinders 34″″ and the subsequently formed cylindrical openings 42″″ avoids electrical shorts that can occur from overlapping diameters of adjacent cylinders.

With the present embodiment of two rows of cylinders in an offset arrangement, contact openings 42″″ can be etched into a substrate to a denser array of buried lines 12″″ than with an embodiment utilizing a single row of cylinders (e.g., FIG. 6) for a given block copolymer pitch L. With the contacts 44″″ being offset, each contact 44″″ can be connected to a single conductive line 12″″ to address the lines individually.

Methods of the disclosure provide a means of generating self-assembled diblock copolymer films composed of perpendicular-oriented cylinders in a polymer matrix. The methods provide ordered and registered elements on a nanometer scale that can be prepared more inexpensively than by electron beam lithography, EUV photolithography or conventional photolithography. The feature sizes produced and accessible by this invention cannot be easily prepared by conventional photolithography. The described methods and systems can be readily employed and incorporated into existing semiconductor manufacturing process flows and provide a low cost, high-throughput technique for fabricating small structures.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations that operate according to the principles of the invention as described. Therefore, it is intended that this invention be limited only by the claims and the equivalents thereof. The disclosures of patents, references and publications cited in the application are incorporated by reference herein.

What is claimed is:

1. A method of forming a nanostructured polymer material on a substrate, comprising:
    forming a self-assembling block copolymer material within a single trench or a plurality of trenches having ends not aligned, said trench(es) in a material layer on the substrate, the trench(es) having a neutral wetting floor, and opposing sidewalls and ends that are preferentially wetting to a minority block of the block copolymer; and
    annealing the block copolymer material such that said block copolymer material self-assembles into cylindrical domains of the first block of the block copolymer within a matrix of a second block of the block copolymer, said self-assembled block copolymer material having a thickness, and the cylindrical polymer domains oriented perpendicular to the trench floor and extending through said thickness of the self-assembled block copolymer material in a one-dimensional (1-D) array of a single row for the length of the trench(es).

2. The method of claim 1, wherein the block copolymer comprises polystyrene and polymethyl methacrylate.

3. The method of claim 1, wherein the block copolymer comprises a blend of the block copolymer with a homopolymer of the first polymer block, the second polymer block, or both.

4. The method of claim 1, wherein the trench(es) have a width of about L to about 1.5× the L value of the block copolymer, a length of about nL, and a depth of greater than about L.

5. The method of claim 1, wherein the neutral wetting floor comprises a random copolymer material.

6. The method of claim 1, wherein the neutral wetting floor comprises hydrogen-terminated silicon.

7. The method of claim 1, wherein the neutral wetting floor comprises 3-(p-methoxyphenyl)propyltrichlorosilane grafted to oxide.

8. The method of claim 1, further comprising, prior to forming the block copolymer material within the trench(es),
    forming the material layer on the substrate;
    forming the trench(es) within the material layer; and
    forming the neutral wetting material on the floor of the trench(es).

9. The method of claim 1, further comprising, prior to forming the block copolymer material within the trench(es),
    forming the neutral wetting material on a surface of the substrate;
    forming the material layer over the neutral wetting material; and
    forming the trench(es) within the material layer to expose the neutral wetting material at the trench floor.

10. The method of claim 1, wherein the sidewalls and ends of the trench(es) comprise a material selected from the group consisting of oxide, silicon nitride, silicon oxycarbide, silicon oxynitride, indium tin oxide (ITO), a methacrylate resist, and a polydimethyl glutarimide resist.

11. The method of claim 1, wherein annealing the block copolymer material comprises thermal annealing.

12. The method of claim 1, wherein annealing the block copolymer material comprises solvent annealing.

13. The method of claim 1, further comprising, after annealing, selectively crosslinking domains of the second polymer block.

14. The method of claim 1, further comprising selectively removing the first polymer block to form cylindrical openings extending through the matrix of the second polymer block.

15. The method of claim 13, further comprising etching unmasked portions of the substrate through the openings.

16. A method of forming a polymer layer on a substrate, comprising:
depositing a cylindrical-phase block copolymer material in a trench in a material layer on the substrate to a thickness of about the L value of the block copolymer or greater in the trench, the trench having sidewalls, ends and a floor that are preferential wetting to a first block of the block copolymer; and
solvent annealing the block copolymer material such that said block copolymer material self-assembles into cylindrical domains of the first block of the block copolymer within a matrix of a second block of the block copolymer, said self-assembled block copolymer material having a thickness, and the cylindrical polymer domains oriented perpendicular to the trench floor and extending through said thickness of the self-assembled block copolymer material in a one-dimensional (1-D) array of a single row for the length of the trench.

17. The method of claim 16, wherein solvent annealing the block copolymer material comprises thermal annealing with a partial pressure of saturated solvent vapor.

18. The method of claim 16, wherein the block copolymer comprises polystyrene and polyethylene oxide.

19. The method of claim 18, wherein the block copolymer comprises a cleavable PS-b-PEO.

20. The method of claim 16, wherein the trench has a width of about 1-1.5 times the L value of the block copolymer.

21. A method of forming a polymer layer on a substrate, comprising:
depositing a cylindrical-phase block copolymer material in a trench in a material layer on the substrate to a thickness of about the L value of the block copolymer in the trench, the trench having sidewalls, ends and a floor that are preferential wetting to a first block of the block copolymer; and
thermal annealing the block copolymer material such that said block copolymer material self-assembles into cylindrical domains of the first block of the block copolymer within a matrix of a second block of the block copolymer, said self-assembled block copolymer material having a thickness, and the cylindrical polymer domains oriented perpendicular to the trench floor and extending through said thickness of the self-assembled block copolymer.

22. The method of claim 21, wherein the block copolymer comprises polystyrene and polylactide.

23. The method of claim 21, wherein the trench has a width of about 1-1.5* the L value of the block copolymer.

24. The method of claim 21, wherein the sidewalls, ends and floor of the trench comprises a silicon oxide.

25. The method of claim 22, wherein the block copolymer forms a wetting layer on the sidewalls, ends and floor of the trench, said wetting layer comprising a bilayer of polylactide and polystyrene;
the method further comprising, after annealing:
selectively removing the first polymer block to form cylindrical openings extending through the matrix of the second polymer block; and
etching to remove the bilayer on the floor of the trench within said openings to expose the substrate.

26. The method of claim 25, further comprising etching exposed portions of the substrate through the openings.

27. A method of etching a substrate, comprising:
annealing a block copolymer material situated in a single trench or a plurality of trenches having ends not aligned, said trench(es) in a material layer overlying the substrate, the trench having opposing sidewalls and ends that are preferentially wetting to a minority block of the block copolymer, a floor, a width and a length, wherein the block copolymer material forms a one-dimensional (1-D) array of a single row of perpendicular-oriented cylinders of the minority polymer block in a matrix of a majority polymer block, said annealed block copolymer material having a thickness, and the cylinders extending through said thickness of the annealed block copolymer;
selectively removing one of the polymer blocks to form openings exposing the substrate; and
etching exposed portions of the substrate to form openings therein.

28. The method of claim 27, further comprising, prior to removing one of the polymer blocks, selectively crosslinking another of the polymer blocks.

29. The method of claim 27, wherein the trench floor is neutral wetting.

30. The method of claim 27, wherein the trench floor is preferential wetting.

31. The method of claim 30, wherein the block copolymer material is selected from the group consisting of a block copolymer comprising polystyrene and polyethylene oxide, and a block copolymer comprising polystyrene and polylactide.

32. The method of claim 27, wherein said etching forms a pattern of registered, addressable, sub-lithographic openings in the substrate.

33. The method of claim 27, further comprising filling the openings in the substrate with a fill material.

34. The method of claim 33, wherein the fill material comprises a metal, a metal alloy, and a metal/insulator/metal stack.

35. A method of etching a substrate, comprising:
forming a block copolymer material within a single trench or a plurality of trenches having ends not aligned, said trench(es) in a material layer overlying the substrate, the trench or trenches having opposing sidewalls and ends that are preferentially wetting to a minority polymer block of the block copolymer, a floor, a width and a length;
causing a microphase separation in the block copolymer material to form cylindrical domains composed of a first polymer block in a matrix of a second polymer block within the trench(es), the cylindrical polymer domains oriented perpendicular to the trench floor and registered to the sidewalls in a one-dimensional (1-D) array of a single row extending the length of the trench(es);
optionally, selectively crosslinking the polymer matrix;
selectively removing the cylindrical polymer domains to form openings through the polymer matrix; and etching the substrate through the openings in the polymer matrix.

36. A method of forming a nanostructured polymer material on a substrate, comprising:
   forming a self-assembling block copolymer material within a trench in a material layer on the substrate, the trench having a neutral wetting floor, opposing sidewalls and ends that are preferentially wetting to a minority block of the block copolymer; and
   annealing the block copolymer material such that said block copolymer material self-assembles into cylindrical domains of the first block of the block copolymer within a matrix of a second block of the block copolymer, said self-assembled block copolymer material having a thickness, and the cylindrical polymer domains oriented perpendicular to the trench floor and extending through said thickness of the self-assembled block copolymer material;
   wherein the cylindrical polymer domains are in two rows for the length of the trench, with adjacent cylindrical domains offset from each other in a zig-zag arrangement at a center-to-center distance of about one-half the L value of the block copolymer in a direction parallel to the trench sidewalls.

37. A polymeric material situated within a single trench or a plurality of trenches having ends not aligned, said trench(es) in a material layer overlying a substrate, the trench(es) having sidewalls, ends, a floor, a width and a length, the polymeric material comprising a self-assembled block copolymer material comprising cylindrical polymer domains of a minority polymer block in a matrix of a majority polymer block, the cylindrical polymer domains oriented perpendicular to the trench floor and in a one-dimensional (1-D) array of a single row extending the length of the trench(es).

38. The polymeric material of claim 37, wherein the trench(es) have a neutral wetting floor, and sidewalls and ends comprising a material that is preferentially wetting to the minority polymer block.

39. The polymeric material of claim 37, wherein the trench(es) have a floor, sidewalls and ends comprising a material that is preferentially wetting to the minority polymer block.

40. A polymeric material situated within a trench in a material layer overlying a substrate, the trench having sidewalls, ends, a floor, a width and a length, the polymeric material comprising a self-assembled block copolymer material comprising cylindrical polymer domains of a minority polymer block in a matrix of a majority polymer block;
   wherein the cylindrical polymer domains are oriented perpendicular to the trench floor and in two rows for the length of the trench, with adjacent cylindrical domains offset from each other in a zig-zag arrangement at a center-to-center distance of about one-half the L value of the block copolymer in a direction parallel to the trench sidewalls.

41. The method of claim 1, wherein the trench(es) have a width of about 1.5× the L value of the block copolymer.

42. A method of forming a polymer material on a substrate, comprising:
   depositing a self-assembling block copolymer material in a plurality of trenches in a material layer on the substrate, the trenches having a width, a length, and a floor and opposing sidewalls and ends that are preferentially wetting to a minority block of the block copolymer; and
   annealing the block copolymer material such that said block copolymer material self-assembles into cylindrical domains of the first block of the block copolymer within a matrix of a second block of the block copolymer, said self-assembled block copolymer material having a thickness, and the cylindrical polymer domains oriented perpendicular to the trench floor and extending through said thickness of the self-assembled block copolymer material in a one-dimensional (1-D) array of a single row for the length of the trenches.

43. The method of claim 42, wherein the block copolymer comprises polylactide or polyethylene oxide as the minority block.

44. A method of forming a polymer material on a substrate, comprising:
   depositing a self-assembling block copolymer material in a plurality of trenches in a material layer on the substrate, the trenches having a floor, a width, a length, and opposing sidewalls and ends that are preferentially wetting to a minority block of the block copolymer, the ends of the trenches not aligned with each other; and
   annealing the block copolymer material such that said block copolymer material self-assembles into cylindrical domains of the first block of the block copolymer within a matrix of a second block of the block copolymer, said self-assembled block copolymer material having a thickness, and the cylindrical polymer domains oriented perpendicular to the trench floor and extending through said thickness of the self-assembled block copolymer material in a one-dimensional (1-D) array of a single row for the length of the trenches.

45. The method of claim 44, wherein the trench floor is preferentially wetting to the minority block of the block copolymer.

46. A polymeric material situated within a plurality of trenches in a material layer overlying a substrate, the trench having sidewalls, ends, a floor, a width and a length, the ends of the trenches not aligned with each other, the polymeric material comprising a self-assembled block copolymer material comprising cylindrical polymer domains of a minority polymer block in a matrix of a majority polymer block, the cylindrical polymer domains oriented perpendicular to the trench floor and in a one-dimensional (1-D) array of a single row extending the length of the trenches.

47. A method of forming a polymer material on a substrate, comprising:
   depositing a self-assembling block copolymer material in a single trench in a material layer on the substrate, the trench having a floor, a width, a length, and opposing sidewalls and ends that are preferentially wetting to a minority block of the block copolymer; and
   annealing the block copolymer material such that said block copolymer material self-assembles into cylindrical domains of the first block of the block copolymer within a matrix of a second block of the block copolymer, said self-assembled block copolymer material having a thickness, and the cylindrical polymer domains oriented perpendicular to the trench floor and extending through said thickness of the self-assembled block copolymer material in a one-dimensional (1-D) array of a single row for the length of the trench.

48. The method of claim 47, wherein the trench floor is preferentially wetting to the minority block of the block copolymer.

* * * * *